(12) United States Patent
Saito et al.

(10) Patent No.: US 6,597,542 B2
(45) Date of Patent: Jul. 22, 2003

(54) DUAL SPIN-VALVE MAGNETORESISTIVE THIN FILM ELEMENT

(75) Inventors: Masamichi Saito, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/346,932

(22) Filed: Jan. 17, 2003

(65) Prior Publication Data

US 2003/0107847 A1 Jun. 12, 2003

Related U.S. Application Data

(62) Division of application No. 09/861,413, filed on May 18, 2001, which is a division of application No. 09/357,915, filed on Jul. 20, 1999, now Pat. No. 6,424,506.

(30) Foreign Application Priority Data

| Jul. 21, 1998 | (JP) | .......................................... 10-204756 |
| Jul. 21, 1998 | (JP) | .......................................... 10-204763 |
| Jul. 21, 1998 | (JP) | .......................................... 10-204767 |

(51) Int. Cl.$^7$ .............................................. G11B 5/39
(52) U.S. Cl. ..................................................... 360/314
(58) Field of Search ...................... 360/324.11, 324.12, 360/324, 314; 324/252, 207.21; 338/32 R, 32 H

(56) References Cited

U.S. PATENT DOCUMENTS

| 5,341,261 | A |   | 8/1994  | Dieny et al. |
| 5,408,377 | A |   | 4/1995  | Gurney et al. |
| 5,465,185 | A |   | 11/1995 | Heim et al. |
| 5,583,725 | A |   | 12/1996 | Coffey et al. |
| 5,598,308 | A |   | 1/1997  | Dieny et al. |
| 5,701,222 | A | * | 12/1997 | Gill et al. .................... 360/314 |
| 5,701,223 | A |   | 12/1997 | Fontana, Jr. et al. |
| 5,748,399 | A |   | 5/1998  | Gill |
| 5,751,521 | A | * | 5/1998  | Gill ............................ 360/314 |
| 5,768,069 | A |   | 6/1998  | Mauri |
| 5,828,529 | A |   | 10/1998 | Gill |
| 5,871,622 | A |   | 2/1999  | Pinarbasi |
| 5,880,913 | A |   | 3/1999  | Gill |
| 6,175,476 | B1 | * | 1/2001 | Huai et al. ............. 360/324.11 |
| 6,219,208 | B1 | * | 4/2001 | Gill ......................... 360/324.1 |
| 6,278,589 | B1 | * | 8/2001 | Gill ............................ 360/314 |
| 6,424,506 | B1 | * | 7/2002 | Saito et al. ............ 360/324.11 |

FOREIGN PATENT DOCUMENTS

JP             10-91921         4/1998

* cited by examiner

*Primary Examiner*—Brian E. Miller
(74) *Attorney, Agent, or Firm*—Brinks Hofer Gilson & Lione

(57) ABSTRACT

A dual spin-valve magnetoresistive thin film elements includes a composite free magnetic layer having first and second free magnetic layers, first and second nonmagnetic electrically conductive layers residing below and above the composite free magnetic layer, respectively, first and second dual pinned magnetic layers each having first and second pinned magnetic layers, and first and second antiferromagnetic layers. In the first dual pinned magnetic layer, the first pinned magnetic layer of contacts the first antiferromagnetic layer and the second pinned magnetic layer contacts the first nonmagnetic electrically conductive layer. In the second dual pinned magnetic layer, the first pinned magnetic layer of contacts the second antiferromagnetic layer and the second pinned magnetic layer contacts the second nonmagnetic electrically conductive layer, and the magnetic moment of the first pinned magnetic layer is smaller than the second pinned magnetic layer. The magnetization of the first and second free magnetic layers face in opposite directions.

14 Claims, 22 Drawing Sheets

DUAL SPIN-VALVE MAGNETORESISTIVE THIN FILM ELEMENT

RELATED APPLICATIONS

This application is a divisional of application Ser. No. 09//861,413 filed May 18, 2001, which is a divisional of application Ser. No. 09/357,915 filed Jul. 20, 1999, now U.S. Pat. No. 6,424,506 issued Jul. 23, 2002.

BACKGROUND

1. Field of the Invention

The present invention relates to a spin-valve magnetoresistive thin film element which changes in electric resistance according to the relationship between the pinned magnetization direction of a pinned magnetic layer and the magnetization direction of a free magnetic layer which is affected by external magnetic fields. More particularly, the present invention relates to a spin-valve magnetoresistive thin film element wherein the pinned magnetic layer is divided into two layers, such that the magnetization (Ferri-state) between the two pinned magnetic layers can be maintained in a thermally stabilized state. The present invention also relates to a thin film magnetic head using this spin-valve magnetoresistive thin film.

The present invention also relates to a spin-valve magnetoresistive thin film element which changes in electric resistance according to the relationship between the pinned magnetization direction of a pinned magnetic layer and the magnetization direction of a free magnetic layer which is affected by external magnetic fields, and particularly relates to a spin-valve magnetoresistive thin film element wherein the magnetization of the pinned magnetic layer can be maintained in a more stabilized state by causing a sensing current to flow in an appropriate direction, and also relates to a thin film magnetic head using this spin-valve magnetoresistive thin film element.

The present invention also relates to a spin-valve magnetoresistive thin film element which changes in electric resistance according to the relationship between the pinned magnetization direction of a pinned magnetic layer and the magnetization direction of a free magnetic layer which is affected by external magnetic fields, and particularly relates to a method for manufacturing a spin-valve magnetoresistive thin film element wherein magnetization control of the pinned magnetic layer can be performed in an appropriate manner by appropriately adjusting the magnetic moment of the pinned magnetic layer, and the direction and size of the magnetic field to be applied during thermal treatment, and also relates to a method for manufacturing a thin film magnetic head using this spin-valve magnetoresistive thin film element.

2. Description of the Related Art

A spin-valve magnetoresistive thin film element is a type of GMR (giant magnetoresistive) element which makes use of the giant magneto resistance effect, and is used for detecting recorded magnetic fields from recording mediums such as hard disks and the like.

The spin-valve magnetoresistive thin film element has several advantages, such as having a relatively simple structure for a GMR element. Further, the spin-valve magnetoresistive thin film element can change resistance under weak magnetic fields.

In its simplest form, the spin-valve magnetoresistive thin film element is comprised of an antiferromagnetic layer, a pinned magnetic layer, nonmagnetic electrically conductive layer, and a free magnetic layer. FIG. 28 is a cross-sectional view of a known spin-valve magnetoresistive thin film element, viewed from the side opposing a recording medium.

Also, FIG. 29 is a sideways cross-sectional diagram schematically illustrating the spin-valve magnetoresistive thin film element shown in FIG. 28.

Reference numeral 1 denotes a base layer formed of Ta (tantalum) for example, and formed on this base layer 1 is formed an antiferromagnetic layer 2, and further a pinned magnetic layer 3 is formed on the antiferromagnetic layer 2.

The pinned magnetic layer 3 is formed in contact with the antiferromagnetic layer 2, thereby generating an exchange coupling magnetic field (exchange anisotropic magnetic field) at the interface between the pinned magnetic layer 3 and the antiferromagnetic layer 2, and the magnetization of the pinned magnetic layer is pinned in the Y direction in the Figure, for example.

Formed upon the pinned magnetic layer 3 is a nonmagnetic electrically conductive layer 4 formed of Cu or the like, and further formed upon the nonmagnetic electrically conductive layer 4 is a free magnetic layer 5. Formed on either side of the free magnetic layer 5 are hard magnetic bias layers 6 formed of a Co—Pt (cobalt-platinum) alloy for example, and the hard magnetic bias layers 6 are magnetized in the direction X in the Figure, so the magnetization of the free magnetic layer 5 is aligned in the direction X in the Figure. Accordingly, the fluctuation magnetization of the free magnetic layer 5 and the pinned magnetization of the pinned magnetic layer 3 are in an intersecting relationship. Incidentally, reference numeral 7 denotes a protective layer formed of Ta or the like, and reference numeral 8 denotes a lead layer formed of Cu or the like.

With this spin-valve magnetoresistive thin film element, a sensing current flows from the lead layer 8 either in the direction of X shown in the Figure or in the direction opposite to X shown in the Figure, with mainly the nonmagnetic electrically conductive layer 4 as the center. Then, when the magnetization of the free magnetic layer 5 aligned in the direction X in the Figure fluctuates due to magnetic field leaking from the recording medium (such as a hard disk), electric resistance changes according to the relationship between the magnetization of the free magnetic layer 5 and the magnetization of the pinned magnetic layer 3 pinned in the direction Y in the Figure, and a magnetic field leaking from the recording medium is detected by voltage change based on the change in the electric resistance values.

Also, with known arrangements, FeMn alloys, NiO, NiMn alloys, etc., are used for the antiferromagnetic layer 2. Of these examples, using FeMn alloys or NiO as the antiferromagnetic material does not necessitate thermal treatment in order to generate an exchange coupling magnetic field at the interface between the antiferromagnetic layer 2 and the pinned magnetic layer 3, but using NiMn as the antiferromagnetic material does necessitate thermal treatment.

Now, with known arrangements, NiMn alloys, FeMn alloys, NiO, etc., are used as antiferromagnetic materials for the antiferromagnetic layer 2.

However, of these, the blocking temperature of FeMn alloys and NiO alloys in particular is 200° C. or lower, meaning that these materials are lacking in stability. Particularly, in recent years, the number of revolutions of the recording medium and the amount of sensing current flowing from the lead layer 8 have been increasing, and the environmental temperature within the device reaches high temperatures of 200° C. for example, or higher. Accordingly, using an antiferromagnetic material with low blocking temperature as the antiferromagnetic layer 2 of the spin-valve magnetoresistive thin film element reduces the exchange coupling magnetic field (exchange anisotropic magnetic field) generated at the interface between the antiferromagnetic layer 2 and the pinned magnetic layer 3. The result is that the magnetization of the pinned magnetic layer 3 cannot be appropriately pinned in the direction Y in the Figure, consequently allowing ΔMR (rate of change of resistance) to drop.

The blocking temperature is determined solely by the antiferromagnetic material comprising the antiferromagnetic layer 2. Thus, even if the structure of the spin-valve magnetoresistive thin film element is improved, the blocking temperature itself cannot be raised.

For example, U.S. Pat. No. 5,701,223 discloses an invention wherein the structure of the pinned magnetic layer is improved and the exchange coupling magnetic field can be improved. However, this invention uses NiO as the antiferromagnetic layer, so the blocking temperature is around 200° C. Thus, even though the exchange coupling magnetic field may be increased at room temperature, the exchange coupling magnetic field of the spin-valve magnetoresistive thin film element becomes smaller while the recording medium is running as the environmental temperature within the device reaches the vicinity of 200° C. or higher. The exchange coupling magnetic field may becomes 0, so no ΔMR can be obtained at all.

On the other hand, NiMn alloys have higher blocking temperatures than NiO or FeMn alloys, but the properties of these alloys such as corrosion-resistance and the like are poor, so an antiferromagnetic material with even higher blocking temperatures and excellent properties thereof such as corrosion-resistance is being demanded.

Also, as described above, the sensing current flows from the lead layer 8 with mainly the nonmagnetic electrically conductive layer 4 having low ratio resistance as the center, so a sensing current magnetic field is formed by the corkscrew rule because of the sensing that is caused to flow. This sensing current magnetic field affecting the pinned magnetization of the pinned magnetic layer 3.

For example, as shown in FIG. 29, the magnetization of the pinned magnetic layer 3 is directed in the direction of Y in the Figure. But if the sensing current magnetic field generated by causing sensing current to flow is directed in the direction opposite to Y in the Figure at the portion of the pinned magnetic layer 3, the direction of the pinned magnetization of the pinned magnetic layer 3 and the direction of the sensing current magnetic field do not match, so the pinned magnetization is affected by the sensing current magnetic field and wavers. This is a problem in that the state of magnetization becomes unstable.

Particularly, if an antiferromagnetic material such as an NiO or FeMn alloy which produces only a small exchange coupling magnetic field (exchange anisotropic magnetic field) generated at the interface between the pinned magnetic layer 3 and the antiferromagnetic layer 2, and which has low blocking temperature, is used for the antiferromagnetic layer 2, the deterioration of the pinned magnetism at the pinned magnetic layer 3 is marked if the pinned magnetization direction of the pinned magnetic layer 3 and sensing current magnetic field direction are facing opposite directions, and destruction may occur such as the inversion of pinned magnetism.

In recent years, there is a trend to use a large sensing current in order to deal with higher densities. However, it is known that causing a sensing current of 1 mA to flow generates a sensing current magnetic field of approximately 30 (Oe), and further that the element temperature rises by about 150° C. Thus, if several tens of mA of the sensing current is caused to flow, this will result in a sudden rise in the temperature of the element, and generate a massive sensing current magnetic field.

Accordingly, in order to improve the thermal stability of the pinned magnetization of the pinned magnetic layer 3, an antiferromagnetic material with a high blocking temperature and which produces a large exchange coupling magnetic field (exchange anisotropic magnetic field) at the interface between the pinned magnetic layer 3 and the antiferromagnetic layer 2 needs to be selected, and the sensing current needs to be directed in an appropriate direction so the magnetization of the pinned magnetic layer 3 is not destroyed by the sensing current magnetic field.

U.S. Pat. No. 5,701,223 discloses an invention wherein the pinned magnetic layer is divided into two layers and the magnetization of the two pinned magnetic layers is in an antiparallel state, whereby a large exchange coupling magnetic field can be obtained.

However, the antiferromagnetic layer disclosed here is NiO, and NiO has a low blocking temperature of around 200° C., and only a small exchange coupling magnetic field (exchange anisotropic magnetic field) is generated at the interface between the pinned magnetic layer and the antiferromagnetic layer.

Particularly, in recent years, there is a trend to increase the rotating speed of the recording medium and increase the sensing current in order to deal with higher densities, which causes the environmental temperature within the device to rise. Thus, if NiO is used for the antiferromagnetic layer, the exchange coupling magnetic field is smaller, meaning that it is difficult to appropriately carry out magnetization control of the pinned magnetic layer.

On the other hand, NiMn alloys have a higher blocking temperature than the NiO, and the exchange coupling magnetic field (exchange anisotropic magnetic field) is also greater. Also, X—Mn alloys (wherein X is Pt, Pd, Ir, Rh, Ru) using elements of the platinum group have come into focus as an antiferromagnetic material which has blocking temperature around that of NiMn alloys, a large exchange coupling magnetic field, and corrosion-resistance far better than NiMn alloys.

Employing such X—Mn alloys using elements of the platinum group as the antiferromagnetic layer, and further dividing the pinned magnetic layer into two layers should facilitate the obtaining a greater exchange coupling magnetic field as compared to using NiO for the antiferromagnetic layer.

Presently, such X—Mn alloys using elements of the platinum group need to be annealed in a magnetic field (thermal treatment) following formation of the film, in order to generate an exchange coupling magnetic field at the interface between the pinned magnetic layer and the antiferromagnetic layer, as is true with the case of NiMn alloys, as well.

However, unless the size and direction of the magnetic field applied during the thermal treatment, and the magnetic moment (saturation magnetization Ms·film thickness t) of the two divided pinned magnetic layers are appropriately adjusted, the magnetization of the two divided pinned magnetic layers cannot be pinned in a stable antiparallel state. Also particularly, with so-called dual spin-valve magnetoresistive thin film elements (wherein the pinned magnetic layers are formed above and below the free magnetic layer with the free magnetic layer as the center thereof), the magnetization direction of the two pinned magnetic layers formed above and below the free magnetic layer must be appropriately controlled, or ΔMR (the rate of resistance change) drops, causing problems such that only a small reproduction output can be obtained.

BRIEF SUMMARY

The present invention has been made in order to solve the above-described problems with the known art, and accordingly, it is an object of a first aspect of the present invention to provide a spin-valve magnetoresistive thin film element and a thin film magnetic head using this spin-valve magnetoresistive thin film element that is thermally stable and capable of increasing the exchange coupling magnetic field, by means of improving the structure of the pinned magnetic layer and the material comprising the antiferromagnetic layer in particular, and further appropriately adjusting the film thickness of the pinned magnetic layer.

Similarly, it is an object of a second aspect of the present invention to provide a spin-valve magnetoresistive thin film element and a thin film magnetic head using this spin-valve magnetoresistive thin film element that is capable of maintaining the magnetization state of the pinned magnetic layer in a thermally stable manner, by improving the structure of the pinned magnetic layer and the material comprising the antiferromagnetic layer in particular, and further controlling the direction in which the sensing current is caused to flow in an appropriate direction.

Also, it is an object of a third aspect of the present invention to provide a method for manufacturing a spin-valve magnetoresistive thin film element and a thin film magnetic head using this spin-valve magnetoresistive thin film element that is capable of maintaining the magnetization of two pinned magnetic layers in a stable antiparallel state, by appropriately controlling the magnetism moment of a pinned magnetic layer which has been divided into two layers, and the direction and size of a magnetic field applied during thermal treatment, and further capable of obtaining high ΔMR around that of known arrangements.

To this end, a first aspect of the present invention provides a spin-valve magnetoresistive thin film element, comprising: an antiferromagnetic layer; a pinned magnetic layer formed in a manner contacting the antiferromagnetic layer, wherein the magnetizing direction is pinned by the exchange coupling magnetic field between the pinned magnetic layer and the antiferromagnetic layer; and a nonmagnetic electrically conductive layer formed between a free magnetic layer and the pinned magnetic layer. The magnetizing direction of the free magnetic layer is aligned so as to intersect with the magnetizing direction of the pinned magnetic layer. The pinned magnetic layer is divided into two layers with a nonmagnetic intermediate layer introduced therebetween. Here, with the pinned magnetic layer which comes in contact with the antiferromagnetic layer as a first pinned magnetic layer and with the pinned magnetic layer which comes in contact with the nonmagnetic electrically conductive layer as a second pinned magnetic layer, (the film thickness of the first pinned magnetic layer)/(the film thickness of the second pinned magnetic layer) is in a range of 0.33 to 0.95 or 1.05 to 4.

According to the present invention, (the film thickness of the first pinned magnetic layer)/(the film thickness of the second pinned magnetic layer) is preferably in a range of 0.53 to 0.95 or 1.05 to 1.8.

Also, according to the present invention, it is preferable that the film thickness of the first pinned magnetic layer and the film thickness of the second pinned magnetic layer are both in a range of 10 to 70 ångström, and that |the film thickness of the first pinned magnetic layer minus the film thickness of the second pinned magnetic layer|≧2 ångström.

Further, with the present invention, it is even more preferable that the film thickness of the first pinned magnetic layer and the film thickness of the second pinned magnetic layer are both in a range of 10 to 50 ångström, and that |the film thickness of the first pinned magnetic layer minus the film thickness of the second pinned magnetic layer|≧2 ångström.

Also, with the present invention, the free magnetic layer may be divided into two layers with a nonmagnetic intermediate layer introduced therebetween.

According to the present invention, the spin-valve magnetoresistive thin film element may comprise a single spin-valve magnetoresistive thin film element consisting of one layer each of the antiferromagnetic layer, first pinned magnetic layer, nonmagnetic intermediate layer, second pinned magnetic layer, nonmagnetic electrically conductive layer, and free magnetic layer.

If the free magnetic layer is divided into two layers, the free magnetic layer formed to the side coming into contact with the nonmagnetic electrically conductive layer serves as a first free magnetic layer and the other free magnetic layer as a second free magnetic layer.

If the spin-valve magnetoresistive thin film element is a dual spin-valve magnetoresistive thin film element comprising: nonmagnetic electrically conductive layers formed above and below with the free magnetic layer as the center; the three layers of the second pinned magnetic layer/ nonmagnetic intermediate layer/first pinned magnetic layer formed above one of the nonmagnetic electrically conductive layer and below the other nonmagnetic electrically conductive layer; and antiferromagnetic layers formed above one of the first pinned magnetic layers and below the other first pinned magnetic layer; wherein, of the free magnetic layer divided into two layers, one free magnetic layer serves as a first free magnetic layer and the other free magnetic layer as a second free magnetic layer.

In this aspect of the invention, the value of the film thickness of the first free magnetic layer/the film thickness of the second free magnetic layer is preferably in a range of 0.56 to 0.83 or 1.25 to 5, and more preferably in a range of 0.61 to 0.83 or 1.25 to 2.1.

Also, the present invention provides a spin-valve magnetoresistive thin film element, comprising: an antiferromagnetic layer; a pinned magnetic layer formed in a manner contacting the antiferromagnetic layer. The magnetizing direction is pinned by the exchange coupling magnetic field between the pinned magnetic layer and the antiferromagnetic layer by means of thermal treatment in a magnetic field. A nonmagnetic electrically conductive layer is formed between a free magnetic layer and the pinned magnetic layer. The magnetizing direction of the free magnetic layer is aligned so as to intersect with the magnetizing direction of the pinned magnetic layer. The pinned magnetic layer is divided into two layers with a nonmagnetic intermediate layer introduced therebetween. Here, with the pinned magnetic layer which comes in contact with the antiferromagnetic layer as a first pinned magnetic layer and with the pinned magnetic layer which comes in contact with the nonmagnetic electrically conductive layer as a second pinned magnetic layer, and with the product of saturation magnetization Ms and film thickness t as the magnetic film thickness (magnetic moment), (the magnetic film thickness of the first pinned magnetic layer)/(the magnetic film thickness of the second pinned magnetic layer) is in a range of 0.33 to 0.95 or 1.05 to 4.

With the present invention, it is preferable that (the magnetic film thickness of the first pinned magnetic layer)/(the magnetic film thickness of the second pinned magnetic layer) be in a range of 0.53 to 0.95 or 1.05 to 1.8.

Also, with the present invention, it is preferable that the magnetic film thickness of the first pinned magnetic layer and the magnetic film thickness of the second pinned magnetic layer are both in a range of 10 to 70 (ångström tesla), and that |the magnetic film thickness of the first pinned magnetic layer minus the magnetic film thickness of the second pinned magnetic layer|≧2 (ångström tesla).

Further, with the present invention, it is even more preferable that the film thickness of the first pinned magnetic layer and the film thickness of the second pinned magnetic layer are both in a range of 10 to 50 (ångström tesla), and that |the magnetic film thickness of the first pinned magnetic layer minus the magnetic film thickness of the second pinned magnetic layer|≧2 (ångström tesla).

Also, with the present invention, the free magnetic layer may be divided into two layers with a nonmagnetic intermediate layer introduced therebetween.

According to the present invention, the spin-valve magnetoresistive thin film element may comprise a single spin-valve magnetoresistive thin film element consisting of one layer each of the antiferromagnetic layer, first pinned magnetic layer, nonmagnetic intermediate layer, second pinned magnetic layer, nonmagnetic electrically conductive layer, and free magnetic layer.

If the free magnetic layer divided into two layers, the free magnetic layer formed to the side coming into contact with the nonmagnetic electrically conductive layer serves as a first free magnetic layer and the other free magnetic layer as a second free magnetic layer.

If the spin-valve magnetoresistive thin film element is a dual spin-valve magnetoresistive thin film element comprising: nonmagnetic electrically conductive layers formed above and below with the free magnetic layer as the center; the three layers of the second pinned magnetic layer/nonmagnetic intermediate layer/first pinned magnetic layer formed above one of the nonmagnetic electrically conductive layer and below the other nonmagnetic electrically conductive layer; and antiferromagnetic layers formed above one of the first pinned magnetic layers and below the other first pinned magnetic layer; wherein, of the free magnetic layer divided into two layers, one free magnetic layer serves as a first free magnetic layer and the other free magnetic layer as a second free magnetic layer. In this aspect of the invention, the value of the magnetic film thickness of the first free magnetic layer/the magnetic film thickness of the second free magnetic layer is preferably in a range of 0.56 to 0.83 or 1.25 to 5, and more preferably in a range of 0.61 to 0.83 or 1.25 to 2.1.

Also, with the present invention, it is preferable that the nonmagnetic intermediate layer introduced between the first pinned magnetic layer and second pinned magnetic layer be formed of one of the following, or of an alloy of two or more thereof: Ru, Rh, Ir, Cr, Re, and Cu.

Further, with the present invention, the spin-valve magnetoresistive thin film element may comprise an antiferromagnetic layer below the free magnetic layer, and in this arrangement, it is preferable that the thickness of the nonmagnetic intermediate layer introduced between the first pinned magnetic layer formed so as to come in contact with the antiferromagnetic layer and the second pinned magnetic layer formed so as to come in contact with the nonmagnetic electrically conductive layer be in a range of 3.6 to 9.6 ångström, or more preferably, in a range of 4.0 to 9.4 ångström.

Or, the spin-valve magnetoresistive thin film element may comprise an antiferromagnetic layer above the free magnetic layer, and in this arrangement, it is preferable that the thickness of the nonmagnetic intermediate layer introduced between the first pinned magnetic layer formed so as to come in contact with the antiferromagnetic layer and the second pinned magnetic layer formed so as to come in contact with the nonmagnetic electrically conductive layer be in a range of 2.5 to 6.4 ångström or 6.6 to 10.7 ångström, or more preferably, in a range of 2.8 to 6.2 ångström or 6.8 to 10.3 ångström.

Also, with the present invention, it is preferable that the antiferromagnetic layer be formed of a PtMn alloy.

Also, with the present invention, the antiferromagnetic layer may be formed of an X—Mn alloy (wherein X is one or a plurality of the following elements: Pd, Ir, Rh, Ru, and Os), or formed of a PtMn—X' alloy (wherein X' is one or a plurality of the following elements: Pd, Ir, Rh, Ru, Os, Au, and Ag).

According to the present invention, the spin-valve magnetoresistive thin film element may comprise a single spin-valve magnetoresistive thin film element consisting of one layer each of the antiferromagnetic layer, first pinned magnetic layer, nonmagnetic intermediate layer, second pinned magnetic layer, nonmagnetic electrically conductive layer, and free magnetic layer. With this arrangement, it is preferable that the thickness of the antiferromagnetic layer be in a range of 90 to 200 ångström, and even more preferably in a range of 100 to 200 ångström.

Or, the spin-valve magnetoresistive thin film element may be a dual spin-valve magnetoresistive thin film element comprising: nonmagnetic electrically conductive layers formed above and below with the free magnetic layer as the center; the three layers of the second pinned magnetic layer/nonmagnetic intermediate layer/first pinned magnetic layer formed above one of the nonmagnetic electrically conductive layer and below the other nonmagnetic electrically conductive layer; and antiferromagnetic layers formed above one of the first pinned magnetic layers and below the other first pinned magnetic layer; and with this arrangement, it is preferable that the thickness of the antiferromagnetic layer be in a range of 100 to 200 ångström, and even more preferably in a range of 110 to 200 ångström.

Also, it is preferable that the nonmagnetic intermediate layer introduced between the first free magnetic layer and second free magnetic layer be formed of one of the following, or of an alloy of two or more thereof: Ru, Rh, Ir, Cr, Re, and Cu.

It is preferable that the thickness of the nonmagnetic intermediate layer be 5.5 to 10.0 ångström, and more preferably, 5.9 to 9.4 ångström.

Further, a thin film magnetic head according to the present invention comprises shield layers formed above and below the spin-valve magnetoresistive thin film element, with gap layers introduced therebetween.

With the present invention, the pinned magnetic layer making up the spin-valve magnetoresistive thin film element is divided into two layers, with a nonmagnetic intermediate layer introduced between the pinned magnetic layers divided into two layers.

The magnetization of the divided two pinned magnetic layers are magnetized so as to be in an antiparallel state, and also are in a so-called Ferri-state wherein the magnitude of the magnetic moment (magnetic film thickness) of one pinned magnetic layer differs from that of the magnetic moment of the other pinned magnetic layer. The exchange coupling magnetic field (RKKY interaction) generated between the two pinned magnetic layers is very large, around 1,000 (Oe) to 5,000 (Oe), so the two pinned magnetic layers are in a very stable state of antiparallel magnetization.

Now, one of the pinned magnetic layers magnetized in the antiparallel state (Ferri-state) is formed so as to be in contact with the antiferromagnetic layer, and the magnetization of the pinned magnetic layer which is in contact with the antiferromagnetic layer (hereafter referred to as the "first pinned magnetic layer") is fixed in the direction away from a plane facing a recording medium for example (i.e., the height direction), by the exchange coupling magnetic field (exchange anisotropic magnetic field) generated at the interface between the pinned magnetic layer and the antiferromagnetic layer. Accordingly, the magnetization of the pinned magnetic layer facing the first pinned magnetic layer with a nonmagnetic intermediate layer introduced therebetween (hereafter referred to as the "second pinned magnetic layer") is pinned in a state antiparallel with the magnetization of the first pinned magnetic layer.

With the present invention, the portion that has been conventionally comprised of the two layers of the antiferromagnetic layer and pinned magnetic layer, is formed of the four layers of antiferromagnetic layer/first pinned magnetic layer/nonmagnetic intermediate layer/second pinned magnetic layer. Thus, the magnetization state of the first pinned magnetic layer and second pinned magnetic layer can be maintained at an extremely stable state regarding external magnetic fields, but several conditions are necessary in order to further improve the magnetization stability of the first pinned magnetic layer and second pinned magnetic layer.

The first is to increase the exchange coupling magnetic field (exchange anisotropic magnetic field) generated at the interface between the antiferromagnetic layer and the first pinned magnetic layer. As described above, the magnetization of the first pinned magnetic layer is pinned in a certain direction by the exchange coupling magnetic field (exchange anisotropic magnetic field) generated at the interface with the antiferromagnetic layer, but if this exchange coupling magnetic field is weak, the pinned magnetization of the first pinned magnetic layer does not stabilize, and easily changes due to external magnetic fields and the like. Accordingly, it is preferable that the exchange coupling magnetic field (exchange anisotropic magnetic field) generated at the interface with the antiferromagnetic layer be large. The present invention provides a PtMn alloy as an antiferromagnetic layer whereby a large exchange coupling magnetic field generated at the interface with the first pinned magnetic layer can be obtained. Also, an X—Mn alloy (wherein X is one or a plurality of the following elements: Pd, Ir, Rh, Ru, and Os), or a PtMn—X' alloy (wherein X' is one or a plurality of the following elements: Pd, Ir, Rh, Ru, Os, Au, and Ag) may be used instead of the PtMn alloy.

These antiferromagnetic materials have excellent properties, as they produce a greater exchange coupling magnetic field than NiO, FeMn alloys, NiMn alloys, and the like which are conventionally used for antiferromagnetic materials, have high blocking temperatures, further have excellent corrosion-resistant properties, and so forth.

FIG. 26 shows R-H curves of a spin-valve magnetoresistive thin film element according to the present invention wherein the pinned magnetic layer is divided into two layers with a nonmagnetic intermediate layer introduced therebetween, using a PtMn alloy for the antiferromagnetic layer, and a known spin-valve magnetoresistive thin film element wherein the pinned magnetic layer is formed as a single layer.

The film configuration of the spin-valve magnetoresistive thin film element according to the present invention is: from the bottom; the Si substrate/Alumina: $Al_2O_3$/Ta (30)/antiferromagnetic layer of PtMn (200)/first pinned magnetic layer of Co (25)/nonmagnetic intermediate layer of Ru (7)/second pinned magnetic layer of Co (20)/Cu (20)/Co (10)/NiFe (40)/Ta (30); wherein the numerals in the parentheses represent film thickness in units of ångström; whereas the film configuration of the known spin-valve magnetoresistive thin film element is from the bottom; the Si substrate/Alumina: $Al_2O_3$/Ta (30)/antiferromagnetic layer of PtMn (300)/pinned magnetic layer of Co (25)/Cu (20)/Co (10)/NiFe (40)/Ta (30).

A spin-valve magnetoresistive thin film element according to the present invention and a known spin-valve magnetoresistive thin film element were both formed, and subjected to thermal treatment at 260° C. for four hours while applying a magnetic field of 200 (Oe).

As can be understood from FIG. 26, the ΔMR (resistance change rate) of the spin-valve magnetoresistive thin film element according to the present invention is between 7 to 8% at the greatest, and the ΔMR drops by applying a negative external magnetic field, but the ΔMR in the present invention drops slower than the ΔMR of the known spin-valve magnetoresistive thin film element.

Now, with the present invention, the magnitude of the external magnetic field at the time that the ΔMR is half of the maximum value shall be stipulated as the exchange coupling magnetic field (Hex) generated by the spin-valve magnetoresistive thin film element.

As shown in FIG. 26, the maximum ΔMR of the spin-valve magnetoresistive thin film element according to the present invention is approximately 8%, and the external magnetic field at which the ΔMR drops to half (the exchange coupling magnetic field (Hex)) is approximately 900 (Oe) absolute value.

In comparison, the maximum ΔMR of the known spin-valve magnetoresistive thin film element is approximately 7.5%, which is slightly lower than the known arrangement, the external magnetic field at which the ΔMR drops to half (the exchange coupling magnetic field (Hex)) is approximately 2800 (Oe) absolute value, which is much higher.

Thus, it can be understood that the exchange coupling magnetic field (Hex) can be markedly increased with the spin-valve magnetoresistive thin film element according to the present invention wherein the pinned magnetic layer is divided into two layers, as compared with the known spin-valve magnetoresistive thin film element wherein the pinned magnetic layer is formed of one layer, and the stability of the magnetization of the pinned magnetic layer can be improved in comparison with the known arrangement. Also, the ΔMR of the present invention does not drop very much as compared with the known arrangement, showing that a high ΔMR can be maintained.

Next, FIG. 27 is a graph showing the relation between environmental temperature and the exchange coupling magnetic field, using four types of spin-valve magnetoresistive thin film elements.

The first type of spin-valve magnetoresistive thin film element used is a spin-valve magnetoresistive thin film element according to the present invention wherein PtMn is used for the antiferromagnetic layer, and the pinned magnetic layer is divided into two layers. The film configuration thereof is from the bottom; the Si substrate/Alumina: $Al_2O_3$/Ta (30)/antiferromagnetic layer of PtMn (200) first pinned magnetic layer of Co (25)/nonmagnetic intermediate layer of Ru (7) second pinned magnetic layer of Co (20)/Cu (20)/Co (10)/NiFe (70)/Ta (30).

The second type is a first conventional example wherein a PtMn alloy is used for the antiferromagnetic layer, and the pinned magnetic layer is formed of one layer. The film configuration thereof is from the bottom; the Si substrate/Alumina: $Al_2O_3$/Ta (30)/antiferromagnetic layer of PtMn (300)/pinned magnetic layer of Co (25)/Cu(25)/Co (10)/NiFe (70)/Ta (30).

The third type is a second conventional example wherein NiO is used for the antiferromagnetic layer, and the pinned magnetic layer is formed of one layer. The film configuration thereof is from the bottom; the Si substrate/Alumina: $Al_2O_3$/antiferromagnetic layer of NiO (500)/pinned magnetic layer of Co (25)/Cu (25)/Co (10)/NiFe (70)/Ta (30).

The fourth type is a third conventional example wherein a FeMn alloy is used for the antiferromagnetic layer, and the pinned magnetic layer is formed of one layer. The film configuration thereof is from the bottom; the Si substrate/Alumina: $Al_1O_3$/Ta (30)/NiFe (70)/Co (10)/Cu (25)/pinned magnetic layer of Co (25)/antiferromagnetic layer of Femn (150)/Ta (30). In all four types, the numerals in the parentheses represent film thickness in units of ångström.

The present invention and the first conventional example wherein a PtMn alloy is used for the antiferromagnetic layer are subjected to thermal treatment at 260° C. for four hours while applying a magnetic field of 200 (Oe), following formation. The second and third conventional examples wherein Nio and FeMn are used for the antiferromagnetic layer are not subjected to thermal treatment following formation.

As shown in FIG. 27, with the spin-valve magnetoresistive thin film element according to the present invention, the exchange coupling magnetic field (Hex) is approximately 2500 (Oe) under an environment temperature of around 20° C., which is very high.

In comparison, with the second conventional example using NiO for the antiferromagnetic layer, and the third conventional example using FeMn for the antiferromagnetic layer, the exchange coupling magnetic field (Hex) is only around 500 (Oe) even under an environment temperature of around 20° C., which is low. Also, with the first conventional example using PiMn to form the antiferromagnetic layer, wherein the pinned magnetic layer is formed of a single layer, an exchange coupling magnetic field around 1000 (Oe) is generated under an environment temperature of around 20° C., so it can be understood that a greater exchange coupling magnetic field can be obtained than using NiO (second conventional example) or FeMn (third conventional example) for the antiferromagnetic layer.

U.S. Pat. No. 5,701,223 discloses a spin-valve magnetoresistive thin film element which uses Nio for the antiferromagnetic layer, with the pinned magnetic layer being formed of two layers with a nonmagnetic intermediate layer introduced therebetween, and the R-H curve thereof is shown in FIG. 8. According to FIG. 8 of the Patent Publication, an exchange coupling magnetic field (Hex) of 600 (Oe) is then to be obtained, but it can be understood that this is low compared to the exchange coupling magnetic field (around 1000 (Oe), first conventional example) generated wherein a PtMn alloy is used for the antiferromagnetic layer and the pinned magnetic layer is a single layer.

That is to say, if NiO is used for the antiferromagnetic layer, even dividing the pinned magnetic layer into two layers and placing the magnetization of these two layers in a Ferri-state leaves the exchange coupling magnetic field lower than an arrangement wherein a PtMn alloy is used for the antiferromagnetic layer and the pinned magnetic layer is a single layer. Consequently, it can be understood that using the PtMn alloy for the antiferromagnetic layer is preferable from the perspective that a greater exchange coupling magnetic field can be obtained.

Also, as shown in FIG. 27, if NiO or FeMn alloy is used for the antiferromagnetic layer, the exchange coupling magnetic field drops to 0 (Oe) once the environment temperature reaches 200° C. This is because the blocking temperature of NiO and FeMn alloys is around 200° C., which is low.

Conversely, with the first conventional example wherein the PtMn alloy is used for the antiferromagnetic layer, the exchange coupling magnetic field drops to 0 (Oe) when the environment temperature reaches 400° C., so it can be understood that using the PtMn, alloy allows the magnetization state of the pinned magnetic layer in an extremely stable condition, temperature-wise.

The blocking temperature is governed by the material used for the antiferromagnetic layer, so with the spin-valve magnetoresistive thin film element according to the present invention shown in FIG. 27, it can be assumed that the exchange coupling magnetic field drops to 0 (Oe) when the environment temperature reaches 400° C., but with arrangements which use PtMn alloys as the antiferromagnetic layer as with the present invention, blocking temperatures higher than using NiO or the like can be obtained, and further, a very large exchange coupling magnetic field can be obtained during the time taken to reach the blocking temperature by means of dividing the pinned magnetic layer into two layers and placing the magnetization of these two layers in a Ferri-state, so the magnetization state of the two pinned magnetic layers can be maintained in an extremely stable condition, temperature-wise.

Also, with the present invention, the nonmagnetic intermediate layer introduced between the first pinned magnetic layer and second pinned magnetic layer is formed of one of the following, or of an alloy of two or more thereof: Ru, Rh, Ir, Cr, Re, and Cu. The thickness of the nonmagnetic intermediate layer is changed depending on whether the antiferromagnetic layer is formed above the free magnetic layer or below the free magnetic layer. The nonmagnetic intermediate layer is formed to a thickness within an appropriate range; whereby the exchange coupling magnetic field (Hex) can be increased. The appropriate thickness of the nonmagnetic intermediate layer will be described in detail later, with reference to graphs.

Further, according to the present invention, dividing the pinned magnetic layer into two layers allows a large exchange coupling magnetic field (Hex) to be obtained even if the antiferromagnetic layer formed of PtMn alloy or the like is made thinner, meaning that the antiferromagnetic layer which is the thickest layer in the spin-valve magnetoresistive thin film element configuration can be reduced in thickness, consequently reducing the overall thickness of the spin-valve magnetoresistive thin film element itself. Reducing the thickness of the antiferromagnetic layer allows the distance from the gap layer formed on the underside of the spin-valve magnetoresistive thin film element to the gap layer formed on the upper side of the spin-valve magnetoresistive thin film element, i.e., the gap length, to be reduced, even if the thicknesses of the gap layers formed above and below the spin-valve magnetoresistive thin film element are formed thick enough to maintain sufficient insulation, thereby enabling handling of narrow gapping.

Now, if the pinned magnetic layer is divided into a first pinned magnetic layer and a second pinned magnetic layer with a nonmagnetic intermediate layer introduced therebetween, as with the present invention, experimentation has shown that the exchange coupling magnetic field (Hex) and the $\Delta$MR (rate of resistance change) drops drastically if the first pinned magnetic layer and second pinned magnetic layer are formed at the same thicknesses. It is supposed that this is due to the fact that forming the first pinned magnetic layer and the second pinned magnetic layer at the same thickness makes it difficult to achieve an antiparallel state (Ferri-state) in the magnetization state between the first pinned magnetic layer and the second pinned magnetic layer. Since an antiparallel state cannot be achieved between the first pinned magnetic layer and the second pinned magnetic layer, the relative angle with the fluctuating magnetization of the free magnetic layer cannot be appropriately controlled.

Accordingly, with the present invention, the first pinned magnetic layer and the second pinned magnetic layer are not formed at the same thickness, but rather at differing thicknesses. This allows a large exchange coupling magnetic field to be obtained, and at the same time raises the $\Delta$MR to around that of known arrangements. The thickness ratio between the first pinned magnetic layer and the second pinned magnetic layer will be described in detail later, with reference to graphs.

As described above, with the present invention, the exchange coupling magnetic field (Hex) of the entire spin-valve magnetoresistive thin film element can be increased by means of dividing the pinned magnetic layer into a first pinned magnetic layer and a second pinned magnetic layer with a nonmagnetic intermediate layer introduced therebetween, and by using an antiferromagnetic material such as a PtMn alloy or the like which exhibits a large exchange coupling magnetic field (exchange anisotropic magnetic field) at the interface with the first pinned magnetic layer, as the antiferromagnetic layer. Thus the magnetization state of the first pinned magnetic layer and the second pinned magnetic layer can be maintained in an extremely stable antiparallel state (Ferri-state), temperature-wise.

With the present invention, the exchange coupling magnetic field of the entire spin-valve magnetoresistive thin film element can be increased and high $\Delta$MR can be obtained, by optimizing the film thickness ratio between the divided first pinned magnetic layer and second pinned magnetic layer, the material and thickness of the nonmagnetic intermediate layer, the thickness of the antiferromagnetic layer, etc.

Spin-valve magnetoresistive thin film elements to which the present invention may be applied include both so-called single spin-valve magnetoresistive thin film elements consisting of one layer each of the antiferromagnetic layer, pinned magnetic layer, nonmagnetic electrically conductive layer, and free magnetic layer, and so-called dual spin-valve magnetoresistive thin film elements comprising nonmagnetic electrically conductive layers, pinned magnetic layers, and antiferromagnetic layers formed above and below with the free magnetic layer as the center.

Further, with the present invention, the free magnetic layer may be divided into two with the nonmagnetic intermediate layer introduced therebetween, as with the pinned magnetic layer. The magnetization of the first free magnetic layer and second free magnetic layer formed with the nonmagnetic intermediate layer introduced therebetween is magnetized in an antiparallel manner by the exchange coupling magnetic field (RKKY interaction) generated between the first free magnetic layer and second free magnetic layer, and further aligned in a direction intersecting the magnetization of the pinned magnetic layer (first pinned magnetic layer and second pinned magnetic layer).

With the case of the pinned magnetic layer (first pinned magnetic layer and second pinned magnetic layer), the magnetization is pinned in a certain direction by exchange coupling magnetic field (exchange anisotropic magnetic field) with the antiferromagnetic layer. However, the magnetization of the free magnetic layer is made to freely change according to external magnetic fields, so electric resistance changes due to the relationship between change in magnetization of the free magnetic layer and the direction of the pinned magnetization of the pinned magnetic layer, thereby enabling detection of external magnetic field signals.

With the present invention, the antiparallel state (Ferri-state) of the first pinned magnetic layer and the second pinned magnetic layer can be maintained in an extremely stable state temperature-wise, and a high $\Delta$MR as with known arrangements can be obtained, of optimizing the ratio of the thickness of the first free magnetic layer and second free magnetic layer divided with the nonmagnetic intermediate layer introduced therebetween, and the thickness of the nonmagnetic intermediate layer. The ratio of the thickness of the first free magnetic layer and second free magnetic layer and the thickness of the nonmagnetic intermediate layer will be described later in detail with reference to graphs.

Also, a second aspect of the present invention provides a spin-valve magnetoresistive thin film element, comprising: an antiferromagnetic layer; a pinned magnetic layer formed in a manner contacting the antiferromagnetic layer. The magnetizing direction is pinned by the exchange coupling magnetic field between the pinned magnetic layer and the antiferromagnetic layer. A nonmagnetic electrically conductive layer formed between a free magnetic layer and the pinned magnetic layer, wherein the magnetizing direction of the free magnetic layer is aligned so as to intersect with the magnetizing direction of the pinned magnetic layer.

Electric resistance, which changes according to the relationship between pinned magnetization of the pinned magnetic layer and fluctuating magnetization of the free magnetic layer, is detected by means of a sensing current being caused to flow in a direction intersecting the pinned magnetization of the pinned magnetic layer.

The pinned magnetic layer is divided into the two layers of a first pinned magnetic layer which comes in contact with the antiferromagnetic layer and a second pinned magnetic layer which comes in contact with the nonmagnetic electrically conductive layer, with a nonmagnetic intermediate layer introduced therebetween.

The sensing current is caused to flow in a direction such that the direction of the sensing current magnetic field formed at the first pinned magnetic layer/nonmagnetic intermediate layer/second pinned magnetic layer portion by means of causing the sensing current to flow, and the direction of a synthesized magnetic moment formed by adding the magnetic moment of the first pinned magnetic layer (wherein saturation magnetization is Ms and film thickness is t) and the magnetic moment of the second pinned magnetic layer, are the same direction.

Also, with the present invention, the spin-valve magnetoresistive thin film element may be a single spin-valve magnetoresistive thin film element consisting of one layer each of the antiferromagnetic layer, first pinned magnetic layer, nonmagnetic intermediate layer, second pinned magnetic layer, nonmagnetic electrically conductive layer, and free magnetic layer.

If the magnetic moment of the first pinned magnetic layer is greater than the magnetic moment of the second pinned magnetic layer, the sensing current must be caused to flow in a direction such that the direction of the sensing current magnetic field formed at the first pinned magnetic layer/nonmagnetic intermediate layer/second pinned magnetic layer portion by means of causing the sensing current to flow, and the direction of the magnetic moment of the first pinned magnetic layer, are the same direction.

Or, the spin-valve magnetoresistive thin film element may be a single spin-valve magnetoresistive thin film element consisting of one layer each of the antiferromagnetic layer, first pinned magnetic layer, nonmagnetic intermediate layer, second pinned magnetic layer, nonmagnetic electrically conductive layer, and free magnetic layer.

If the magnetic moment of the first pinned magnetic layer is smaller than the magnetic moment of the second pinned magnetic layer, the sensing current must be caused to flow in a direction such that the direction of the sensing current magnetic field formed at the first pinned magnetic layer/nonmagnetic intermediate layer 1 second pinned magnetic layer portion by means of causing the sensing current to flow, and the direction of the magnetic moment of the second pinned magnetic layer, are the same direction.

Also, with the present invention, the free magnetic layer preferably is divided into two layers with a nonmagnetic intermediate layer introduced therebetween. Further, the nonmagnetic intermediate layer introduced between the free magnetic layer divided into two layers is preferably formed of one of the following; or of an alloy of two or more thereof: Ru, Rh, Ir, Cr, Re, and Cu.

Also, according to the present invention, the spin-valve magnetoresistive thin film element may be a dual spin-valve magnetoresistive thin film element comprising: nonmagnetic electrically conductive layers formed above and below with the free magnetic layer as the center. The three layers of the second pinned magnetic layer/nonmagnetic intermediate layer/first pinned magnetic layer are formed above one of the nonmagnetic electrically conductive layer and below the other nonmagnetic electrically conductive layer. The antiferromagnetic layers are formed above one of the first pinned magnetic layers and below the other first pinned magnetic layer.

The synthesized magnetic moment of the first pinned magnetic layer and the second pinned magnetic layer formed to the upper side of the free magnetic layer, and the synthesized magnetic moment of the first pinned magnetic layer and the second pinned magnetic layer formed to the lower side of the free magnetic layer, are facing in mutually opposite directions.

The sensing current must be caused to flow in a direction such that the direction of the sensing current magnetic field formed at the first pinned magnetic layer/nonmagnetic intermediate layer/second pinned magnetic layer portion by causing the sensing current to flow, and the direction of the synthesized magnetic moment formed above and below the free magnetic layer, are the same direction.

With regard to specific magnitude of the magnetic moment of the first pinned magnetic layer and second pinned magnetic layer in the above-described dual spin-valve magnetoresistive thin film element, it is necessary that the magnetic moment of the first pinned magnetic layer formed to the upper side of the free magnetic layer be greater than the magnetic moment of the second pinned magnetic layer formed to the upper side of the free magnetic layer; and that the magnetic moment of the first pinned magnetic layer formed to the lower side of the free magnetic layer be smaller than the magnetic moment of the second pinned magnetic layer formed to the lower side of the free magnetic layer; and further that the pinned magnetization of the first pinned magnetic layers formed above and below the free magnetic layer be facing in the same direction.

Or, it is necessary that the magnetic moment of the first pinned magnetic layer formed to the upper side of the free magnetic layer be smaller than the magnetic moment of the second pinned magnetic layer formed to the upper side of the free magnetic layer; and that the magnetic moment of the first pinned magnetic layer formed to the lower side of the free magnetic layer be greater than the magnetic moment of the second pinned magnetic layer formed to the lower side of the free magnetic layer; and further that the pinned magnetization of the first pinned magnetic layers formed above and below the free magnetic layer be facing in the same direction.

With the present invention, it is preferable that the antiferromagnetic layer be formed of a PtMn alloy.

Or, the antiferromagnetic layer may be formed of an X—Mn alloy (wherein X is one or a plurality of the following elements: Pd, Ir, Rh, Ru, Os), or a PtMn—X' alloy (wherein X' is one or a plurality of the following elements: Pd, Ir, Rh, Ru, Os, Au, Ag).

Also, with the present invention, it is preferable that the nonmagnetic intermediate layer introduced between the first pinned magnetic layer and second pinned magnetic layer be formed of one of the following; or of an alloy of two or more thereof: Ru, Rh, Ir, Cr, Re, and Cu.

Also, a thin film magnetic head according to the present invention comprises shield layers formed above and below the above-described spin-valve magnetoresistive thin film element, with gap layers introduced therebetween.

With the present invention, the pinned magnetic layer making up the spin-valve magnetoresistive thin film element is divided into two layers, with a nonmagnetic intermediate layer introduced between the pinned magnetic layers divided into two layers.

The magnetization of the divided two pinned magnetic layers are magnetized so as to be in an antiparallel state, and also are in a so-called Ferri-state wherein the magnitude of the magnetic moment of one pinned magnetic layer differs from the magnetic moment of the other pinned magnetic layer. The exchange coupling magnetic field (RKKY interaction) generated between the two pinned magnetic layers is very large, around 1,000 (Oe) to 5,000 (Oe), so the two pinned magnetic layers are in a very stable state of antiparallel magnetization.

Now, one of the pinned magnetic layers magnetized in the antiparallel state (Ferri-state) is formed so as to be in contact with the antiferromagnetic layer, and the magnetization of the pinned magnetic layer which is in contact with the antiferromagnetic layer (hereafter referred to as the "first pinned magnetic layer") is fixed in the direction away from a plane facing a recording medium for example (i.e., the height direction), by the exchange coupling magnetic field (exchange anisotropic magnetic field) generated at the interface between the pinned magnetic layer and the antiferromagnetic layer. Accordingly, the magnetization of the pinned magnetic layer facing the first pinned magnetic layer with a nonmagnetic intermediate layer introduced therebetween (hereafter referred to as the "second pinned magnetic layer") is pinned in a state antiparallel with the magnetization of the first pinned magnetic layer.

With the present invention, the portion that has been conventionally comprised of the two layers of the antiferromagnetic layer and pinned magnetic layer, is formed of the four layers of antiferromagnetic layer/first pinned magnetic layer/nonmagnetic intermediate layer/second pinned magnetic layer, whereby the magnetization state of the first pinned magnetic layer and second pinned magnetic layer can be maintained at an extremely stable state regarding external magnetic fields.

Now, in recent years, recording density has increased, and accordingly, increase in temperature within the device due to increase of the revolutions of the recording medium, increase in temperature due to increase of sensing current, and increase of sensing current magnetic fields may make the magnetization state of the first pinned magnetic layer and the second pinned magnetic layer unstable.

The sensing current is caused to flow in a direction intersecting with the magnetization direction of the first pinned magnetic layer and the second pinned magnetic layer (i.e., in the same direction as the magnetization direction in the free magnetic layer, or the opposite direction), but a sensing current magnetic field is formed by the corkscrew rule by causing the sensing current to flow, and this sensing current magnetic field intrudes into the first pinned magnetic layer/nonmagnetic intermediate layer/second pinned magnetic layer portion, in the same or opposite magnetization direction as the first pinned magnetic layer (or second pinned magnetic layer).

As described above, the magnetic moment of the first pinned magnetic layer is formed so as to differ from the magnetic moment of the second pinned magnetic layer, thereby placing the magnetization of the first pinned magnetic layer and the second pinned magnetic layer in an antiparallel magnetized state. With the present invention, the difference in magnitude of the magnetic moment of the first pinned magnetic layer and the second pinned magnetic layer is used to cause the sensing current to flow in an appropriate direction, so that the magnetization state of the first pinned magnetic layer and the second pinned magnetic layer is placed in a thermally more stable state, by the sensing current magnetic field.

Specifically, with the spin-valve magnetoresistive thin film element, if the magnetic moment of the first pinned magnetic layer is greater than the magnetic moment of the second pinned magnetic layer, the synthesized magnetic moment which can be obtained by adding the magnetic moment of the first pinned magnetic layer and the magnetic moment of the second pinned magnetic layer faces the same direction as the magnetic moment of the first pinned magnetic layer.

Then, the present invention allows the magnetization state of the first pinned magnetic layer and the second pinned magnetic layer to be in a thermally more stable state, by adjusting the direction of causing the sensing current to flow, so that the sensing current magnetic field formed at the portion of the first pinned magnetic layer/nonmagnetic intermediate layer/second pinned magnetic layer portion and the direction of the synthesized magnetic moment match.

Further, with the present invention, a dual spin-valve magnetoresistive thin film element allows the magnetization state of the first pinned magnetic layer and the second pinned magnetic layer to be in a thermally stable state, by adjusting the magnetic moment and so forth of the first pinned magnetic layer and the magnetic moment of the second pinned magnetic layer such that the synthesized magnetic moments formed above and below the free magnetic layer are mutually opposing, thereby causing the sensing current to flow such that the sensing current magnetic field formed at the portion of the first pinned magnetic layer/nonmagnetic intermediate layer/second pinned magnetic layer portion and the direction of the synthesized magnetic moment match.

Also, according to the present invention, several conditions other than the direction of the sensing current are used in order to improve the magnetization stability of the first pinned magnetic layer and second pinned magnetic layer.

The first is to increase the exchange coupling magnetic field (exchange anisotropic magnetic field) generated at the interface between the antiferromagnetic layer and the first pinned magnetic layer. As described above, the magnetization of the first pinned magnetic layer is pinned in a certain direction by the exchange coupling magnetic field (exchange anisotropic magnetic field) generated at the interface with the antiferromagnetic layer, but if this exchange coupling magnetic field is weak, the pinned magnetization of the first pinned magnetic layer does not stabilize, and easily changes due to external magnetic fields and the like. Accordingly, it is preferable that the exchange coupling magnetic field (exchange anisotropic magnetic field) generated at the interface with the antiferromagnetic layer be large, and the present invention gives a PtMn alloy as an antiferromagnetic layer whereby a large exchange coupling magnetic field generated at the interface with the first pinned magnetic layer can be obtained. Also, an X—Mn alloy (wherein X is one or a plurality of the following elements: Pd, Ir, Rh, Ru, and Os), or a PtMn—X' alloy (wherein X' is one or a plurality of the following elements: Pd, Ir, Rh, Ru, Os, Au, and Ag) may be used instead of the PtMn alloy.

These antiferromagnetic materials have excellent properties, as they produce a greater exchange coupling magnetic field than NiO, FeMn alloys, NiMn alloys, and the like conventionally used for antiferromagnetic materials, have high blocking temperatures, further have excellent corrosion-resistant properties, and so forth.

FIG. 26 shows R-H curves of the spin-valve magnetoresistive thin film element according to the present invention using a PtMn alloy for the antiferromagnetic layer, wherein the pinned magnetic layer is divided into two layers with a nonmagnetic intermediate layer introduced therebetween, and a known spin-valve magnetoresistive thin film element wherein the pinned magnetic layer is formed as a single layer.

The film configuration of the spin-valve magnetoresistive thin film element according to the present invention is: from the bottom; the Si substrate/Alumina/Ta (30)/antiferromagnetic layer of PtMn (200)/first pinned magnetic layer of Co (25)/nonmagnetic intermediate layer of Ru (7)/second pinned magnetic layer of Co (20)/Cu (20)/Co (10)/NiFe (40)/Ta (30); wherein the numerals in the parentheses represent film thickness in units of Ångström; whereas the film configuration of the known spin-valve magnetoresistive thin film element is from the bottom; the Si substrate/Alumina: $Al_2O_3$/Ta (30)/antiferromagnetic layer of PtMn (300)/pinned magnetic layer of Co (25)/Cu (20)/Co (10)/NiFe (40)/Ta (30).

A spin-valve magnetoresistive thin film element according to the present invention and a known spin-valve magnetoresistive thin film element were both formed, and subjected to thermal treatment at 260° C. for four hours while applying a magnetic field of 200 (Oe).

As can be understood from FIG. 26, the ΔMR (resistance change rate) of the spin-valve magnetoresistive thin film element according to the present invention is between 7 to 8% at the greatest, and the ΔMR drops by applying a negative external magnetic field, but the ΔMR in the present invention drops slower than the ΔMR of the known spin-valve magnetoresistive thin film element.

Now, with the present invention, the magnitude of the external magnetic field at the time that the ΔMR is half of the maximum value shall be stipulated as the exchange coupling magnetic field (Hex) generated by the spin-valve magnetoresistive thin film element.

As shown in FIG. 26, the maximum ΔMR of the known spin valve magnetoresistive thin film element is approximately 8%, and the external magnetic field at which the ΔMR drops to half (the exchange coupling magnetic field (Hex)) is approximately 900 (Oe) absolute value.

In comparison, with the present invention the maximum ΔMR of the known spin-valve magnetoresistive thin film element is approximately 7.5%, which is slightly lower than the known arrangement, the external magnetic field at which the ΔMR drops to half (the exchange coupling magnetic field (Hex)) is approximately 2800 (Oe) absolute value, which is much higher.

Thus, it can be understood that the exchange coupling magnetic field (Hex) can be markedly increased with the spin-valve magnetoresistive thin film element according to the present invention wherein the pinned magnetic layer is divided into two layers, as compared with the known spin-valve magnetoresistive thin film element wherein the pinned magnetic layer is formed of one layer, and the stability of the magnetization of the pinned magnetic layer can be improved in comparison with the known arrangement. Also, the ΔMR of the present invention does not drop very much as compared with the known arrangement, showing that a high ΔMR can be maintained.

Next, FIG. 27 is a graph showing the relation between environmental temperature and the exchange coupling magnetic field, using four types of spin-valve magnetoresistive thin film elements.

The first type of spin-valve magnetoresistive thin film element used is a spin-valve magnetoresistive thin film element according to the present invention wherein a PtMn alloy is used for the antiferromagnetic layer, and the pinned magnetic layer is divided into two layers. The film configuration thereof is from the bottom; the Si substrate/Alumina: $Al_2O_3$/Ta (30)/antiferromagnetic layer of PtMn (200)/first pinned magnetic layer of Co (25)/nonmagnetic intermediate layer of Ru (7)/second pinned magnetic layer of Co (20)/Cu (20)/Co (10)/NiFe (70)/Ta (30).

The second type is a first conventional example wherein a PtMn alloy is used for the antiferromagnetic layer, and the pinned magnetic layer is formed of one layer. The film configuration thereof is from the bottom; the Si substrate/Alumina: $Al_2O_3$/Ta (30)/antiferromagnetic layer of PtMn (300)/pinned magnetic layer of Co (25)/Cu (25)/Co (10)/NiFe (70)/Ta (30).

The third type is a second conventional example wherein NiO is used for the antiferromagnetic layer, and the pinned magnetic layer is formed of one layer. The film configuration thereof is from the bottom; the Si substrate/Alumina: $Al_2O_3$/ antiferromagnetic layer of NiO (500) pinned magnetic layer of Co (25) Cu (25)/Co (10)/NiFe (70)/Ta (30).

The fourth type is a third conventional example wherein an FeMn alloy is used for the antiferromagnetic layer, and the pinned magnetic layer is formed of one layer. The film configuration thereof is from the bottom; the Si substrate/Alumina: $Al_2O_3$/Ta (30)/NiFe (70)/Co (10)/Cu (25)/pinned magnetic layer of Co (25)/antiferromagnetic layer of FeMn (150)/Ta (30). In all four types, the numerals in the parentheses represent film thickness in units of ångström.

The present invention and the first conventional example wherein a PtMn alloy is used for the antiferromagnetic layer are subjected to thermal treatment at 260° C. for four hours while applying a magnetic field of 200 (Oe), following formation. The second and third conventional examples wherein NiO and FeMn are used for the antiferromagnetic layer are not subjected to thermal treatment following formation.

As shown in FIG. 27, with the spin-valve magnetoresistive thin film element according to the present invention, the exchange coupling magnetic field (Hex) is approximately 2,500 (Oe) under an environment temperature of around 200° C., which is very high.

In comparison, with the second conventional example using NiO for the antiferromagnetic layer, and the third conventional example using FeMn for the antiferromagnetic layer, the exchange coupling magnetic field (Hex) is only around 500 (Oe) even under an environment temperature of around 20° C., which is low. Also, with the first conventional example using PtMn to form the antiferromagnetic layer, wherein the pinned magnetic layer is formed of a single layer, an exchange coupling magnetic field (Hex) around 1,000 (Oe) is generated under an environment temperature of around 200° C., so it can be understood that a greater exchange coupling magnetic field can be obtained than using NiO (second conventional example) or FeMn (third conventional example) for the antiferromagnetic layer.

U.S. Pat. No. 5,701,223 discloses a spin-valve magnetoresistive thin film element which uses NiO for the antiferromagnetic layer, with the pinned magnetic layer being formed of two layers with a nonmagnetic intermediate layer introduced therebetween, and the R-H curve thereof is shown in FIG. 8. According to FIG. 8 of the Patent Publication, an exchange coupling magnetic field (Hex) of 600 (Oe) is then to be obtained, but it can be understood that this is low compared to the exchange coupling magnetic field (around 1000 (Oe), first conventional example) generated wherein a PtMn alloy is used for the antiferromagnetic layer and the pinned magnetic layer is a single layer.

That is to say, if NiO is used for the antiferromagnetic layer, even dividing the pinned magnetic layer into two layers and placing the magnetization of these two layers in a Ferri-state leaves the exchange coupling magnetic field lower than an arrangement wherein a PtMn alloy is used for the antiferromagnetic layer and the pinned magnetic layer is a single layer. Consequently, it can be understood that using the PtMn alloy for the antiferromagnetic layer is preferable from the perspective that a greater exchange coupling magnetic field can be obtained.

Also, as shown in FIG. 27, if NiO or FeMn alloy is used for the antiferromagnetic layer, the exchange coupling magnetic field drops to 0 (Oe) once the environment temperature reaches 200° C. This is because the blocking temperature of NiO and FeMn alloys is around 200° C., which is low.

Conversely, with the first conventional example wherein the PtMn alloy is used for the antiferromagnetic layer, the exchange coupling magnetic field drops to 0 (Oe) when the environment temperature reaches 400° C., so it can be understood that using the PtMn alloy allows the magnetization state of the pinned magnetic layer in an extremely stable condition, temperature-wise.

The blocking temperature is governed by the material used for the antiferromagnetic layer, so with the spin-valve magnetoresistive thin film element according to the present invention shown in FIG. 27, it can be assumed that the exchange coupling magnetic field drops to 0 (Oe) when the environment temperature reaches 400° C., but with arrangements which use PtMn alloys as the antiferromagnetic material as with the present invention, blocking temperatures higher than using NiO or the like can be obtained, and further, a very large exchange coupling magnetic field can be obtained during the time taken to reach the blocking temperature by dividing the pinned magnetic layer into two layers and placing the magnetization of these two layers in a Ferri-state, so the magnetization state of the two pinned magnetic layers can be maintained in a thermally stable condition.

Also, with the present invention, the nonmagnetic intermediate layer introduced between the first pinned magnetic layer and second pinned magnetic layer is formed of one of the following, or of an alloy of two or more thereof: Ru, Rh, Ir, Cr, Re, and Cu; the thickness of the nonmagnetic intermediate layer is changed depending on whether the antiferromagnetic layer is formed above the free magnetic layer or below the free magnetic layer; and the nonmagnetic intermediate layer is formed to a thickness within an appropriate range; whereby the exchange coupling magnetic field (Hex) can be increased. The appropriate thickness of the nonmagnetic intermediate layer will be described in detail later, with reference to graphs.

Further, according to the present invention, dividing the pinned magnetic layer into two layers allows a large exchange coupling magnetic field (Hex) to be obtained even if the antiferromagnetic layer formed of PtMn alloy or the like is made thinner, meaning that the antiferromagnetic layer which is the thickest layer in the spin-valve magnetoresistive thin film element configuration can be reduced in thickness, consequently reducing the overall thickness of the spin-valve magnetoresistive thin film element itself. Reducing the thickness of the antiferromagnetic layer allows the distance from the gap layer formed on the underside of the spin-valve magnetoresistive thin film element to the gap layer formed on the upper side of the spin-valve magnetoresistive thin film element, i.e., the gap length, to be reduced, even if the thicknesses of the gap layers formed above and below the spin-valve magnetoresistive thin film element are formed thick enough to maintain sufficient insulation, thereby enabling handling of narrow gapping.

Now, if the pinned magnetic layer is divided into a first pinned magnetic layer and a second pinned magnetic layer with a nonmagnetic intermediate layer introduced therebetween, as with the present invention, experimentation has shown that the exchange coupling magnetic field (Hex) and the ΔMR (rate of resistance change) drops drastically if the first pinned magnetic layer and second pinned magnetic layer are formed at the same thicknesses. It is supposed that this is due to the fact that forming the first pinned magnetic layer and the second pinned magnetic layer at the same thickness makes it difficult to achieve an antiparallel state (Ferri-state) in the magnetization state between the first pinned magnetic layer and the second pinned magnetic layer. Since an antiparallel state cannot be achieved between the first pinned magnetic layer and the second pinned magnetic layer, the relative angle with the fluctuating magnetization of the free magnetic layer cannot be appropriately controlled.

Accordingly, with the present invention, the first pinned magnetic layer and the second pinned magnetic layer are not formed at the same thickness, but rather at differing thicknesses, thereby allowing a large exchange coupling magnetic field to be obtained, and at the same time raising the ΔMR to around that of known arrangements. The thickness ratio between the first pinned magnetic layer and the second pinned magnetic layer will be described in detail later, with reference to graphs.

As described above, with the present invention, the exchange coupling magnetic field (Hex) of the entire spin-valve magnetoresistive thin film element can be increased by dividing the pinned magnetic layer into a first pinned magnetic layer and a second pinned magnetic layer with a nonmagnetic intermediate layer introduced therebetween, and by using an antiferromagnetic material such as a PtMn alloy or the like which exhibits a large exchange coupling magnetic field (exchange anisotropic magnetic field) at the interface with the first pinned magnetic layer, as the antiferromagnetic layer, so the magnetization state of the first pinned magnetic layer and the second pinned magnetic layer can be maintained in a stable antiparallel state (Ferri-state), temperature-wise.

Particularly, with the present invention, the direction of the sensing current magnetic field formed by the flow of sensing current and the direction of the synthesized magnetic moment which can be obtained by adding the magnetic moment of the first pinned magnetic layer and the magnetic moment of the second pinned magnetic layer are made to match by controlling the direction in which the sensing current is made to flow, so the magnetization state of the first pinned magnetic layer and the second pinned magnetic layer can be maintained in an even more thermally stable state.

A third aspect of the present invention is a method for manufacturing a single spin-valve magnetoresistive thin film element, wherein the thin film element comprises: an antiferromagnetic layer; a pinned magnetic layer formed in a manner contacting the antiferromagnetic layer, wherein the magnetization thereof is pinned in a certain direction by the exchange coupling magnetic field generated at the interface between the pinned magnetic layer and the antiferromagnetic layer by thermal treatment in a magnetic field; and a magnetic electrically conductive layer formed between a free magnetic layer and the pinned magnetic layer, wherein the magnetizing direction of the free magnetic layer is aligned so as to intersect with the magnetizing direction of the pinned magnetic layer; and wherein the thin film element consists of one layer each of an antiferromagnetic layer, pinned magnetic layer, nonmagnetic electrically conductive layer, and free magnetic layer.

The method comprises the steps of:

a process for forming the magnetic moment of the first pinned magnetic layer (wherein saturation magnetization is Ms and film thickness is t) and the magnetic moment of the second pinned magnetic layer so as to differ in size, at the time that the pinned magnetic layer is divided into the two layers of a first pinned magnetic layer coming into contact with the antiferromagnetic layer and a second pinned magnetic layer coming into contact with the nonmagnetic electrically conductive layer, with a nonmagnetic intermediate layer introduced therebetween; and a process wherein, at the time of conducting thermal treatment in a magnetic field following forming the single spin-valve magnetoresistive thin film element, a magnetic field of 100 to 1,000 Oe or a magnetic field of 5 kOe or greater is applied in the direction in which pointing of the magnetization of the first pinned magnetic layer is desired if the magnetic moment of the first pinned magnetic layer is greater than the magnetic moment of the second pinned magnetic layer, or, a magnetic field of 100 to 1,000 Oe is applied in the direction opposite to which pointing of the magnetization of the first pinned magnetic layer is desired or a magnetic field of 5 kOe or greater is applied in the direction in which pointing of the magnetization of the first pinned magnetic layer is desired if the magnetic moment of the first pinned magnetic layer is smaller than the magnetic moment of the second pinned magnetic layer.

With the present invention, the layers for the single spin-valve magnetoresistive thin film element may be formed from the bottom in the order of: the antiferromagnetic layer, the first pinned magnetic layer, the nonmagnetic intermediate layer, the second pinned magnetic layer, the nonmagnetic electrically conductive layer, and the free magnetic layer, or may be formed from the bottom in the order of: the free magnetic layer, the nonmagnetic electrically conductive layer, the second pinned magnetic layer, the nonmagnetic intermediate layer, the first pinned magnetic layer, and the antiferromagnetic layer.

Also, with the present invention, the free magnetic layer may be divided into two layers with a nonmagnetic intermediate layer introduced therebetween.

Also, the present invention provides a method for manufacturing a dual spin-valve magnetoresistive thin film element, this spin-valve magnetoresistive thin film element comprising: nonmagnetic electrically conductive layers formed above and below the free magnetic layer with the free magnetic layer as the center; pinned magnetic layers formed above one of the nonmagnetic electrically conductive layers and below the other nonmagnetic electrically conductive layer, having the magnetization thereof pinned in one direction; and antiferromagnetic layers formed above one of the pinned magnetic layer and below the other pinned magnetic layer.

The method comprises the steps of:
a process for creating difference in divided pinned magnetic layers formed above and below the free magnetic layer at the time of dividing the pinned magnetic layer into the two layers of a first pinned magnetic layer coming into contact with the antiferromagnetic layer and a second pinned magnetic layer coming into contact with the nonmagnetic electrically conductive layer, with the nonmagnetic intermediate layer introduced therebetween, such that the magnetic moment of the first pinned magnetic layer (wherein saturation magnetization is Ms and film thickness is t) formed to the upper side of the free magnetic layer is greater than the magnetic moment of the second pinned magnetic layer formed to the upper side of the free magnetic layer, and also so that the magnetic moment of the first pinned magnetic layer formed to the lower side of the free magnetic layer is smaller than the magnetic moment of the second pinned magnetic layer formed to the lower side of the free magnetic layer, or, such that the magnetic moment of the first pinned magnetic layer formed to the upper side of the free magnetic layer is smaller than the magnetic moment of the second pinned magnetic layer formed to the upper side of the free magnetic layer, and also so that the magnetic moment of the first pinned magnetic layer formed to the lower side of the free magnetic layer is greater than the magnetic moment of the second pinned magnetic layer formed to the lower side of the free magnetic layer; and a process for applying a magnetic field of 5 kOe or greater in the direction in which pointing of the magnetization of the first pinned magnetic layer is desired, at the time of generating the exchange coupling magnetic field generated at the interface between the first pinned magnetic layer and the antiferromagnetic layer formed above and below the free magnetic layer, by thermal treatment in a magnetic field following formation of the films of the dual spin-valve magnetoresistive thin film element, thereby pinning the magnetization of both first pinned magnetic layers in the same direction.

Also, the present invention may be arranged such that the magnetic moment of the first pinned magnetic layer formed to the upper side of the free magnetic layer is made to be greater than the magnetic moment of the second pinned magnetic layer formed to the upper side of the free magnetic layer, and also the magnetic moment of the first pinned magnetic layer formed to the lower side of the free magnetic layer is made to be greater than the magnetic moment of the second pinned magnetic layer formed to the lower side of the free magnetic layer, and a magnetic field of 100 to 1,000 Oe or a magnetic field of 5 kOe or greater is applied in the direction in which pointing of the magnetization of the first pinned magnetic layer is desired, or, such that the magnetic moment of the first pinned magnetic layer formed to the upper side of the free magnetic layer is made to be smaller than the magnetic moment of the second pinned magnetic layer formed to the upper side of the free magnetic layer, and also the magnetic moment of the first pinned magnetic layer formed to the lower side of the free magnetic layer is made to be smaller than the magnetic moment of the second pinned magnetic layer formed to the lower side of the free magnetic layer, and a magnetic field of 100 to 1,000 Oe is applied in the direction opposite to which pointing of the magnetization of the first pinned magnetic layer is desired, or a magnetic field of 5 kOe or greater is applied in the direction in which pointing of the magnetization of the first pinned magnetic layer is desired, thereby pinning the magnetization of both first pinned magnetic layers formed above and below the free magnetic layer in the same direction.

Further, the present invention provides another method for manufacturing a dual spin-valve magnetoresistive thin film element, this spin-valve magnetoresistive thin film element comprising: nonmagnetic electrically conductive layers formed above and below the free magnetic layer with the free magnetic layer as the center; pinned magnetic layers formed above one of the nonmagnetic electrically conductive layers and below the other nonmagnetic electrically conductive layer, having the magnetization thereof pinned in one direction; and antiferromagnetic layers formed above one of the pinned magnetic layer and below the other pinned magnetic layer.

The method comprises the steps of:
a process for dividing the free magnetic layer into the two layers of a first free magnetic layer and a second free magnetic layer with a nonmagnetic intermediate layer introduced therebetween, and aligning the magnetization of the first pinned magnetic layer and the magnetization of the second pinned magnetic layer in an antiparallel manner;

a process for creating difference in divided pinned magnetic layers at the time of dividing the pinned magnetic layer into the two layers of a first pinned magnetic layer and a second pinned magnetic layer, with the nonmagnetic intermediate layer introduced therebetween, such that the magnetic moment of the first pinned magnetic layer (wherein saturation magnetization is Ms and film thickness is t) formed to the upper side of the free magnetic layer is greater than the magnetic moment of the second pinned magnetic layer formed to the upper side of the free magnetic layer, and also so that the magnetic moment of the first pinned magnetic layer (wherein saturation magnetization is Ms and film thickness is t) formed to the lower side of the free magnetic layer is smaller than the magnetic moment of the second pinned magnetic layer (wherein saturation magnetization is Ms and film thickness is t) formed to the lower side of the free magnetic layer, or, such that the magnetic moment of the first pinned magnetic layer formed to the upper side of the free magnetic layer is smaller than the magnetic moment of the second pinned magnetic layer formed to the upper side of the free magnetic layer, and also so that the magnetic moment of the first pinned magnetic layer formed to the lower side of the free magnetic layer is greater than the magnetic moment of the second pinned magnetic layer formed to the lower side of the free magnetic layer; and a process for applying a magnetic field of 100 to 1,000 Oe in the direction in which pointing of the magnetization of the first pinned magnetic layer is desired, at the time of generating an exchange coupling magnetic field at the interface between the first pinned magnetic layer and the antiferromagnetic layer formed above and below the free magnetic layer, by thermal treatment in a magnetic field following forming the dual spin-valve magnetoresistive thin film element, thereby aligning and pinning the magnetization of the first pinned magnetic layers formed above and below the free magnetic layer in an antiparallel manner.

Also, with the present invention, the antiferromagnetic layer is preferably formed of a PtMn alloy. Further, the antiferromagnetic layer may be formed of an X—Mn alloy (wherein X is one or a plurality of the following elements: Pd, Ir, Rh, Ru, Os), or a PtMn—X' alloy (wherein X', is one or a plurality of the following elements: Pd, Ir, Rh, Ru, Os, Au, Ag), instead of the PtMn alloy.

Further, according to the present invention, the nonmagnetic intermediate layer introduced between the first pinned magnetic layer and second pinned magnetic layer, and the nonmagnetic intermediate layer introduced between the first free magnetic layer and second free magnetic layer, are preferably formed of one of the following; or of an alloy of two or more thereof: Ru, Rh, Ir, Cr, Re, and Cu.

Also, the present invention is a method for manufacturing a thin film magnetic head, the head comprising: the above-described spin-valve magnetoresistive thin film element formed above a lower shield layer with a gap layer introduced therebetween; and an upper shield layer formed above the spin-valve magnetoresistive thin film element, with a gap layer introduced therebetween.

With the present invention, the pinned magnetic layer making up the spin-valve magnetoresistive thin film element is divided into two layers, with a nonmagnetic intermediate layer introduced between the pinned magnetic layers divided into two layers.

The magnetization of the two divided pinned magnetic layers are magnetized so as to be in an antiparallel state, and also are in a so-called Ferri-state wherein the magnitude of the magnetic moment of one pinned magnetic layer differs from the magnetic moment of the other pinned magnetic layer. The exchange coupling magnetic field (RKKY interaction) generated between the two pinned magnetic layers is very large, around 1,000 (Oe) to 5,000 (Oe), so the two pinned magnetic layers are in a very stable state of antiparallel magnetization.

Now, one of the pinned magnetic layers magnetized in the antiparallel state (Ferri-state) is formed so as to be in contact with the antiferromagnetic layer, and the magnetization of the pinned magnetic layer which is in contact with the antiferromagnetic layer (hereafter referred to as the "first pinned magnetic layer") is pinned in the direction away from a plane facing a recording medium for example (i.e., the height direction), by the exchange coupling magnetic field (exchange anisotropic magnetic field) generated at the interface between the pinned magnetic layer and the antiferromagnetic layer. Accordingly, the magnetization of the pinned magnetic layer facing the first pinned magnetic layer with a nonmagnetic intermediate layer introduced therebetween (hereafter referred to as the "second pinned magnetic layer") is pinned in a state antiparallel with the magnetization of the first pinned magnetic layer.

With the present invention, the portion that has been conventionally comprised of the two layers of the antiferromagnetic layer and pinned magnetic layer, is formed of the four layers of antiferromagnetic layer/first pinned magnetic layer/nonmagnetic intermediate layer/second pinned magnetic layer, whereby the magnetization state of the first pinned magnetic layer and second pinned magnetic layer can be maintained at an extremely stable state regarding external magnetic fields. Particularly, in cases such as with the present invention wherein antiferromagnetic material is used for generating an exchange coupling magnetic field (exchange anisotropic magnetic field) at the interface between the first pinned magnetic layer and the antiferromagnetic layer by performing thermal treatment in a magnetic field, the direction and magnitude of the magnetic field during thermal treatment must be controlled appropriately, or the magnetization of the first pinned magnetic layer and second pinned magnetic layer cannot be maintained in an antiparallel state.

Also, a problem that arises regarding the magnetization control of the first pinned magnetic layer and second pinned magnetic layer is the relationship between the fluctuating magnetization of the free magnetic layer and the pinned magnetization of the second pinned magnetic layer formed above and below the free magnetic layer, in the case of dual spin-valve magnetoresistive thin film elements.

With dual spin-valve magnetoresistive thin film elements, nonmagnetic electrically conductive layers and pinned magnetic layers are formed above and below the free magnetic layer, so a greater ΔMR (the rate of resistance change) can be expected as compared to single spin-valve magnetoresistive thin film elements. However, the rate of resistance change according to the relationship between the fluctuating magnetization of the free magnetic layer, and the second pinned magnetic layer formed above the free magnetic layer with a nonmagnetic electrically conductive layer introduced therebetween; and the rate of resistance change according to the relationship between the fluctuating magnetization of the free magnetic layer, and the second pinned magnetic layer formed below the free magnetic layer with a nonmagnetic electrically conductive layer introduced therebetween; must both exhibit the same fluctuation, and the direction of pinned magnetization of the second pinned magnetic layer must be appropriately controlled to this end.

That is, the direction of pinned magnetization of the second pinned magnetic layer must be appropriately controlled so that if the rate of resistance change at the upper side of the free magnetic layer is maximum, the rate of resistance change at the lower side of the free magnetic layer must also be made to be maximum, and if the rate of resistance change at the upper side of the free magnetic layer is minimum, the rate of resistance change at the lower side of the free magnetic layer must also be made to be minimum.

Accordingly, with the present invention, the magnitude of the values of magnetic moment at the first pinned magnetic layer and magnetic moment at the second pinned magnetic layer are appropriately adjusted, along with adjusting the size and direction of the magnetic field applied during thermal treatment, thereby appropriately controlling the pinned magnetization direction of the first pinned magnetic layer and the pinned magnetization direction of the second pinned magnetic layer.

Next, with reference to FIG. 21, the difference between a spin-valve magnetoresistive thin film element according to the present invention wherein the pinned magnetic layer is divided into a first pinned magnetic layer and second pinned magnetic layer, and a known hysteresis loop wherein the pinned magnetic layer is formed of a single layer, will be described.

FIG. 26 shows R-H curves of the spin-valve magnetoresistive thin film element according to the present invention, wherein a PtMn alloy is used as the antiferromagnetic layer and the pinned magnetic layer is divided into the two layers of the first pinned magnetic layer and second pinned magnetic layer with a nonmagnetic intermediate layer introduced therebetween, and a known spin-valve magnetoresistive thin film element, wherein the pinned magnetic layer is formed as a single layer.

The film configuration of the spin-valve magnetoresistive thin film element according to the present invention is: from the bottom; the Si substrate/Alumina/Ta (30)/ antiferromagnetic layer of PtMn (200)/first pinned magnetic layer of Co (25)/nonmagnetic intermediate layer of Ru (7)/second pinned magnetic layer of Co (20)/Cu (20)/Co (10)/NiFe (40)/Ta (30); wherein the numerals in the parentheses represent film thickness in units of ångström whereas the film configuration of the known spin-valve magnetoresistive thin film element is from the bottom; the Si substrate/ Alumina: $Al_2O_3$/Ta (30)/antiferromagnetic layer of PtMn (300) pinned magnetic layer of Co (25)/Cu (20)/Co (10)/ NiFe (40)/Ta (30).

A spin-valve magnetoresistive thin film element according to the present invention and a known spin-valve magnetoresistive thin film element were both formed, and subjected to thermal treatment at 260° C. for four hours while applying a magnetic field of 200 (Oe).

As can be understood from FIG. 26, the ΔMR (resistance change rate) of the spin-valve magnetoresistive thin film element according to the present invention is between 7 to 8% at the greatest. Further, the ΔMR drops by applying a negative external magnetic field, but the ΔMR in the present invention drops slower than the ΔMR of the known spin-valve magnetoresistive thin film element.

Now, with the present invention, the magnitude of the external magnetic field at the time that the ΔMR is half of the maximum value shall be stipulated as the exchange coupling magnetic field (Hex) generated by the spin-valve magnetoresistive thin film element.

As shown in FIG. 26, the maximum ΔMR of the known spin valve magnetoresistive thin film element is approximately 8%, and the external magnetic field at which the ΔMR drops to half (the exchange coupling magnetic field (Hex)) is approximately 900 (Oe) absolute value.

In comparison, the maximum ΔMR of the spin-valve magnetoresistive thin film element according to the present invention is approximately 7.5%, which is slightly lower than the known arrangement, the external magnetic field at which the ΔMR drops to half (the exchange coupling magnetic field (Hex)) is approximately 2800 (Oe) absolute value, which is much higher.

Thus, it can be understood that the exchange coupling magnetic field (Hex) can be markedly increased with the spin-valve magnetoresistive thin film element according to the present invention wherein the pinned magnetic layer is divided into two layers, as compared with the known spin-valve magnetoresistive thin film element wherein the pinned magnetic layer is formed of one layer, and the stability of the magnetization of the pinned magnetic layer can be improved in comparison with the known arrangement.

Also, the ΔMR of the present invention does not drop very much as compared with the known arrangement, showing that a high ΔMR can be maintained.

Also, with the present invention, an antiferromagnetic material which requires thermal treatment is used for generating an exchange coupling magnetic field (exchange anisotropic magnetic field) at the interface between the first pinned magnetic layer and the antiferromagnetic layer, and with the present invention in particular, PtMn alloys are preferably used of all the antiferromagnetic materials which require thermal treatment.

FIG. 27 is a graph showing the relation between environmental temperature and the exchange coupling magnetic field, in cases wherein the antiferromagnetic layer is formed of PtMn, NiO, or FeMn.

The first type of spin-valve magnetoresistive thin film element used is a spin-valve magnetoresistive thin film element according to the present invention wherein a PtMn alloy is used for the antiferromagnetic layer, and the pinned magnetic layer is divided into two layers. The film configuration thereof is from the bottom; the Si substrate/Alumina: $Al_2O_3$/Ta (30)/antiferromagnetic layer of PtMn (200)/first pinned magnetic layer of Co (25)/nonmagnetic intermediate layer of Ru (7)/second pinned magnetic layer of Co (20)/Cu (20)/Co (10)/NiFe (70)/Ta (30).

The second type is a first conventional example wherein a PtMn alloy is used for the antiferromagnetic layer, and the pinned magnetic layer is formed of one layer. The film configuration thereof is from the bottom; the Si substrate/ Alumina: $Al_2O_3$/Ta (30) antiferromagnetic layer of PtMn (300)/pinned magnetic layer of Co (25)/Cu (25)/Co (10)/ NiFe (70)/Ta (30).

The third type is a second conventional example wherein NiO is used for the antiferromagnetic layer, and the pinned magnetic layer is formed of one layer. The film configuration thereof is from the bottom; the Si substrate/Alumina: $Al_2O_3$/ antiferromagnetic layer of NiO (500)/pinned magnetic layer of Co (25)/Cu (25)/Co (10)/NiFe (70)/Ta (30).

The fourth type is a third conventional example wherein an FeMn alloy is used for the antiferromagnetic layer, and the pinned magnetic layer is formed of one layer. The film configuration thereof is from the bottom; the Si substrate/ Alumina: $Al_2O_3$/Ta (30)/NiFe (70)/Co (10)/Cu (25)/pinned magnetic layer of Co (25)/antiferromagnetic layer of FeMn (150)/Ta (30). In all four types, the numerals in the parentheses represent film thickness in units of ångström.

The present invention and the first conventional example wherein a PtMn alloy is used for the antiferromagnetic layer are subjected to thermal treatment at 260° C. for four hours while applying a magnetic field of 200 (Oe), following formation. The second and third conventional examples wherein NiO and FeMn are used for the antiferromagnetic layer are not subjected to thermal treatment following formation.

As shown in FIG. 27, with the spin-valve magnetoresistive thin film element according to the present invention, the exchange coupling magnetic field (Hex) is approximately 2500 (Oe) under an environment temperature of around 20° C., which is very high.

In comparison, with the second conventional example using NiO for the antiferromagnetic layer, and the third conventional example using FeMn for the antiferromagnetic layer, the exchange coupling magnetic field (Hex) is only around 500 (Oe) even under an environment temperature of around 20° C., which is low. Also, with the first conventional example using PtMn to form the antiferromagnetic layer, wherein the pinned magnetic layer is formed of a single layer, an exchange coupling magnetic field around 1000 (Oe) is generated under an environment temperature of around 20° C., so it can be understood that a greater exchange coupling magnetic field can be obtained than using NiO (second conventional example) or FeMn (third conventional example) for the antiferromagnetic layer.

Japanese Unexamined Patent Publication No. 9-16920 discloses a spin-valve magnetoresistive thin film element which uses NiO for the antiferromagnetic layer, with the pinned magnetic layer being formed of two layers with a nonmagnetic intermediate layer introduced therebetween, and the R-H curve thereof is shown in FIG. 8 of the Patent Publication. According to FIG. 8 of the Patent Publication, an exchange coupling magnetic field (Hex) of 600 (Oe) is then to be obtained, but it can be understood that this is low compared to the exchange coupling magnetic field (around 1000 (Oe), first conventional example) generated wherein a PtMn alloy is used for the antiferromagnetic layer and the pinned magnetic layer is a single layer.

That is to say, if NiO is used for the antiferromagnetic layer, even dividing the pinned magnetic layer into two layers and placing the magnetization of these two layers in a Ferri-state leaves the exchange coupling magnetic field lower than an arrangement wherein a PtMn alloy is used for the antiferromagnetic layer and the pinned magnetic layer is a single layer. Consequently, it can be understood that using the PtMn alloy for the antiferromagnetic layer is preferable from the perspective that a greater exchange coupling magnetic field can be obtained.

Also, as shown in FIG. 27, if NiO or FeMn alloy is used for the antiferromagnetic layer, the exchange coupling magnetic field drops to 0 (Oe) once the environment temperature reaches 200° C. This is because the blocking temperature of NiO and FeMn alloys is around 200° C., which is low.

Conversely, with the first conventional example wherein the PtMn alloy is used for the antiferromagnetic layer, the exchange coupling magnetic-field drops to 0 (Oe) when the environment temperature reaches 400° C., so it can be understood that using the PtMn alloy allows the magnetization state of the pinned magnetic layer in an extremely stable condition, temperature-wise.

The blocking temperature is governed by the material used for the antiferromagnetic layer, so with the spin-valve magnetoresistive thin film element according to the present invention shown in FIG. 27, it can be assumed that the exchange coupling magnetic field drops to 0 (Oe) when the environment temperature reaches 400° C. However with arrangements which use PtMn alloys as antiferromagnetic layers as with the present invention, blocking temperatures higher than using NiO or the like can be obtained, and further, a very large exchange coupling magnetic field can be obtained during the time taken to reach the blocking temperature by means of dividing the pinned magnetic layer into two layers and placing the magnetization of these two layers in a Ferri-state, so the magnetization state of the two pinned magnetic layers can be maintained in a thermally stable condition.

Also, regarding antiferromagnetic materials which require thermal treatment that can be used instead of PtMn alloys for generating an exchange coupling magnetic field at the interface between the first pinned magnetic layer and the antiferromagnetic layer, the present invention can propose the following: X—Mn alloys (wherein X is one or a plurality of the following elements: Pd, Ir, Rh, Ru, Os), or PtMn—X' alloys (wherein X' is one or a plurality of the following elements: Pd, Ir, Rh, Ru, Os, Au, Ag).

As described above, with the present invention, the exchange coupling magnetic field (Hex) of the entire spin-valve magnetoresistive thin film element can be increased by dividing the pinned magnetic layer into a first pinned magnetic layer and a second pinned magnetic layer with a nonmagnetic intermediate layer introduced therebetween, and by further using an antiferromagnetic material such as a PtMn alloy or the like which exhibits a large exchange coupling magnetic field (exchange anisotropic magnetic field) at the interface with the first pinned magnetic layer, as the antiferromagnetic layer. Thus, the magnetization state of the first pinned magnetic layer and the second pinned magnetic layer can be maintained in a stable antiparallel state (Ferri-state), temperature-wise.

Particularly, with the present invention, the magnitude of magnetic moment at the first pinned magnetic layer and at the second pinned magnetic layer are appropriately controlled, along with controlling the size and direction of the magnetic field applied during thermal treatment. Thus, the magnetization of the first pinned magnetic layer and the second pinned magnetic layer can be maintained in a thermally stable antiparallel state, and the magnetization of the first pinned magnetic layer and the magnetization of the second pinned magnetic layer can be easily directed in the desired direction.

DETAILED DESCRIPTION

Figure 1:
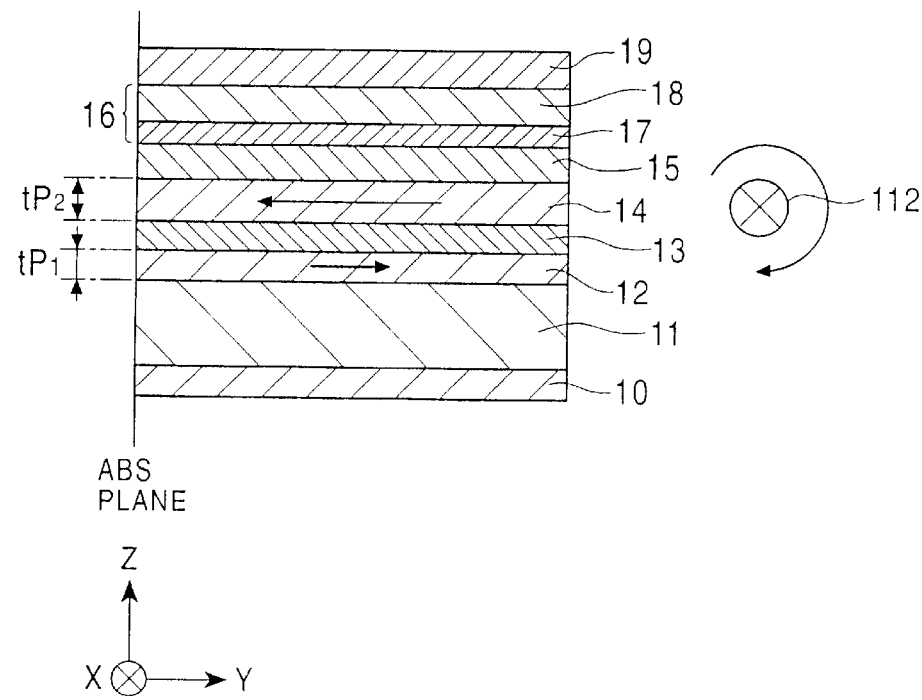
FIG. 1 is a side cross-sectional view of a spin-valve magnetoresistive thin film element according to a first embodiment of the present invention.
Figure 2:
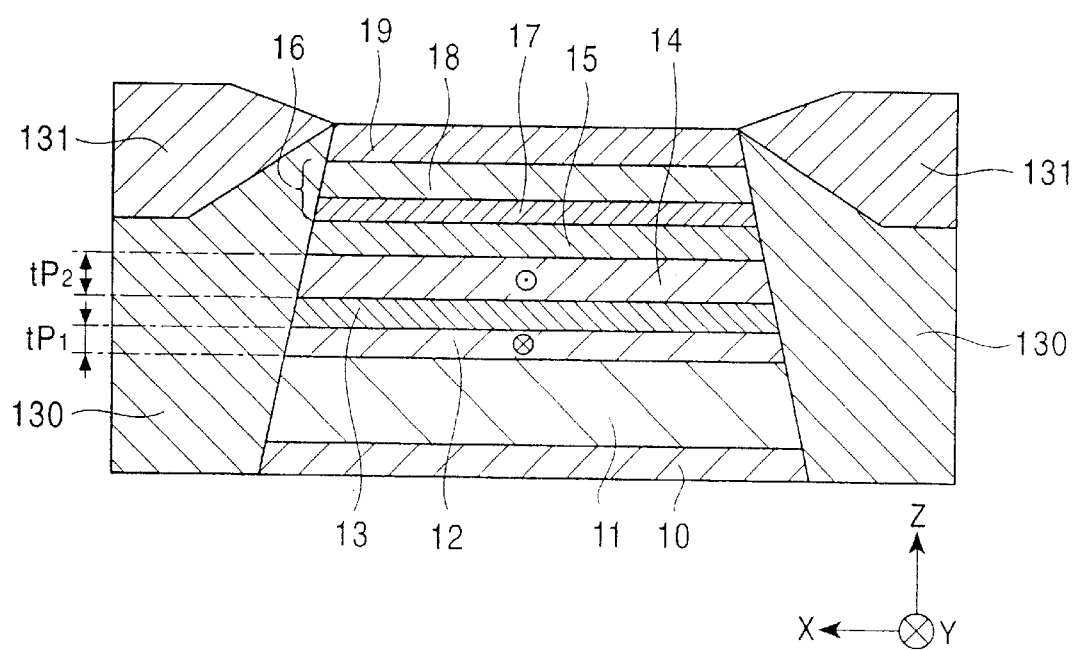
FIG. 2 is a cross-sectional view of the spin-valve magnetoresistive thin film element shown in FIG. 1, viewed from the side facing the recording medium.

FIG. 1 is a side cross-sectional view schematically showing a spin-valve magnetoresistive thin film element according to a first embodiment of the present invention, and FIG. 2 is a cross-sectional view of the spin-valve magnetoresistive thin film element shown in FIG. 1, viewed from the side facing the recording medium.

Shield layers are formed above and below this spin valve magnetoresistive thin film element, with gap layers introduced therebetween. A reproducing thin film magnetoresistive head (MR head) comprises the spin-valve magnetoresistive thin film element, gap layers, and shield layers. Further, an inductive head for recording may be layered upon the reproducing thin film magnetoresistive head.

This thin film magnetoresistive head is provided to the trailing edge or the like of a floating slider provided in a hard disk drive, and detects recorded magnetic fields on the hard disk or the like. Here, the direction of motion of the magnetic recording medium such as a hard disk is in the Z direction as shown in the Figure, and the direction of leaking magnetic field from the magnetic recording medium is in the Y direction.

The spin-valve magnetoresistive thin film element shown in FIGS. 1 and 2 are single spin-valve magnetoresistive thin film elements, consisting of one layer each of antiferromagnetic layer, pinned magnetic layer, nonmagnetic electrically conductive layer, and free magnetic layer. The layer formed at the very bottom is a base layer 10 formed of nonmagnetic material such as Ta. In FIGS. 1 and 2, an antiferromagnetic layer 11 is formed on the base layer 10, and a first pinned magnetic layer 12 is formed on the antiferromagnetic layer 11. Then, as shown in FIG. 1, a nonmagnetic intermediate layer 13 is formed on the first pinned magnetic layer 12, and further, a second pinned magnetic layer 14 is formed on the nonmagnetic intermediate layer 13.

The first pinned magnetic layer 12 and second pinned magnetic layer 14 are formed of, e.g., Co film, NiFe alloy, Co—NiFe alloy, Co—Fe alloy, or the like.

Also, with the present invention, it is preferable that the antiferromagnetic layer 11 be formed of a PtMn alloy. PtMn alloys have better corrosion-resistant properties than NiMn alloys or FeMn alloys conventionally used for antiferromagnetic layers, the blocking temperature is high, and a large exchange coupling magnetic field (exchange anisotropic magnetic field) can be obtained. Also, with the present invention, X—Mn alloys (wherein X is one or a plurality of the following elements: Pd, Ir, Rh, Ru, Os) or PtMn—X' alloys (wherein X', is one or a plurality of the following elements: Pd, Ir, Rh, Ru, Os, Au, Ag) may be used instead of PtMn alloys.

Now, the arrows shown in FIG. 1 for the first pinned magnetic layer 12 and second pinned magnetic layer 14 represent the magnitude and direction of the magnetic moment of each, the magnitude of the magnetic moment being determined by a value obtained by multiplying saturated magnetization (Ms) and film thickness (t).

The first pinned magnetic layer 12 and second pinned magnetic layer 14 shown in FIG. 1 are formed of the same material, Co film for example, and the thickness $t_{p2}$ of the second pinned magnetic layer 14 is formed so as to be greater than the thickness $t_{p1}$, of the first pinned magnetic layer 12, so the second pinned magnetic layer 14 has a greater magnetic moment that the first pinned magnetic layer 12. The present invention requires that first pinned magnetic layer 12 and the second pinned magnetic layer 14 have different magnetic moments, so alternatively the thickness $t_{P1}$ of the first pinned magnetic layer 12 may be formed so as to be greater than the thickness $t_{p2}$, of the second pinned magnetic layer 14.

As shown in FIG. 1, the first pinned magnetic layer 12 is magnetized in the Y direction in the Figure, i.e., in the direction away from the recording medium (the height direction), and the magnetization of the second pinned magnetic layer 14 which faces the first pinned magnetic layer 12 with the nonmagnetic intermediate layer 13 introduced therebetween is magnetized in a manner antiparallel to the first pinned magnetic layer 12.

The first pinned magnetic layer 12 is formed so as to come into contact with the antiferromagnetic layer 11, and annealing (thermal treatment) in a magnetic field causes an exchange coupling magnetic field (exchange anisotropic magnetic field) to be generated at the interface between the first pinned magnetic layer 12 and the antiferromagnetic layer 11, so that, as shown in FIG. 1, for example, the magnetization of the first pinned magnetic layer 12 is pinned in the Y direction in the Figure. Once the magnetization of the first pinned magnetic layer 12 is pinned in the Y direction in the Figure, the magnetization of the second pinned magnetic layer 14 which faces the first pinned magnetic layer 12 with the nonmagnetic intermediate layer 12 introduced therebetween is pinned in a manner antiparallel to the magnetization of the first pinned magnetic layer 12.

Optimally, in the present invention the thickness $t_{P1}$ of the first pinned magnetic layer 12 and the thickness $t_{P2}$ of the second pinned magnetic layer 14, and (the thickness $t_{P1}$ of the first pinned magnetic layer)/(the thickness $t_{P2}$ of the second pinned magnetic layer) preferably is in a range of 0.33 to 0.95, or in a range of 1.05 to 4.

A large exchange coupling magnetic field can be obtained within these ranges, but the exchange coupling magnetic field tends to decrease even in these ranges if the thickness of the first pinned magnetic layer 12 and the thickness of the second pinned magnetic layer 14 increases, so the present invention places the thickness of the first pinned magnetic layer 12 and the thickness of the second pinned magnetic layer 14 appropriately.

With the present invention, it is preferable that the film thickness $t_{P1}$ of the first pinned magnetic layer 12 and the film thickness $t_{P2}$ of the second pinned magnetic layer 14 be both in a range of 10 to 70 ångström, and that an absolute value obtained by subtracting the film thickness $t_{P2}$ of the second pinned magnetic layer 14 from the film thickness $t_{P1}$ of the first pinned magnetic layer 12 is equal to or greater than 2 ångström.

Adjusting the film thickness ratio and film thicknesses so as to be within the above ranges can yield an exchange coupling magnetic field (Hex) of at least 500 (Oe) or greater. Here, the term "exchange coupling magnetic field" describes the magnitude of an external magnetic field at the time that ΔMR (rate of resistance change) is half of the maximum ΔMR, and the exchange coupling magnetic field (Hex) is a total concept including the exchange coupling magnetic field (exchange anisotropic magnetic field) generated at the interface between the first pinned magnetic layer 12 and the antiferromagnetic layer 11, the exchange coupling magnetic field (RKKY interaction) generated between the first pinned magnetic layer 12 and second pinned magnetic layer 14.

Also, with the present invention, it is even more preferable that (the thickness $t_{p1}$ of the first pinned magnetic layer)/(the thickness $t_{p2}$ of the second pinned magnetic layer) be in a range of 0.53 to 0.95, or in a range of 1.05 to 1.8. Also, in the above ranges, it is preferable that the film thickness $t_{P1}$ of the first pinned magnetic layer 12 and the film thickness $t_{P2}$ of the second pinned magnetic layer 14 both be in a range of 10 to 50 ångström, and that an absolute value obtained by subtracting the film thickness $t_{P2}$ of the second pinned magnetic layer 14 from the film thickness $t_{P1}$ of the first pinned magnetic layer 12 is equal to or greater than 2 ångström. Adjusting the film thickness ratio of the first pinned magnetic layer 12 and the second pinned magnetic layer 14, and the film thickness $t_{P1}$ of the first pinned magnetic layer 12 and the film thickness $t_{P2}$ of the second pinned magnetic layer 14, so as to be within the above ranges, can yield an exchange coupling magnetic field of at least 1,000 (Oe) or greater.

By keeping the film thickness ratio and film thicknesses within the above ranges, the exchange coupling magnetic field (Hex) can be increased, and also, the ΔMR (rate of resistance change) can be raised to a level around the same as known arrangements.

The greater the exchange coupling magnetic field is, the greater the stability of the magnetization state of the first pinned magnetic layer 12 and the second pinned magnetic layer 14 in an antiparallel state is. Particularly, the present invention uses a PtMn alloy which exhibits high blocking temperature as an antiferromagnetic layer 11, and generates a large exchange coupling magnetic field (exchange anisotropic magnetic field) at the interface between the first pinned magnetic layer 12 and the antiferromagnetic layer 11, so the magnetization state of the first pinned magnetic layer 12 and the second pinned magnetic layer 14 can be maintained in a thermally stable manner, as well.

Now, if first pinned magnetic layer 12 and second pinned magnetic layer 14 are formed of the same material, and the first pinned magnetic layer 12 and second pinned magnetic layer 14 are formed at the same thickness, experimentation has shown that the exchange coupling magnetic field (Hex) and the ΔMR drops drastically.

It is supposed that this is due to the fact that, if the $Ms.T_{P1}$ (magnetic moment) of the first pinned magnetic layer 12 and the $Ms.T_{p2}$ (magnetic moment) of the second pinned magnetic layer 14 are the same value, an antiparallel state does not exist between the magnetization of the first pinned magnetic layer 12 and the magnetization of the second pinned magnetic layer 14, the amount of directional dispersion of the magnetization (the amount of magnetic moment directed in various directions) increases. Consequently, the relative angle with the magnetization of a later-described free magnetic layer 16 cannot be appropriately controlled.

In order to solve such problems, it is first necessary to make the first pinned magnetic layer 12 and the second pinned magnetic layer 14 have differing Ms.t values, i.e., it is necessary to change the thickness of the first pinned magnetic layer 12 and the second pinned magnetic layer 14 if the first pinned magnetic layer 12 and the second pinned magnetic layer 14 are to be formed of the same material.

As described above, the film thickness ratio between the first pinned magnetic layer 12 and the second pinned magnetic layer 14 is appropriate according to the present invention, so the range wherein the film thickness $t_{P1}$ of the first pinned magnetic layer 12 and the film thickness $t_{P2}$ of the second pinned magnetic layer 14 is approximately the same, specifically, the film thickness ratio range from 0.95 to 1.05, is excluded from the appropriate range.

Next, if an antiferromagnetic material such as a PtMn alloy is used for the antiferromagnetic layer 11 and is subjected to annealing (thermal treatment) in a magnetic field following formation, as with the present invention, so as to generate a large exchange coupling magnetic field (exchange anisotropic magnetic field) at the interface between the first pinned magnetic layer 12 and the antiferromagnetic layer 11, even if the first pinned magnetic layer 12 and the second pinned magnetic layer 14 are set to differing Ms·t values, the direction and magnitude of the magnetic field applied during the thermal treatment must be appropriately controlled, or the amount of directional dispersion of the magnetization of the first pinned magnetic layer 12 and the magnetization of second pinned magnetic layer 14 may increase, or the magnetization may not be able to be controlled in a desired direction.

TABLE 1

First pinned magnetic layer $Ms.t_{p1}$ > second pinned magnetic layer $Mst_{p2}$

| Magnetic direction during thermal treatment | (1) 100 to 1 kOe to the left | (2) 100 to 1 kOe to the right | (3) 5 kOe or greater to the right | (4) 5 kOe or greater to the left |
|---|---|---|---|---|
| Direction of first pinned magnetic layer | ← | → | → | ← |
| Direction of second pinned magnetic layer | → | ← | → | ← |

Table 1 shows how, if $Ms·t_{P1}$ of the first pinned magnetic layer 12 is greater than $Ms·t_{P2}$ of the second pinned magnetic layer 14, changing the magnitude and direction of the magnetic field during thermal treatment changes the direction of magnetization of the first pinned magnetic layer 12 and second pinned magnetic layer 14.

In (1) shown in Table 1, 100 (Oe) to 1 k(Oe) is applied toward the left in the Figure, as the direction of the magnetic field during thermal treatment. In this case, $Ms·t_{P1}$ of the first pinned magnetic layer 12 is greater than $Ms·t_{P2}$ of the second pinned magnetic layer 14, so the magnetization of the dominant first pinned magnetic layer 12 follows the direction of the applied magnetic field and turns toward the left in the Figure, and the magnetization of the second pinned magnetic layer 14 attempts to achieve an antiparallel state by the exchange coupling magnetic field (RKKY interaction) generated with the first pinned magnetic layer 12.

In (2) shown in Table 1, a magnetic field of 100 (Oe) to 1 k(Oe) is applied toward the right, so the magnetization of the dominant first pinned magnetic layer 12 follows the direction of the applied magnetic field and turns toward the right in the Figure, and the magnetization of the second pinned magnetic layer 14 achieves an antiparallel state with the magnetization of the first pinned magnetic layer 12.

In (3) shown in Table 1, a magnetic field of 5 k(Oe) or greater is applied toward the right, so the magnetization of the dominant first pinned magnetic layer 12 follows the direction of the applied magnetic field and turns toward the right. Now, the exchange coupling magnetic field (RKKY interaction) generated between the first pinned magnetic layer 12 and the second pinned magnetic layer 14 is about 1,000 (Oe) to 5 k(Oe), so if a magnetic field of 5 k(Oe) or greater is applied, the second pinned magnetic layer 14 also follows the direction of the applied magnetic field, i.e., turns toward the right in the Figure. In the same way, in (4) shown in Table 1, a magnetic field of 5 k(Oe) or greater is applied toward the left, so the magnetization of the first pinned magnetic layer 12 and the second pinned magnetic layer 14 turn toward the left in the Figure.

TABLE 2

First pinned magnetic layer $Ms\ t_{p1}$, < second pinned magnetic layer $Ms.t_{p2}$

| Magnetic direction during thermal treatment | (1) 100 to 1 kOe to the left | (2) 100 to 1 kOe to the right | (3) 5 kOe or greater to the right | (4) 5 kOe or greater to the left |
|---|---|---|---|---|
| Direction of first pinned magnetic layer | → | ← | → | ← |
| Direction of second pinned magnetic layer | ← | → | → | ← |

Table 2 shows how, if $Ms·t_{p1}$ of the first pinned magnetic layer 12 is smaller than $Ms·t_{p2}$ of the second pinned magnetic layer 14, changing the magnitude and direction of the magnetic field during thermal treatment changes the direction of magnetization of the first pinned magnetic layer 12 and second pinned magnetic layer 14.

In (1) shown in Table 2, a magnetic field of 100 (Oe) to 1 k(Oe) is applied toward the left in the Figure. In this case, the magnetization of the second pinned magnetic layer 14 with the greater $Ms·t_{p2}$ becomes dominant, so the magnetization of the second pinned magnetic layer 14 follows the direction of the applied magnetic field and turns toward the left in the Figure. The magnetization of the first pinned magnetic layer 12 achieves an antiparallel state with the magnetization of the second pinned magnetic layer 14 by the exchange coupling magnetic field (RKKY interaction) generated between the first pinned magnetic layer 12 and the second pinned magnetic layer 14. In the same way, in (2) shown in Table 2, a magnetic field of 100 (Oe) to 1 k(Oe) is applied toward the right, so the magnetization of the dominant second pinned magnetic layer 14 turns toward the right in the Figure, and the magnetization of the first pinned magnetic layer 12 turns to the left.

In (3) shown in Table 2, a magnetic field of 5 k(Oe) or greater is applied toward the right in the Figure, so the magnetization of both the first pinned magnetic layer 12 and second pinned magnetic layer 14 turn toward the right in the Figure, due to the application of a magnetic field greater than the exchange coupling magnetic field (RKKY interaction) generated between the first pinned magnetic layer 12 and the second pinned magnetic layer 14. In (4) shown in Table 2, a magnetic field of 5 k(Oe) or greater is applied toward the left in the Figure, so the magnetization of both the first pinned magnetic layer 12 and the second pinned magnetic layer 14 turn toward the left in the Figure.

Now, if magnetization of the first pinned magnetic layer 12 is to be directed toward the right direction in the Figure, for example, the appropriate direction and magnitude of the magnetic field for thermal treatment is (2) and (3) in Table 1, and (1) and (3) in Table 2.

With (2) and (3) in Table 1, the magnetization of the first pinned magnetic layer 12 which has a greater $Ms-t_{P1}$ is affected by the applied magnetic field in the right direction during thermal treatment, and turns to the right. At this time, the magnetization of the first pinned magnetic layer 12 is pinned in the right direction by the exchange coupling magnetic field (exchange anisotropic magnetic field) generated at the interface between the first pinned magnetic layer 12 and the antiferromagnetic layer 11 by thermal treatment. In (3) in Table 1, removing the magnetic field of 5 k(Oe) or greater causes the magnetization of the second pinned magnetic layer 14 to invert due to the exchange coupling magnetic field (RKKY interaction) generated between the first pinned magnetic layer 12 and the second pinned magnetic layer 14, and turn to the left.

In the same way, with (1) and (3) in Table 2, the magnetization of the first pinned magnetic layer 12 facing in the right direction is pinned in the right direction by the exchange coupling magnetic field (exchange anisotropic magnetic field) at the interface between the first pinned magnetic layer 12 and the antiferromagnetic layer 11. In (3) in Table 2, removing the magnetic field of 5 k(Oe) or greater causes the magnetization of the second pinned magnetic layer 14 to invert due to the exchange coupling magnetic field (RKKY interaction) generated between the first pinned magnetic layer 12 and the second pinned magnetic layer 14, and be pinned towards the left.

Now, as can be seen from Table 1 and Table 2, the magnitude of the magnetic field applied during thermal treatment is either 100 (Oe) to 1 k(Oe), or 5 k(Oe) or greater, with magnetic fields in the range of 1,000 (Oe) to 5 k(Oe) being excluded from the appropriate range. The reason is as follows.

When a magnetic field is applied, the magnetization of the pinned magnetic layer with a greater Ms t attempts to turn in the direction of that magnetic field. However, if the magnitude of the magnetic field is in the range of 1,000 (Oe) to 5 k(Oe) during thermal treatment, the magnetization of the pinned magnetic layer with a smaller Ms·t also is strongly affected by the magnetic field and attempts to turn in the direction of that magnetic field.

Accordingly, the magnetization of each of the two pinned magnetic layers which should attempt to achieve an antiparallel state due to the exchange coupling magnetic field (RKKY interaction) generated between the pinned magnetic layers are affected by the strong magnetic field and do not become antiparallel, the amount of so-called directional dispersion of the magnetization wherein the magnetic moment is directed in various directions increases and consequently the magnetization of each of the two pinned magnetic layers cannot be appropriately magnetized in an antiparallel state. Accordingly, magnetic fields in the range of 1,000 (Oe) to 5 k(Oe) are excluded from the appropriate range in the present invention. The reason that the magnitude of the magnetic field during thermal treatment is set at 100 (Oe) or greater is that a magnetic field any weaker is not capable of directing the magnetization of the pinned magnetic layer with a large Ms t in the direction of that magnetic field.

The above-described method of controlling the magnitude and direction of the magnetic field during thermal treatment can be used for any sort of antiferromagnetic material as long as this is for an antiferromagnetic layer 11 which requires thermal treatment, and is also applicable to cases using an NiMn alloy, which is conventionally used for the antiferromagnetic layer 11.

In this way, the present invention is capable of increasing the exchange coupling magnetic field (Hex) by keeping the film thickness ratio of the first pinned magnetic layer 12 and the second pinned magnetic layer 14 within an appropriate range. The present invention is also capable of maintaining the magnetization of the first pinned magnetic layer 12 and second pinned magnetic layer 14 in a thermally stable antiparallel state (Ferri-state), and further enables ΔMR (rate of resistance change) to be maintained at a level around the same as that of known arrangements.

Further, appropriately controlling the magnitude and direction of the magnetic field during thermal treatment enables the magnetization direction of the first pinned magnetic layer 12 and the second pinned magnetic layer 14 to be controlled in a desired direction.

Now, the magnetic moment (magnetic film thickness) such as described earlier can be calculated as the product of the saturation magnetization Ms and film thickness t. For example, it is known that with bulk solid NiFe, the saturation magnetization Ms is approximately 1.0 T (tesla), and that with bulk solid Co, the saturation magnetization Ms is approximately 1.7 T. Accordingly, if the film thickness of the aforementioned NiFe is 30 ångström, the magnetic film thickness of the NiFe film is 30 ångström tesla. The magnetostatic energy of a ferromagnetic film when a magnetic field is externally applied is proportionate to the magnetic film thickness and external magnetic field multiplied, so if a ferromagnetic film with a large magnetic film thickness and a ferromagnetic film with a small magnetic film thickness are in a Ferri-state by RKKY interaction with a nonmagnetic intermediate layer introduced therebetween, the ferromagnetic film with the greater magnetic film thickness tends to be directed in the direction of the external magnetic field.

However, it is known that if the ferromagnetic film is in layered contact with nonmagnetic film such as tantalum (Ta), ruthenium (Ru), copper (CU), etc., or if the ferromagnetic film is in layered contact with an antiferromagnetic layer (such as a PtMn film or the like), the saturation magnetization Ms of the ferromagnetic film near the interface with the nonmagnetic film or antiferromagnetic film becomes smaller than the saturation magnetization Ms of the bulk solid, since the nonmagnetic film atoms or antiferromagnetic film atoms are in direct contact with the ferromagnetic film atoms (Ni, Fe, Co). Further, it is known that if thermal treatment is performed on multi-layered film of ferromagnetic film and nonmagnetic film, antiferromagnetic layers, interface dispersion advances due to the thermal treatment, and distribution in the thickness direction of the film appears in the saturation magnetization Ms of the ferromagnetic film. That is to say, this is the phenomena wherein the saturation magnetization Ms is small at areas near nonmagnetic film or antiferromagnetic layers, but the saturation magnetization Ms nears the saturation magnetization Ms of the bulk solid as the position draws away from the interface with the nonmagnetic film or antiferromagnetic film.

Reduction in the saturation magnetization Ms of the ferromagnetic film at areas near nonmagnetic film or antiferromagnetic film depends on the material for the nonmagnetic film, the material for the antiferromagnetic film, order of layering, thermal treating temperature, etc., and each must be accurately obtained under certain conditions. The magnetic film thickness according to the present invention is a value which has been calculated, taking into consideration the amount of reduction of the saturation magnetization Ms generated by thermal dispersion with the nonmagnetic film or antiferromagnetic layers.

In order to obtain an exchange coupling magnetic field at the interface between the PtMn film and ferromagnetic film due to thermal treatment, a dispersion layer must be formed at the interface between the PtMn film and ferromagnetic film, but the reduction of the saturation magnetization Ms of the ferromagnetic film at the time of forming the dispersion layer depends on the order of layering the PtMn film and ferromagnetic film.

Particularly, as shown in FIG. 1, if the antiferromagnetic layer 11 is situated lower than the free magnetic layer 16, a thermal dispersion layer easily occurs at the interface of the antiferromagnetic layer 11 and the first pinned magnetic layer 12. Accordingly, the magnetic film thickness of the first pinned magnetic layer 12 is smaller than the actual film thickness $t_{P1}$. However, if the magnetic film thickness of the first pinned magnetic layer 12 becomes too small, the difference in magnetic film thickness (magnetic moment) with the second pinned magnetic layer 14 becomes too large, and the ratio of thermal dispersion layer in the first pinned magnetic layer 12 becomes too large, leading to a problematic deterioration of the exchange coupling magnetic field.

That is, as with the case of the present invention, in order to use an antiferromagnetic layer 11 which requires thermal treatment to generate an exchange coupling magnetic field at the interface with the first pinned magnetic layer 12, to create a Ferri-state in the magnetization state between the first pinned magnetic layer 12 and second pinned magnetic layer 14, the magnetic film thickness of the first pinned magnetic layer 12 and second pinned magnetic layer 14 must be optimized, in addition to optimizing the film thickness of the first pinned magnetic layer 12 and second pinned magnetic layer 14. Otherwise, a stable magnetization state cannot be obtained.

As described above, unless there is a certain degree of difference in magnetic film thickness between the first pinned magnetic layer 12 and second pinned magnetic layer 14, the magnetization state does not easily achieve a Ferri-state. On the other hand, if the difference in magnetic film thickness between the first pinned magnetic layer 12 and second pinned magnetic layer 14 is too large, undesirable deterioration in the exchange coupling magnetic field results. Accordingly, with the present invention, as with the film thickness of the first pinned magnetic layer 12 and second pinned magnetic layer 14, it is preferable that (the magnetic film thickness of the first pinned magnetic layer 12)/(the magnetic film thickness of the second pinned magnetic layer 14) be in a range of 0.33 to 0.95, or in a range of 1.05 to 4. Also, with the present invention, it is preferable that the magnetic film thickness of the first pinned magnetic layer 12 and the magnetic film thickness of the second pinned magnetic layer 14 be in a range of 10 to 70 (ängstrom tesla), and that an absolute value obtained by subtracting the magnetic film thickness of the second pinned magnetic layer 14 from the magnetic film thickness of the first pinned magnetic layer 12 is equal to or greater than 2 (ängström tesla).

It is even more preferable that (the magnetic film thickness of the first pinned magnetic layer 12)/(the magnetic film thickness of the second pinned magnetic layer 14) be in a range of 0.53 to 0.95 or in a range of 1.05 to 1.8. Also, in the above ranges, it is preferable that the magnetic film thickness of the first pinned magnetic layer 12 and the magnetic film thickness of the second pinned magnetic layer 14 be in a range of 10 to 50 (ängström tesla), and that an absolute value obtained by subtracting the film thickness of the second pinned magnetic layer 14 from the film thickness of the first pinned magnetic layer 12 is equal to or greater than 2 (ängström tesla).

Next, the nonmagnetic intermediate layer 13 introduced between the first pinned magnetic layer 12 and the second pinned magnetic layer 14 in FIG. 1 will be described.

With the present invention, the nonmagnetic intermediate layer 13 introduced between the first pinned magnetic layer 12 and the second pinned magnetic layer 14 is preferably formed of one of the following; or of an alloy of two or more thereof: Ru, Rh, Ir, Cr, Re, and Cu.

In the present invention, the appropriate film thickness value of the nonmagnetic intermediate layer 13 is changed according to whether the antiferromagnetic layer 11 is formed below or above a later-described free magnetic layer 16.

As shown in FIG. 1, the film thickness value of the nonmagnetic intermediate layer 13 if the antiferromagnetic layer 11 is formed below the free magnetic layer 16 is preferably in the range of 3.6 to 9.6 ängström. Within this range, an exchange coupling magnetic field (Hex) of 500 (Oe) or greater can be obtained.

It is further preferable that the film thickness value of the nonmagnetic intermediate layer 13 be in the range of 4 to 9.4 ängström, since an exchange coupling magnetic field of 1,000 (Oe) or greater can be obtained.

Experimentation has shown that the exchange coupling magnetic field drastically drops if the nonmagnetic intermediate layer 13 is formed to a thickness other than the above-described dimensions. That is to say, if the nonmagnetic intermediate layer 13 is formed to a thickness other than that described above, the magnetization of the first pinned magnetic layer 12 and the second pinned magnetic layer 14 does not easily achieve an antiparallel state (Ferri-state), so there is the problem of instability in the magnetization state.

As shown in FIG. 1, a nonmagnetic electrically conductive layer 15 of Cu or the like is formed on the second pinned magnetic layer 14, and further, a free magnetic layer 16 is formed on the nonmagnetic electrically conductive layer 15.

As shown in FIG. 1, the free magnetic layer 16 is comprised of two layers, and the layer denoted by the reference numeral 17 that is formed to the side which comes into contact with the nonmagnetic electrically conductive layer 15 is comprised of a Co film. The other layer 18 is comprised of an NiFe alloy, Co—Fe alloy, Co—Ni alloy, Co—NiFe alloy, or the like. The reason that the Co film layer 17 is formed to the side which comes into contact with the nonmagnetic electrically conductive layer 15, is that dispersion of metal elements and the like at the interface between the Co film layer 17 and the nonmagnetic electrically conductive layer 15 formed of Cu can be prevented, and the ΔMR (rate of resistance change) can be raised. Reference numeral 19 denotes a protective layer formed of Ta or the like. As shown in FIG. 2, hard magnetic bias layers 130 formed of a Co—Pt alloy, Co—Cr—Pt alloy, or the like, and electrically conductive layers 131 formed of Cu and Cr, are formed on either side of the layered structure from the base layer 10 to the protective layer 19, and the magnetization of the free magnetic layer 16 is affected by the bias magnetic field of the hard magnetic bias layer and is thus magnetized in the direction X in the Figure.

With the spin-valve magnetoresistive thin film element shown in FIG. 1, sensing current is provided from the above electrically conductive layer to the free magnetic layer 16, nonmagnetic electrically conductive layer 15, and second pinned magnetic layer 14. If a magnetic field is provided from the recording medium in the direction Y shown in FIG. 1, the magnetization of the free magnetic layer 16 changes from the direction X in the Figure to the direction Y in the Figure, and scattering of conduction electrons dependent on spinning occurs at the interface between the nonmagnetic electrically conductive layer 15 and free magnetic layer 16, and at the interface between the nonmagnetic electrically conductive layer 15 and the second pinned magnetic layer 14, whereby electric resistance changes, and consequently the leakage magnetic field of the recording medium is detected.

Now, this sensing current also flows to the interface between the first pinned magnetic layer 12 and nonmagnetic intermediate layer 13, and so forth. The first pinned magnetic layer 12 does not directly contribute to ΔMR, so the first pinned magnetic layer 12 has a supplementary role of pinning the second pinned magnetic layer 14, which contributes to ΔMR, in an appropriate direction. Accordingly, the sensing current flowing to the first pinned magnetic layer 12 and nonmagnetic intermediate layer 13 results in shunt loss (current loss), but the amount of this shunt loss is very small, and the present invention can obtain ΔMR of around the same as known arrangements.

Now, experimentation has shown that, with the present invention, dividing the first pinned magnetic layer 12 and second pinned magnetic layer 14 with the nonmagnetic intermediate layer 13 introduced therebetween a large exchange coupling magnetic field (Hex) can be obtained even if the thickness of the antiferromagnetic layer 11 is reduced, specifically, 500 (Oe) or greater can be obtained.

With known arrangements, if a PtMn alloy is used in a single spin-valve magnetoresistive thin film element as the antiferromagnetic layer 11, a thickness of at least 200 ångström or greater has to be secured in order to obtain an exchange coupling magnetic field of 500 (Oe) or greater. However, with the present invention, a thickness of at least 90 ångström or greater for the antiferromagnetic layer 11 can obtain an exchange coupling magnetic field of 500 (Oe) or greater. Further, a thickness of at least 100 ångström or greater can obtain an exchange coupling magnetic field of 1,000 (Oe) or greater. Now, these values for the antiferromagnetic layer 11 are for a single spin-valve magnetoresistive thin film element, and the appropriate film thickness ranges differ somewhat for so-called dual spin-valve magnetoresistive thin film elements wherein antiferromagnetic layers are formed above and below the free magnetic layer. Dual spin-valve magnetoresistive thin film elements will be described later.

Thus, according to the present invention, the antiferromagnetic layer 11 which is the largest layer in a spin-valve magnetoresistive thin film element can be formed at half or less of the thickness required in known arrangements, thereby enabling reduction of the overall thickness of the spin-valve magnetoresistive thin film element.

Figure 13:
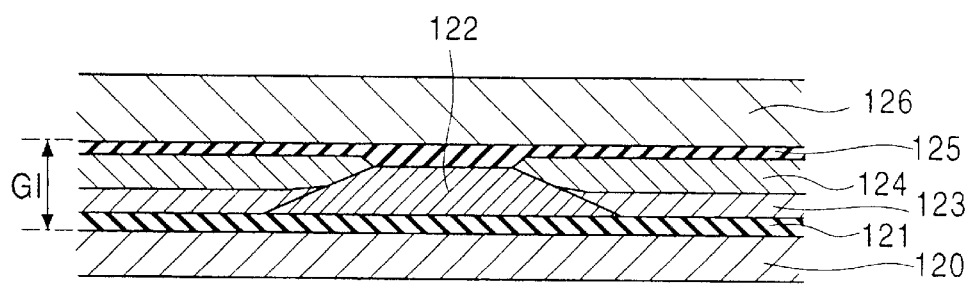
FIG. 13 is a cross-sectional view of a recording head (reproducing head), viewed from the side facing the recording medium.

FIG. 13 is a cross-sectional view of a the structure of a reading head on which a spin-valve magnetoresistive thin film element is formed, viewed from the side facing the recording medium.

Reference numeral 120 denotes a lower shield layer formed of an NiFe alloy, for example, and a lower gap layer 121 is formed on the lower shield layer 120. Also, a spin-valve magnetoresistive thin film element 122 according to the present invention is formed on the lower gap layer 121, and hard magnetic bias layers 123 and electrically conductive layers 124 are formed on either side of the spin-valve magnetoresistive thin film element 122. An upper gap layer 125 is formed on the electrically conductive layers 124, and an upper shield layer 126 formed of an NiFe alloy or the like is formed on the upper gap layer 125.

The lower gap layer 121 and upper gap layer 125 are formed of an insulating material such as $SiO_2$ or $Al_2O_3$ (alumina). As shown in FIG. 13, the length from the lower gap layer 121 to the upper gap layer 125 is represented by G1, and the smaller this G1 is the higher the recording density that can be handled is.

As described above, the present invention enables reduction of the overall thickness of the spin-valve magnetoresistive thin film element 122 by reducing the thickness of the antiferromagnetic layer 11, so the gap length G1 can be reduced. Further, even if the lower gap layer 121 and the upper gap layer 125 are made to be relatively thick, the gap length G1 can be made relatively small; forming the lower gap-layer 121 and the upper gap layer 125 relatively thick secures sufficient insulation.

The spin-valve magnetoresistive thin film element shown in FIG. 1 is formed by layering the following layers in order from the bottom up: the base layer 10, antiferromagnetic layer 11, first pinned magnetic layer 12, nonmagnetic intermediate layer 13, second pinned magnetic layer 14, nonmagnetic electrically conductive layer 15, free magnetic layer 16, and protective layer 19, following which a process of annealing (thermal treatment) is performed in a magnetic field.

With the spin-valve magnetoresistive thin film element shown in FIG. 1, the thickness $t_{P1}$, of the first pinned magnetic layer 12 is formed so as to be thinner than the thickness $t_{P2}$ of the second pinned magnetic layer 14, and the magnetic moment (Ms $t_{P1}$) of the first pinned magnetc layer 12 is set so as to be smaller than the magnetic moment (Ms·$t_{P2}$) of the second pinned magnetic layer 14.

In this case, a magnetic field of 100 to 1000 (Oe) is applied in the direction opposite to the direction in which the magnetization of the second pinned magnetic layer 14 is to be directed, or a magnetic field of 5 k(Oe) or greater is applied in the direction in which the magnetization of the second pinned magnetic layer 14 is to be directed.

As shown in FIG. 1, if the magnetization of the first pinned magnetic layer 12 is to be pinned in the direction Y shown in the Figure, referring to the above Table 2 will show that either a magnetic field of 100 (Oe) to 1 k(Oe) (See Table 2 (1)) should be applied in the direction opposite to the direction Y in the Figure, or a magnetic field of 5 k(Oe) or greater should be applied in the direction Y (See Table 2 (3)).

Applying a magnetic field of 100 (Oe) to 1 k(Oe) in the direction opposite to the direction Y magnetizes the second pinned magnetic layer 14 which has greater magnetic moment (Ms $t_{P2}$) in the direction opposite to the direction Y, the magnetization of the first pinned magnetic layer 12 which is magnetized in an antiparallel manner due to the exchange coupling magnetic field (RKKY interaction) generated between the first pinned magnetic layer 12 and the second pinned magnetic layer 14 is directed in the direction Y in the FIG. 1, and the magnetization of the first pinned magnetic layer 12 is pinned in the direction Y in the Figure due to the exchange coupling magnetic field (exchange anisotropic magnetic field) generated at the interface between the first pinned magnetic layer 12 and the antiferromagnetic layer 11.

As a result of the magnetization of the first pinned magnetic layer 12 being pinned in the direction Y in the Figure, magnetization of the second pinned magnetic layer 14 is pinned in an antiparallel manner with the magnetization of the first pinned magnetic layer 12.

Alternatively, applying a magnetic field of 5 k(Oe) or greater in the direction Y magnetizes both the first pinned magnetic layer 12 and second pinned magnetic layer 14 in the direction Y in the Figure, and the magnetization of the first pinned magnetic layer 12 is pinned in the direction Y in the Figure due to the exchange coupling magnetic field (exchange anisotropic magnetic field) generated at the interface between the first pinned magnetic layer 12 and the antiferromagnetic layer 11. Removing the magnetic field of 5 k(Oe) or greater causes the magnetization of the second pinned magnetic layer 14 to be inverted due to the exchange coupling magnetic field (RKKY interaction) generated between the first pinned magnetic layer 12 and the second pinned magnetic layer 14, and thus be pinned in the direction opposite to the direction Y in the Figure.

Alternatively, if the magnetic moment of the first pinned magnetic layer 12 is greater than the magnetic moment of the second pinned magnetic layer 14, a magnetic field of 100 (Oe) to 1,000 (Oe) or a magnetic field of 5 k(Oe) or greater is applied in the direction which the magnetization of the first pinned magnetic layer 12 is to be directed.

Now, the spin-valve magnetoresistive thin film element shown in FIG. 1 is the most important part comprising the reproducing head (magnetoresistive thin film head). First, a gap layer is formed on the lower shield layer of magnetic material, following which the spin-valve magnetoresistive thin film element is formed. Subsequently, forming an upper shield layer on the spin-valve magnetoresistive thin film element with a gap layer introduced therebetween completes the reproducing head (MR head). Further, a recording inductive head having a core formed of magnetic material and a coil, may be provided thereupon. In this case, the above upper shield layer is preferably used to serve as the lower core layer of the inductive head. Shield layers are formed above and below the spin-valve magnetoresistive thin film elements shown in FIG. 3 and the subsequent drawings, as with the spin-valve magnetoresistive thin film element shown in FIG. 1.

Figure 3:
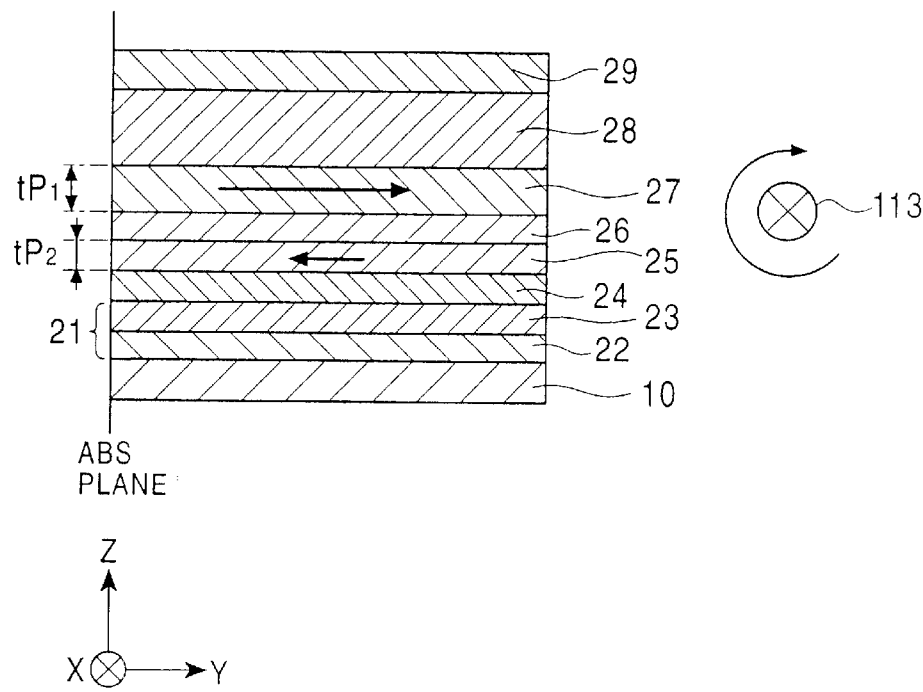
FIG. 3 is a side cross-sectional view of a spin-valve magnetoresistive thin film element according to a second embodiment of the present invention.
Figure 4:
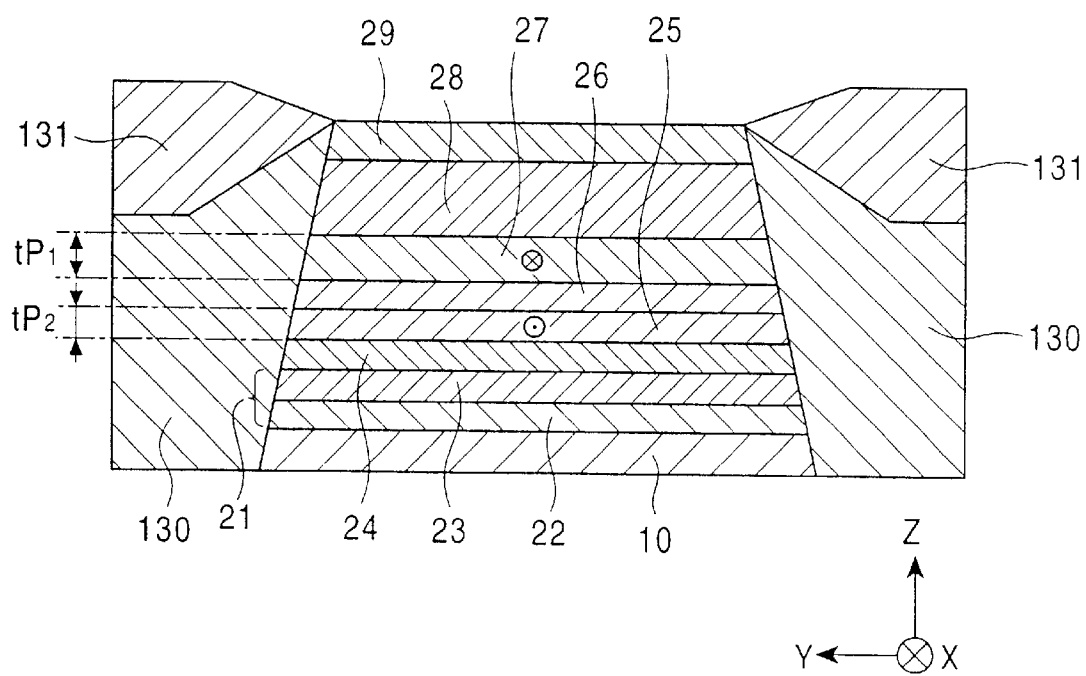
FIG. 4 is a cross-sectional view of the spin-valve magnetoresistive thin film element shown in FIG. 3, viewed from the side facing the recording medium.

FIG. 3 is a side cross-sectional view schematically showing the structure of a spin-valve magnetoresistive thin film element according to a second embodiment of the present invention, and FIG. 4 is a cross-sectional view of the spin valve magnetoresistive thin film element shown in FIG. 3, viewed from the side facing the recording medium.

This spin-valve magnetoresistive thin film element is a single spin-valve magnetoresistive thin film element which has been formed by reversing the order of layers of the spin-valve magnetoresistive thin film element shown in FIG. 1.

That is, the spin-valve magnetoresistive thin film element shown in FIG. 3 comprises from the bottom: A base layer 10, NiFe film 22, Co film 23 (the NiFe film 22 and Co film 23 together comprising a free magnetic layer 21), nonmagnetic electrically conductive layer 24, second pinned magnetic layer 25, nonmagnetic intermediate layer 26, first pinned magnetic layer 27, antiferromagnetic layer 28, and protective layer 29, in that order.

It is preferable that the antiferromagnetic layer 28 be formed of a PtMn alloy, but X—Mn alloys (wherein x is one or a plurality of the following elements: Pd, Ir, Rh, Ru, Os) or PtAn—X alloys (wherein X is one or a plurality of the following elements: Pd, Ir, Rh, Ru, Os, Au, Ag) may be used instead of PtMn alloys.

With this spin-valve magnetoresistive thin film element as well, it is preferable that the film thickness ratio between the film thickness $t_{P1}$ of the first pinned magnetic layer 27 and the film thickness $t_{P2}$ of the second pinned magnetic layer 25 be such wherein (film thickness $t_{P1}$ of first pinned magnetic layer)/(film thickness $t_{P2}$ of second pinned magnetic layer) is in a range of 0.33 to 0.95, or in a range of 1.05 to 4, and even more preferably, in a range of 0.53 to 0.95 or 1.05 to 1.8. Also, it is preferable that the film thickness $t_{p1}$, of the first pinned magnetic layer 27 and the film thickness $t_{P2}$ of the second pinned magnetic layer 25 be in a range of 10 to 70 ångström, and that an absolute value obtained by subtracting the film thickness $t_{P2}$ of the second pinned magnetic layer 25 from the film thickness $t_{P1}$ of the first pinned magnetic layer 27 is equal to or greater than 2 ångström. Even more preferable is an arrangement wherein the film thickness $t_{P1}$ of the first pinned magnetic layer 27 and the film thickness $t_{P2}$ of the second pinned magnetic layer 25 is in a range of 10 to 50 ångström, and that the absolute value obtained by subtracting the film thickness $t_{P2}$ of the second pinned magnetic layer 25 from the film thickness $t_{P1}$ of the first pinned magnetic layer 27 is equal to or greater than 2 ångström.

As described above, unless there is a certain degree of difference in magnetic film thickness between the first pinned magnetic layer 27 and second pinned magnetic layer 25, the magnetization state does not easily achieve a Ferri-state; on the other hand, if the difference in magnetic film thickness between the first pinned magnetic layer 27 and second pinned magnetic layer 25 is too large, this leads to undesirable deterioration in the exchange coupling magnetic field. Accordingly, with the present invention, as with the film thickness ratio of the first pinned magnetic layer 27 and second pinned magnetic layer 25, it is preferable that (the magnetic film thickness Ms $t_{P1}$, of the first pinned magnetic layer 27)/(the magnetic film thickness Ms $t_{P2}$ of the second pinned magnetic layer 25) be in a range of 0.33 to 0.95, or in a range of 1.05 to 4.

Also, with the present invention, it is preferable that the magnetic film thickness Ms $t_{P1}$ of the first pinned magnetic layer 27 and the magnetic film thickness Ms·$t_{P2}$ of the second pinned magnetic layer 25 be in a range of 10 to 70 (ångström tesla), and that an absolute value obtained by subtracting the magnetic film thickness $Ms \cdot t_{P2}$ of the second pinned magnetic layer 25 from the magnetic film thickness $Ms \cdot t_{P1}$ of the first pinned magnetic layer 27 is equal to or greater than 2 (ångström tesla).

It is even more preferable that (the magnetic film thickness $Ms \cdot t_{P1}$ of the first pinned magnetic layer 27)/(the magnetic film thickness $Ms \cdot t_{P2}$ of the second pinned magnetic layer 25) be in a range of 0.53 to 0.95 or in a range of 1.05 to 1.8. Also, in the above ranges, it is preferable that the magnetic film thickness $Ms \cdot t_{P1}$ of the first pinned magnetic layer 27 and the magnetic film thickness $Ms \cdot t_{P2}$ of the second pinned magnetic layer 25 be in a range of 10 to 50 (ångström tesla), and that an absolute value obtained by subtracting the magnetic film thickness $Ms \cdot t_{P2}$ of the second pinned magnetic layer 25 from the magnetic film thickness $Ms \cdot t_{P1}$ of the first pinned magnetic layer 27 be equal to or greater than 2 (ångström tesla).

The nonmagnetic intermediate layer 26 introduced between the first pinned magnetic layer 27 and the second pinned magnetic layer 25 shown in FIG. 3 is preferably formed of one of the following; or of an alloy of two or more thereof: Ru, Rh, Ir, Cr, Re, and Cu.

With the present invention, as shown in FIG. 3, the film thickness value of the nonmagnetic intermediate layer 26 if the antiferromagnetic layer 28 is formed above the free magnetic layer 21 is preferably in the range of 2.5 to 6.4 ångström, or 6.6 to 10.7 ångström. Within this range, an exchange coupling magnetic field (Hex) of 500 (Oe) or greater can be obtained.

It is further preferable that the film thickness value of the nonmagnetic intermediate layer 26 be in the range of 2.8 to 6.2 ångström, or 6.8 to 10.3 ångström. Within this range, an exchange coupling magnetic field (Hex) of at least 1,000 (Oe) or greater can be obtained.

Also, a thickness of at least 90 ångström or greater for the antiferromagnetic layer 28 can obtain an exchange coupling magnetic field of 500 (Oe) or greater. Further, a thickness of at least 100 ångström or greater can obtain an exchange coupling magnetic field of 1,000 (Oe) or greater.

With the spin-valve magnetoresistive thin film element shown in FIG. 3, the film thickness $t_{P1}$ of the first pinned magnetic layer 27 is formed so as to have a different value to the film thickness $t_{p2}$ of the second pinned magnetic layer 25, with the film thickness $t_{P1}$ of the first pinned magnetic layer 27 being thicker the film thickness $t_{p2}$ of the second pinned magnetic layer 25, for example. Also, the magnetization of the first pinned magnetic layer 27 is magnetized in the direction Y in the Figure, while the magnetization of the secondpinned magnetic layer 25 is magnetized in the opposite direction to Y in the Figure, so the magnetization of the first pinned magnetic layer 27 and of the second pinned magnetic layer 25 are in a Ferri-state. The method for controlling the magnetization direction for the first pinned magnetic layer 27 and second pinned magnetic layer 25 shown in FIG. 3 will now be described.

First, each of the layers shown in FIG. 3 are formed by sputtering or the like, and subjected to annealing (thermal treatment) in a magnetic field in the process following forming of the films.

If the $Ms \cdot t_{P1}$ (magnetic moment) of the first pinned magnetic layer 27 is greater than the $MS \cdot t_{P2}$ (magnetic moment) of the second pinned magnetic layer 25, a magnetic field of 100 (Oe) to 1 k(Oe) or 5 k(Oe) should be applied in the direction which the magnetization of the first pinned magnetic layer 27 is to be directed.

As shown in FIG. 3, if the first pinned magnetic layer 27 with a greater $Ms \cdot t_{P1}$ is to be directed in the direction Y in the Figure, referring to the above Table 1 shows that a magnetic field of 100 (Oe) to 1 k(Oe) (see Table 1 (2)) or 5 k(Oe) (see Table 1 (3))should be applied in the direction Y.

Applying the magnetic field of 100 (Oe) to 1 k(Oe) in the direction Y in the Figure causes the magnetization of the first pinned magnetic layer 27 with the greater $Ms \cdot t_{P1}$ to be directed in the direction Y, and the magnetization of the second pinned magnetic layer 25 attempts to achieve an antiparallel state. Then, the magnetization of the first pinned magnetic layer 27 is pinned in the direction Y in the Figure due to the exchange coupling magnetic field (exchange anisotropic magnetic field) generated at the interface between the first pinned magnetic layer 27 and the antiferromagnetic layer 28, and consequently, the magnetization of the second pinned magnetic layer 25 is pinned in a direction opposite to the direction Y.

Or, applying a magnetic field of 5 k(Oe) or greater in the direction Y in the Figure magnetizes the magnetization of both the first pinned magnetic layer 27 and second pinned magnetic layer 25 in the direction Y in the Figure, due to a magnetic field greater than the exchange coupling magnetic field (RKKY interaction) generated between the first pinned magnetic layer 27 and the second pinned magnetic layer 25 being applied. The magnetization of the first pinned magnetic layer 27 is pinned in the direction Y in the Figure due to the exchange coupling magnetic field (exchange anisotropic magnetic field) generated at the interface between the first pinned magnetic layer 27 and the antiferromagnetic layer 28. On the other hand, removing the applied magnetic field causes the magnetization of the second pinned magnetic layer 25 to be inverted due to the exchange coupling magnetic field (RKKY interaction) generated between the first pinned magnetic layer 27 and the second pinned magnetic layer 25, and thus be pinned in a state antiparallel with the magnetization of the first pinned magnetic layer 27.

Alternatively, if the magnetic moment of the first pinned magnetic layer 27 is smaller than the magnetic moment of the second pinned magnetic layer 25, a magnetic field of 100 (Oe) to 1,000 (Oe) is applied in the direction opposite to the direction in which the magnetization of the first pinned magnetic layer 27 is to be directed, or a magnetic field of 5 k(Oe) or greater is applied in the direction in which the magnetization is to be directed.

As shown in FIG. 4, hard magnetic bias layers 130 and electrically conductive layers 131 are formed on either side of the layered structure from the base layer 10 to the protective layer 29, and the magnetization of the free magnetic layer 21 is affected by the bias magnetic field of the hard magnetic bias layer 130 magnetized in the direction X in the Figure, and thereby aligned in the direction X.

Figure 5:
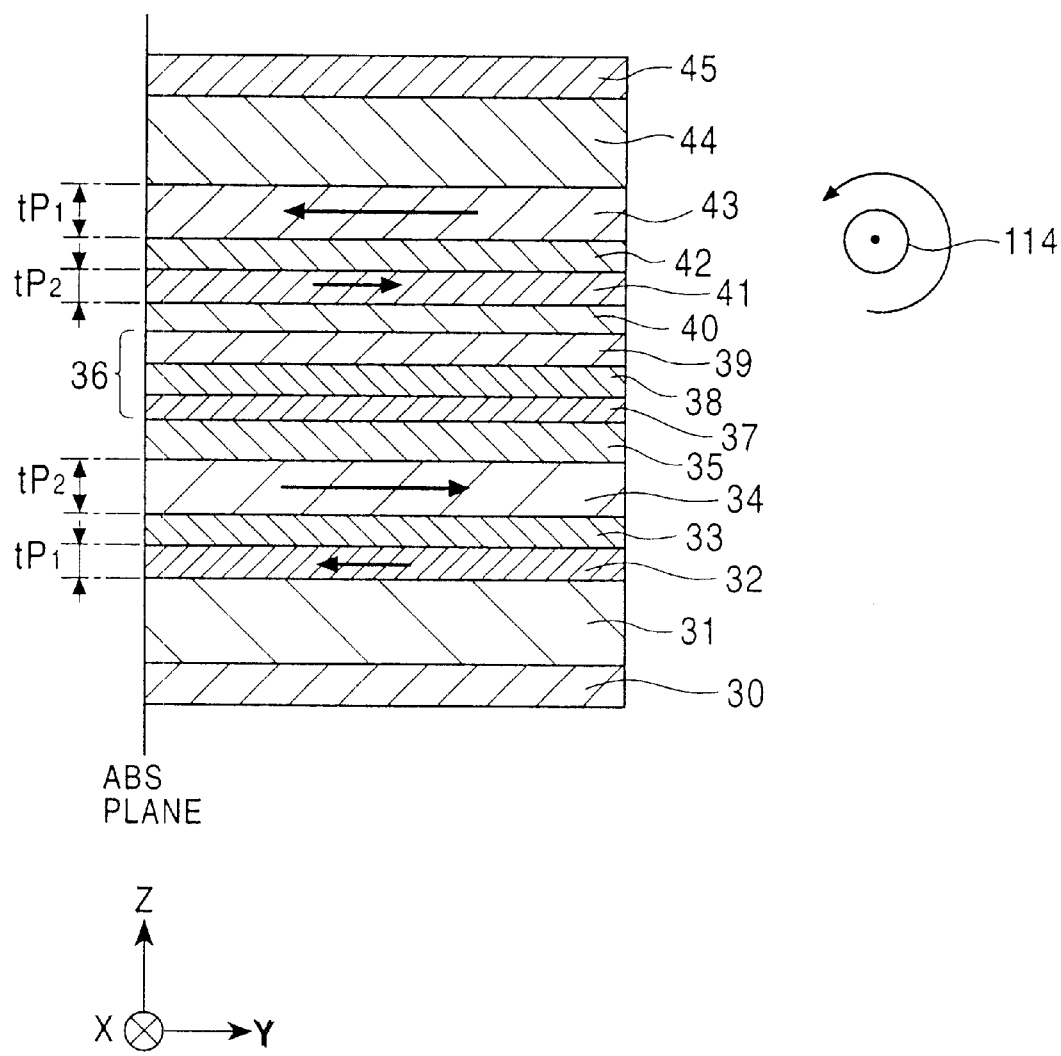
FIG. 5 is a side cross-sectional view of a spin-valve magnetoresistive thin film element according to a third embodiment of the present invention.
Figure 6:
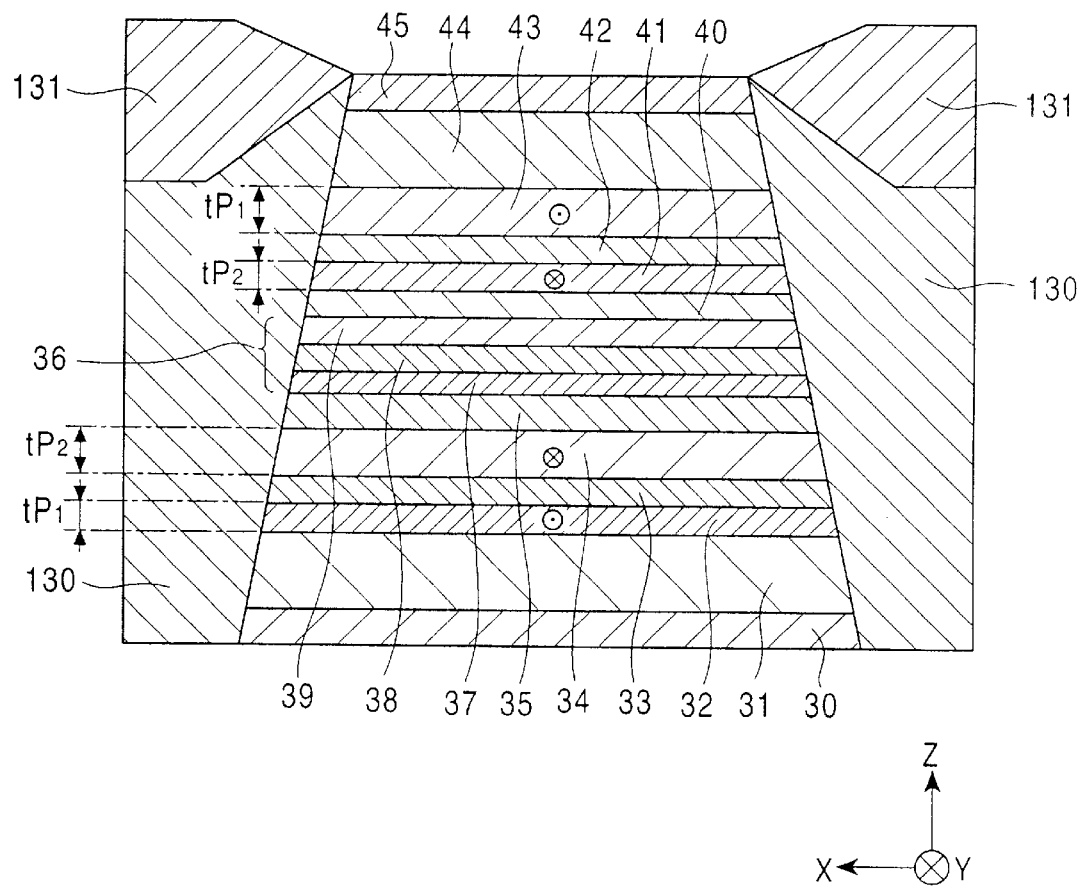
FIG. 6 is a cross-sectional view of the spin-valve magnetoresistive thin film element shown in FIG. 5, viewed from the side facing the recording medium.

FIG. 5 is a side cross-sectional view schematically showing the structure of a spin-valve magnetoresistive thin film element according to a third embodiment of the present invention, and FIG. 6 is a cross-sectional view of the spin-valve magnetoresistive thin film element shown in FIG. 5, viewed from the side facing the recording medium.

This spin-valve magnetoresistive thin film element is a so-called dual spin-valve magnetoresistive thin film element comprising one each of nonmagnetic electrically conductive layers, pinned magnetic layers, and antiferromagnetic layers formed above and below a free magnetic layer as the center thereof. With this dual spin-valve magnetoresistive thin film element, there are two sets of the three layers of free magnetic layer/nonmagnetic electrically conductive layer/ pinned magnetic layer, so a large ΔMR can be expected as compared to single spin-valve magnetoresistive thin film elements, and thus is capable of dealing with high-density recording.

The spin-valve magnetoresistive thin film element shown in FIG. 5 is formed by layering the following layers in order from the bottom up: the base layer 30, antiferromagnetic layer 31, first pinned magnetic layer (lower) 32, nonmagnetic intermediate layer (lower) 33, second pinned magnetic layer (lower) 34, nonmagnetic electrically conductive layer 35, free magnetic layer 36 (reference numerals 37 and 39 denoting Co films, and reference numeral 38 denoting an NiFe alloy film), nonmagnetic electrically conductive layer 40, second pinned magnetic layer (upper) 41, nonmagnetic intermediate layer (upper) 42, first pinned magnetic layer (upper) 43, antiferromagnetic layer 44, and protective layer 45. As shown in FIG. 6, hard magnetic bias layers 130 and electrically conductive layers 131 are formed on either side of the layered structure from the base layer 30 to the protective layer 45.

It is preferable that the antiferromagnetic layers 31 and 44 of the spin-valve magnetoresistive thin film element shown in FIG. 5 be formed of a PtMn alloy, but X—Mn alloys (wherein x is one or a plurality of the following elements: Pd, Ir, Rh, Ru, Os) or PtMn—X alloys (wherein X' is one or a plurality of the following elements: Pd, Ir, Rh, Ru, Os, Au, Ag) may be used instead of PtMn alloys.

With this spin-valve magnetoresistive thin film element as well, it is preferable that the film thickness ratio between the film thickness $t_{P1}$ of the first pinned magnetic layer (lower) 32 and the film thickness $t_{P2}$ of the second pinned magnetic layer (lower) 34, and the film thickness ratio between the film thickness $t_{P1}$ of the first pinned magnetic layer (upper) 43 and the film thickness $t_{P2}$ of the second pinned magnetic layer (upper) 41 be such wherein (film thickness $t_{P1}$ of first pinned magnetic layer)/(film thickness $t_{P2}$ of second pinned magnetic layer) is in a range of 0.33 to 0.95, or in a range of 1.05 to 4. Also, if the film thickness ratio is in the above range, and that the film thickness $t_{P1}$ of the first pinned magnetic layer (lower) 32 and (upper) 43, and the film thickness $t_{P2}$ of the second pinned magnetic layer (lower) 34 and (upper) 41 is in a range of 10 to 70 angstrom, and that an absolute value obtained by subtracting the film thickness $t_{P2}$ of the second pinned magnetic layers 34 and 41 from the film thickness $t_{P1}$ of the first pinned magnetic layers 32 and 43 is equal to or greater than 2 angstrom, an exchange coupling magnetic field of 500 (Oe) or greater can be obtained.

Even more preferable with the present invention is an arrangement wherein the (film thickness $t_{P1}$ of first pinned magnetic layer)/(film thickness $t_{P2}$ of second pinned magnetic layer) is in a range of 0.53 to 0.95, or in a range of 1.05 to 1.8, and moreover, if the film thickness $t_{P1}$ of the first pinned magnetic layers (lower) 32 and (upper) 43, and the film thickness $t_{P2}$ of the second pinned magnetic layers. (lower) 34 and (upper) 41, is in a range of 10 to 50 angstrom, and that the absolute value obtained by subtracting the film thickness $t_{P2}$ of the second pinned magnetic layers 34 and 41 from the film thickness $t_{P1}$ of the first pinned magnetic layers 32, 43 is equal to or greater than 2 angstrom, an exchange coupling magnetic field of 1,000 (Oe) or greater can be obtained.

Now, experimentation has shown that even if the thickness $t_{P1}$ of the first pinned magnetic layer (lower) 32 formed below the free magnetic layer 36 is made to be greater than the thickness $t_{P2}$ of the second pinned magnetic layer (lower) 34, the exchange coupling magnetic field tends to drop if the difference in film thickness between the thickness $t_{P1}$ of the first pinned magnetic layer (lower) 32 and the thickness $t_{P2}$ of the second pinned magnetic layer (lower) 34 is equal to or lower than 6 angstrom.

This phenomena is observed if the antiferromagnetic layers 31 and 44 used are formed of a PtMn alloy or the like which requires thermal treatment in order to generate an exchange coupling magnetic field (exchange anisotropic magnetic field) at the interface between the first pinned magnetic layer (lower) 32 and (upper) 43.

This drop in the exchange coupling magnetic field occurs due to the following: thermal dispersion between the antiferromagnetic layer 31 formed below the free magnetic layer 36 and the first pinned magnetic layer (lower) 32 causes the magnetic film thickness of the first pinned magnetic layer (lower) 32 to decrease, to the extent that the magnetic film thickness of the first pinned magnetic layer (lower) 32 and the film thickness $t_{P2}$ of the second pinned magnetic layer 34 is approximately the same. Accordingly, with the present invention, the (film thickness $t_{P1}$ of the first pinned magnetic layer (lower) 32/film thickness $t_{P2}$ of the second pinned magnetic layer (lower) 34) is preferably made to be greater than the (film thickness $t_{P1}$ of the first pinned magnetic layer (upper) 43/film thickness $t_{P2}$ of the second pinned magnetic layer (upper) 41).

Generation of the thermal dispersion layer is not restricted to the dual spin-valve magnetoresistive thin film element shown in FIG. 5, but also occurs in the same manner with single spin-valve magnetoresistive thin film elements wherein the antiferromagnetic layer 11 is formed below the free magnetic layer 16 (see FIG. 1), as well.

As described above, unless there is a certain degree of difference between the magnetic film thickness $Ms \cdot t_{P1}$ of the first pinned magnetic layers (lower) 32 and (upper) 43, and the magnetic film thickness $Ms \cdot t_{P2}$ of the second pinned magnetic layers (lower) 34 and (upper) 41, the magnetization state does not easily achieve a Ferri-state; on the other hand, if the difference between the magnetic film thickness $Ms \cdot t_{P1}$ of the first pinned magnetic layers (lower) 32 and (upper) 43, and the magnetic film thickness $MS \cdot t_{P2}$ of the second pinned magnetic layers (lower) 34 and (upper) 41 is too large, this leads to undesirable deterioration in the exchange coupling magnetic field. Accordingly, with the present invention, as with the film thickness ratio of the film thickness $t_{P1}$ of the first pinned magnetic layer (lower) 32 and (upper) 43, and the film thickness $t_{P2}$ of the second pinned magnetic layer (lower) 34 and (upper) 41, it is preferable that (the magnetic film thickness $Ms \cdot t_{P1}$ of the first pinned magnetic layers (lower) 32 and (upper) 43)/(the magnetic film thickness $Ms \cdot t_{P2}$ of the second pinned magnetic layers (lower) 34 and (upper) 41) be in a range of 0.33 to 0.95, or in a range of 1.05 to 4. Also, with the present invention, it is preferable that the magnetic film thickness $Ms \cdot t_{P1}$ of the first pinned magnetic layers (lower) 32 and (upper) 43 and the magnetic film thickness $Ms \cdot t_{P2}$ of the second pinned magnetic layers (lower) 34 and (upper) 41 be in a range of 10 to 70 (angstrom tesla), and that an absolute value obtained by subtracting the magnetic film thickness $Ms \cdot t_{P2}$ of the second pinned magnetic layers (lower) 34 and (upper) 41 from the magnetic film thickness $Ms \cdot t_{P1}$ of the first pinned magnetic layers (lower) 32 and (upper) 43 be equal to or greater than 2 (angstrom tesla).

It is even more preferable that (the magnetic film thickness $Ms \cdot t_{P1}$ of the first pinned magnetic layers (lower) 32 and (upper) 43)/(the magnetic film thickness $Ms \, t_{P2}$ of the second pinned magnetic layers (lower) 34 and (upper) 41) be in a range of 0.53 to 0.95 or 1.05 to 1.8. Also, in the above ranges, it is preferable that the magnetic film thickness Ms·$t_{p1}$ of the first pinned magnetic layers (lower) 32 and (upper) 43 and the magnetic film thickness Ms·$t_{P2}$ of the second pinned magnetic layers (lower) 34 and (upper) 41 be in a range of 10 to 50 (ångström tesla), and that an absolute value obtained by subtracting the magnetic film thickness Ms·$t_{P2}$ of the second pinned magnetic layers (lower) 34 and (upper) 41 from the magnetic film thickness Ms·$t_{P1}$ of the first pinned magnetic layers (lower) 32 and (upper) 43 be equal to or greater than 2 (ångström tesla).

The nonmagnetic intermediate layers 33 and 42 introduced between the first pinned magnetic layers (lower) 32 and (upper) 43 and the second pinned magnetic layers (lower) 34 and (upper) 41 shown in FIG. 5 are preferably formed of one of the following; or of an alloy of two or more thereof: Ru, Rh, Ir, Cr, Re, and Cu.

As shown in FIG. 5, the film thickness value of the nonmagnetic intermediate layer (lower) 33 formed below the free magnetic layer 36 is preferably in the range of 3.6 to 9.6 ångström. Within this range, an exchange coupling magnetic field (Hex) of 500 (Oe) or greater can be obtained.

It is further preferable that the film thickness value of the nonmagnetic intermediate layer (lower) 33 be in the range of 4 to 9.4 ångström. Within this range, an exchange coupling magnetic field of at least 1,000 (Oe) or greater can be obtained.

Also, with the present invention, as shown in FIG. 5, the film thickness value of the nonmagnetic intermediate layer (upper) 42 formed above the free magnetic layer 36 is preferably in the range of 2.5 to 6.4 ångström or 6.8 to 10.7 ångström. Within this range, an exchange coupling magnetic field (Hex) of at least 500 (Oe) or greater can be obtained.

Further, with the present invention, it is further preferable that the film thickness value of the nonmagnetic intermediate layer (upper) 42 be in the range of 2.8 to 6.2 ångström or 6.8 to 10.3 ångström. Within this range, an exchange coupling magnetic field of at least 1,000 (Oe) or greater can be obtained.

Also, a thickness of at least 100 ångström or greater for the antiferromagnetic layers 31 and 44 can obtain an exchange coupling magnetic field of 500 (Oe) or greater. Further, the thickness of at least 110 ångström or greater can obtain an exchange coupling magnetic field of 1,000 (Oe) or greater.

With known arrangements, the antiferromagnetic layers 31 and 44 are formed to a thickness of at least 200 ångström or greater. However, according to the present invention, the antiferromagnetic layers 31 and 44 can be formed at half the thickness, so, with the particular case of dual spin-valve magnetoresistive thin film elements wherein two antiferromagnetic layers 31 and 44 are formed, the overall thickness of the spin-valve magnetoresistive thin film element can be reduced by around 200 ångström or more. With such spin-valve magnetoresistive thin film elements that have been reduced in thickness, the gap length G1 can be reduced even if the lower gap layer 121 and upper gap layer 125 shown in FIG. 13 are made to be thick enough to maintain sufficient insulation, so as to deal with high-density recording.

By appropriately adjusting the film thickness ratio and film thicknesses of the first pinned magnetic layer (lower) 32 and (upper) 43, and the second pinned magnetic layer (lower) 34 and (upper) 41, the film thickness of the nonmagnetic intermediate layers (lower) 33 and (upper) 42, and the film thickness of the antiferromagnetic layers 31 and 44 within the above-described ranges, ΔMR around the same as with known arrangements can be obtained; specifically, ΔMR around 10% or more can be obtained.

As shown in FIG. 5, the film thickness $t_{P1}$ of the first pinned magnetic layer (lower) 32 formed below the free magnetic layer 36 is formed so as to be thinner than the film thickness $t_{P2}$ of the second pinned magnetic layer (upper) 34 formed with the nonmagnetic intermediate layer 33 introduced therebetween. On the other hand, the film thickness $t_{P1}$ of the first pinned magnetic layer (upper) 43 formed above the free magnetic layer 36 is formed so as to be thicker than the film thickness $t_{P2}$ of the second pinned magnetic layer (upper) 41 formed with the nonmagnetic intermediate layer 42 introduced therebetween. The magnetization of both first pinned magnetic layers (lower) 32 and (upper) 43 are magnetized in the direction opposite to the direction Y in the Figure, and the magnetization of the second pinned magnetic layers (lower) 34 and (upper) 41 are magnetized in the direction Y in the Figure.

In the cases of the single spin-valve magnetoresistive thin film elements shown in FIGS. 1 and 3, the film thickness and the like is adjusted so that the Ms·$t_{P1}$ of the first pinned magnetic layer and the Ms·$t_{p2}$ of the second pinned magnetic layer differ, and the direction of the magnetization of the first pinned magnetic layer may be either in the direction of Y in the Figure, or in the direction opposite to the direction of Y.

However, with the dual spin-valve magnetoresistive thin film element shown in FIG. 5, there is the need to have the magnetization of the first pinned magnetic layers (lower) 32 and (upper) 43 both in the same direction. Thus with the present invention, the magnetic moment Ms·$t_{P1}$ of the first pinned magnetic layers (lower) 32 and (upper) 43 is appropriately adjusted with the magnetic moment Ms·$t_{P2}$ of the second pinned magnetic layers (lower) 34 and (upper) 41, and the direction and magnitude of the magnetic field applied during thermal treatment is appropriately set.

Now, the reason that the magnetization of the first pinned magnetic layers (lower) 32 and (upper) 43 are both directed in the same direction is in order to direct the magnetization of the second pinned magnetic layers (lower) 34 and (upper) 41 which come into an antiparallel state with the magnetization of the first pinned magnetic layers (lower) 32 and (upper) 43 in the same direction, and the reason thereof will be described next.

As described above, the ΔMR of spin-valve magnetoresistive thin film elements is obtained from the relationship between the pinned magnetism of the pinned magnetic layer, and the fluctuating magnetization of the free magnetic layer. However, if the pinned magnetic layer is divided into a first pinned magnetic layer and second pinned magnetic layer as with the present invention, the pinned magnetic layer which directly contributes to the ΔMR is the second pinned magnetic layer, and the first pinned magnetic layer serves a supplementary role in pining the magnetization of the second pinned magnetic layer in a constant direction.

For instance, if the magnetization of the second pinned magnetic layers (lower) 34 and (upper) 41 shown in FIG. 5 are pinned in a mutually opposing manner, resistance would be very small due to the relationship between the pinned magnetization of the second pinned magnetic layer (lower) 34 and the fluctuating magnetization of the free magnetic layer 36, even if the resistance due to the relationship between the pinned magnetization of the second pinned magnetic layer (upper) 41 and the fluctuating magnetization of the free magnetic layer 36 for example, is large, so consequently, the ΔMR in the dual spin-valve magnetoresistive thin film element would be smaller than the ΔMR of the single spin-valve magnetoresistive thin film element shown in FIGS. 1 and 3.

This problem is not limited to dual spin-valve magnetoresistive thin film elements wherein the pinned magnetic layer is divided into two layers with a nonmagnetic intermediate layer introduced therebetween as with the present invention, but also is the same for known dual spin-valve magnetoresistive thin film elements. Thus there is the need to pin the pinned magnetic layers formed above and below the free magnetic layer in the same direction, in order to exhibit the properties of dual spin-valve magnetoresistive thin film elements which are capable of producing greater ΔMR than single spin-valve magnetoresistive thin film elements and obtaining greater output.

Now, with the present invention, as shown in FIG. 5, the pinned magnetic layer formed below the free magnetic layer 36 is arranged such that the Ms·$t_{P2}$ of the second pinned magnetic layer (lower) 34 is greater than the Ms·$t_{P1}$ of the first pinned magnetic layer (lower) 32, and the magnetization of the second pinned magnetic layer (lower) 34 with the greater Ms·$t_{P2}$ is pinned in the direction Y in the Figure. Here, the so-called synthesized magnetic moment obtained by adding the Ms·$t_{P2}$ of the second pinned magnetic layer 34 and the Ms·$t_{P1}$ of the first pinned magnetic layer 32 is dominated by the magnetic moment of the second pinned magnetic layer 34 with the greater Ms·$t_{P2}$, and is directed in the direction Y in the Figure.

On the other hand, the pinned magnetic layer formed above the free magnetic layer 36 is arranged such that the Ms·$t_{P1}$ of the first pinned magnetic layer (upper) 43 is greater than the Ms·$t_{P2}$ of the second pinned magnetic layer (upper) 41, and the magnetization of the first pinned magnetic layer (upper) 43 with the greater Ms·$t_{P1}$ is pinned in the direction opposite to the direction Y in the Figure.

Here, the so-called synthesized magnetic moment obtained by adding the Ms·$t_{P1}$ of the first pinned magnetic layer (upper) 43 and the Ms·$t_{P2}$ of the second pinned magnetic layer (upper) 41 is dominated by the Ms·$t_{P1}$ of the first pinned magnetic layer (upper) 43, and is directed in the direction opposite to the direction Y in the Figure.

That is to say, with the dual spin-valve magnetoresistive thin film element shown in FIG. 5, the directions of the synthesized magnetic moments which can be obtained by adding the Ms·$t_{P1}$ of the first pinned magnetic layer and the Ms·$t_{P2}$ of the second pinned magnetic layer are opposite above and below the free magnetic layer 36. The synthesized magnetic moment directed in the direction Y in the Figure which is formed below the free magnetic layer 36, and the synthesized magnetic moment directed opposite to the direction Y in the Figure which is formed above the free magnetic layer 36 together form a magnetic field turning in the left-hand direction in the Figure.

Accordingly, the magnetization of the first pinned magnetic layers (lower) 32 and (upper) 43, and the magnetization of the second pinned magnetic layers (lower) 34 and (upper) 41 can be maintained in an even more stable Ferri-state, due to the magnetic field formed by the above synthesized magnetic moment.

Further, the sensing current 114 flows with the nonmagnetic electrically conductive layers 35 and 39 as the center of the flow thereof. Causing the sensing current 114 to flow forms a sensing current magnetic field due to the corkscrew rule, and causing the sensing current 114 to flow in the direction shown in FIG. 5 causes the direction of the sensing current magnetic field created by the sensing current at the portion of the first pinned magnetic layer (lower) 32/nonmagnetic intermediate layer (lower) 33/second pinned magnetic layer (lower) 34 that has been formed below the free magnetic layer 36, to match the direction of the synthesized magnetic moment of the first pinned magnetic layer (lower) 32/nonmagnetic intermediate layer (lower) 33/second pinned magnetic layer (lower) 34, and further causes the direction of the sensing current magnetic field created by the sensing current at the portion of the first pinned magnetic layer (upper) 43/nonmagnetic intermediate layer (upper) 42/second pinned magnetic layer (upper) 41 that has been formed above the free magnetic layer 36, to match the direction of the synthesized magnetic moment of the first pinned magnetic layer (upper) 43/nonmagnetic intermediate layer (upper) 42/second pinned magnetic layer (upper) 41.

Though the advantages of matching the direction of the sensing current magnetic field and the direction of the synthesized magnetic moment will be described later in detail, it can be briefly stated that the advantages are very large, since the thermal stability of the pinned magnetic layers can be increased, and a large sensing current can be used, so reproduction output can be improved. This is because these relationships between the direction of the sensing current magnetic field and of the synthesized magnetic moment owe to the fact that the synthesized magnetic moments of the pinned magnetic layers formed above and below the free magnetic layer 36 form the magnetic field turning in the left-hand direction in the Figure.

Environment temperatures in devices now reach around 200° C., and the trend is for the environment temperatures to further increase, due to increases in revolutions of the recording medium, sensing currents, and so forth. Such increases in environment temperatures causes the exchange coupling magnetic field to drop. However according to the present invention, the magnetic field formed by the synthesized magnetic moment and the sensing current magnetic field allow the magnetization of the first pinned magnetic layers (lower) 32 and (upper) 43, and the magnetization of the second pinned magnetic layers (lower) 34 and (upper) 41, to be maintained in a thermally stable Ferri-state.

The above-described formation of the magnetic field due to the synthesized magnetic moment, and the directional relationship between the magnetic field due to the synthesized magnetic moment and the sensing current magnetic field, are configurations which are unique to the present invention, and cannot be obtained with known dual spin-valve magnetoresistive thin film elements which have pinned magnetic layers formed above and below a free magnetic layer in single layers and magnetized and pinned in the same direction.

Next, the direction and magnitude of the magnetic field to be applied during thermal treatment will be described. With the spin-valve magnetoresistive thin film element shown in FIG. 5, an antiferromagnetic material such as a PtMn alloy or the like which requires thermal treatment is used as the antiferromagnetic layers 31 and 44 for generating an exchange coupling magnetic field (exchange anisotropic magnetic field) at the interface between the first pinned magnetic layers (lower) 32 and (upper) 43 and the antiferromagnetic layers 31 and 44, so if the direction and magnitude of the magnetic field applied during thermal treatment is not appropriately controlled, the magnetization direction of the first pinned magnetic layers (lower) 32 and (upper) 43 and second pinned magnetic layers (lower) 34 and (upper) 41 cannot be obtained in a direction such as shown in FIG. 5.

First, in the stage of forming the films, as shown in FIG. 5, the Ms $t_{P1}$ of the first pinned magnetic layer (lower) 32 formed below the free magnetic layer 36 is made to be smaller than the Ms $t_{P1}$ of the second pinned magnetic layer (lower) 34, and also the Ms $t_{P1}$ of the first pinned magnetic layer (upper) 43 formed above the free magnetic layer 36 is made to be greater than the MS $t_{P2}$ of the second pinned magnetic layer (upper) 41.

As shown in FIG. 5, if the first pinned magnetic layers (lower) 32 and (upper) 43 are to be directed in the direction opposite to the direction Y in the Figure, referring to the above Tables 1 and 2 shows that there is the need to apply a magnetic field of 5 k(Oe) or greater (see Table 1 (4) and Table 2 (4)) in the direction opposite to the direction Y in the Figure.

Applying a magnetic field of 5 k(Oe) or greater in the direction opposite to the direction Y in the Figure causes the magnetization of the first pinned magnetic layers (lower) 32 and (upper) 43, and the magnetization of the second pinned magnetic layers (lower) 34 and (upper) 41 to all be temporarily directed in the direction opposite to the direction Y. The first pinned magnetic layers (lower) 32 and (upper) 43 are pinned in the direction opposite to the direction Y by the exchange coupling magnetic field (exchange anisotropic magnetic field) generated at the interface between the first pinned magnetic layers (lower) 32 and (upper) 43 and the antiferromagnetic layers 31 and 44, and removing the magnetic field of 5 k(Oe) or greater causes the magnetization of the second pinned magnetic layers (lower) 34 and (upper) 41 to be inverted in the direction Y in the Figure due to the exchange coupling magnetic field (RKKY interaction) with the first pinned magnetic layers (lower) 32 and (upper) 43, and be pinned in the direction Y.

Alternatively, a magnetic field of 5 k(Oe) or greater may be applied in the direction Y in the Figure. In this case, the magnetization of the first pinned magnetic layers (lower) 32 and (upper) 43 and the magnetization of the second pinned magnetic layers (lower) 34 and (upper) 41 to be magnetized opposite to the magnetization directions shown in FIG. 5, thereby forming a magnetic field from right-hand rotating synthesized magnetic moment.

Also, with the present invention, the Ms·$t_{P1}$ of the first pinned magnetic layer (lower) 32 formed below the free magnetic layer 36 may be made to be greater than the Ms·$t_{P2}$ of the second pinned magnetic layer 34, and also the Ms·$t_{P1}$ of the first pinned magnetic layer 43 formed above the free magnetic layer 36 may be made to be smaller than the Ms·$t_{P2}$ of the second pinned magnetic layer 41. In this case as well, applying a magnetic field of 5 k(Oe) or greater in the direction regarding which magnetization of the first pinned magnetic layers (lower) 32 and (upper) 43 is desired, i.e., in the Y direction shown in the Figure or in the opposite direction, thereby directing and pinning the second pinned magnetic layers (lower) 34 and (upper) 41 formed above and below the free magnetic layer 36 in the same direction, and further forming a magnetic field from right-hand rotating or left-hand rotating synthesized magnetic moment.

It should be noted that directing the magnetization of the second pinned magnetic layers (lower) 34 and (upper) 41 formed above and below the free magnetic layer 36 in the same direction, and further forming a magnetic field with synthesized magnetic moment and forming the directional relationship between the magnetic field due to the synthesized magnetic moment and the sensing current magnetic field, cannot be realized by any method other than that described above.

Now, other methods described below could be used to direct the magnetization of the second pinned magnetic layers (lower) 34 and (upper) 41 in the same direction, but the synthesized magnetic moment formed above and below the free magnetic layer 36 would be facing in the same direction, so a magnetic field could not be formed with the synthesized magnetic moment. However, the dual spin-valve magnetoresistive thin film element according to the present invention is capable of obtaining ΔMR of around the same as known dual spin-valve magnetoresistive thin film elements with the following thermal treatment as well, and further, the magnetization state of the pinned magnetic layers (first pinned magnetic layer and second pinned magnetic layer) can be maintained in a thermally stable state.

First, if the Ms·$t_{P1}$ of the first pinned magnetic layer (lower) 32 formed below the free magnetic layer 36 and the Ms·$t_{P1}$ of the first pinned magnetic layer (upper) 43 formed above the free magnetic layer 36 are both made to be greater than the Ms·$t_{P2}$ of the second pinned magnetic layers (lower) 34 and (upper) 41, applying a magnetic field of 100 (Oe) to 1 k(Oe) or 5 k(Oe) or greater in the direction that the magnetization of the first pinned magnetic layers (lower) 32 and (upper) 43 are to be directed directs both of the first pinned magnetic layers (lower) 32 and (upper) 43 in the same direction, and the magnetization of both of the second pinned magnetic layers (lower) 34 and (upper) 41 to be magnetized in an antiparallel manner with the magnetization of the first pinned magnetic layers (lower) 32 and (upper) 43 is directed and pinned in the same direction, due to the exchange coupling magnetic field (RKKY interaction) with the first pinned magnetic layers (lower) 32 and (upper) 43.

Alternatively, if the Ms·$t_{P1}$ of the first pinned magnetic layer (lower) 32 formed below the free magnetic layer 36 and the Ms·$t_{P1}$ of the first pinned magnetic layer (upper) 43 formed above the free magnetic layer 36 are both made to be smaller than the Ms·$t_{P2}$ of the second pinned magnetic layers (lower) 34 and (upper) 41, applying a magnetic field of 100 (Oe) to 1 k(Oe) or 5 k(Oe) or greater in the direction opposite to the direction that the first pinned magnetic layers (lower) 32 and (upper) 43 are to be directed directs both of the first pinned magnetic layers (lower) 32 and (upper) 43 in the same direction, and the magnetization of both of the second pinned magnetic layers (lower) 34 and (upper) 41 to be magnetized in an antiparallel manner with the magnetization of the first pinned magnetic layers (lower) 32 and (upper) 43 is directed and pinned in the same direction, due to the exchange coupling magnetic field (RKKY interaction) with the first pinned magnetic layers (lower) 32 and (upper) 43.

In this way, according to the spin-valve magnetoresistive thin film elements shown in FIGS. 1 through 6, a pinned magnetic layer is divided into the two layers of a first pinned magnetic layer and a second pinned magnetic layer with a nonmagnetic intermediate layer introduced therebetween, and the magnetization of the two layers is placed in an antiparallel state (Ferri-state) by the exchange coupling magnetic field (RKKY interaction) generated between the two pinned magnetic layers, thereby maintaining the magnetization state of the pinned magnetic layers in a state more thermally stable than that of known arrangements.

Particularly, the present invention uses as the antiferromagnetic layer a PtMn alloy which exhibits high blocking temperature and generates a large exchange coupling magnetic field (exchange anisotropic magnetic field) at the interface between the first pinned magnetic layer and the antiferromagnetic layer, so the magnetization state of the first pinned magnetic layer and the second pinned magnetic layer can be maintained in a further thermally stable manner.

Also, with the present invention, forming the film thickness ratio between the first pinned magnetic layer and the second pinned magnetic layer, the film thickness of the nonmagnetic intermediate layer introduced between the first pinned magnetic layer and the second pinned magnetic layer, and the film thickness of the antiferromagnetic layer in an appropriate range enables a greater exchange coupling magnetic field (Hex) to be obtained. Accordingly, the thermal stability of the pinned magnetization of the first pinned magnetic layer and the second pinned magnetic layer can be further improved.

Further, forming the film thickness ratio between the film thickness $t_{P1}$ of the first pinned magnetic layer and the film thickness $t_{P2}$ of the second pinned magnetic layer, and the film thicknesses of the first pinned magnetic layer, the second pinned magnetic layer, the nonmagnetic intermediate layer, and the antiferromagnetic layer, in an appropriate range, enables ΔMR around that of known arrangements to be obtained.

Further, with the present invention, in the event of using as the antiferromagnetic layer an antiferromagnetic material such as a PtMn alloy or the like which requires thermal treatment for generating an exchange coupling magnetic field (exchange anisotropic magnetic field) at the interface between the first pinned magnetic layer and the antiferromagnetic layer, forming the Ms $t_{P1}$ of the first pinned magnetic layer and the Ms $t_{P2}$ of the second pinned magnetic layer at different values, and appropriately adjusting the magnitude and direction of the magnetic field applied during thermal treatment enables the magnetization of the first pinned magnetic layer (and the second pinned magnetic layer) to be magnetized in the desired direction.

Particularly, with the dual spin-valve magnetoresistive thin film element shown in FIG. 5, appropriately adjusting the Ms·$t_{P1}$ of the first pinned magnetic layers (lower) 32 and (upper) 43, and the MS·$t_{P2}$ of the second pinned magnetic layers (lower) 34 and (upper) 41, and further appropriately adjusting the magnitude and direction of the magnetic field applied during thermal treatment enables the magnetization of both of the second pinned magnetic layers (lower) 34 and (upper) 41 formed above and below the free magnetic layer 36 to be pinned in the same direction, and the synthesized magnetic moments formed above and below the free magnetic layer 36 to be formed in mutually opposing directions, thereby forming a magnetic field with the synthesized magnetic moment and forming the directional relationship with the magnetic field due to the synthesized magnetic moment and the sensing current magnetic field, consequently further improving the thermal stability of the magnetization of the pinned magnetic layers.

Figure 7:
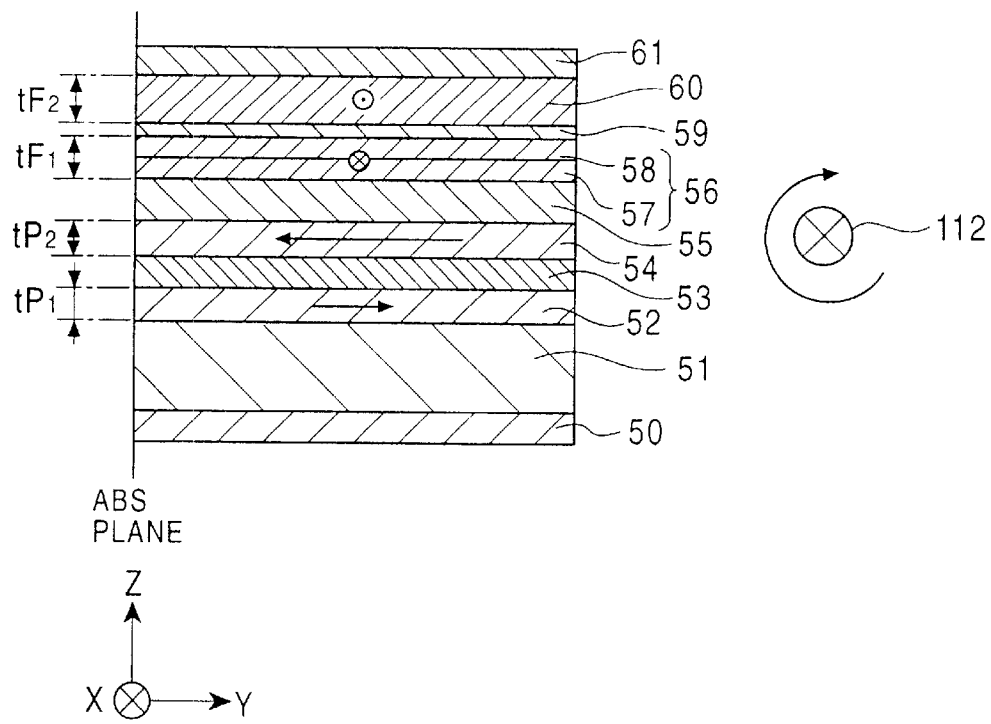
FIG. 7 is a side cross-sectional view of a spin-valve magnetoresistive thin film element according to a fourth embodiment of the present invention.
Figure 8:
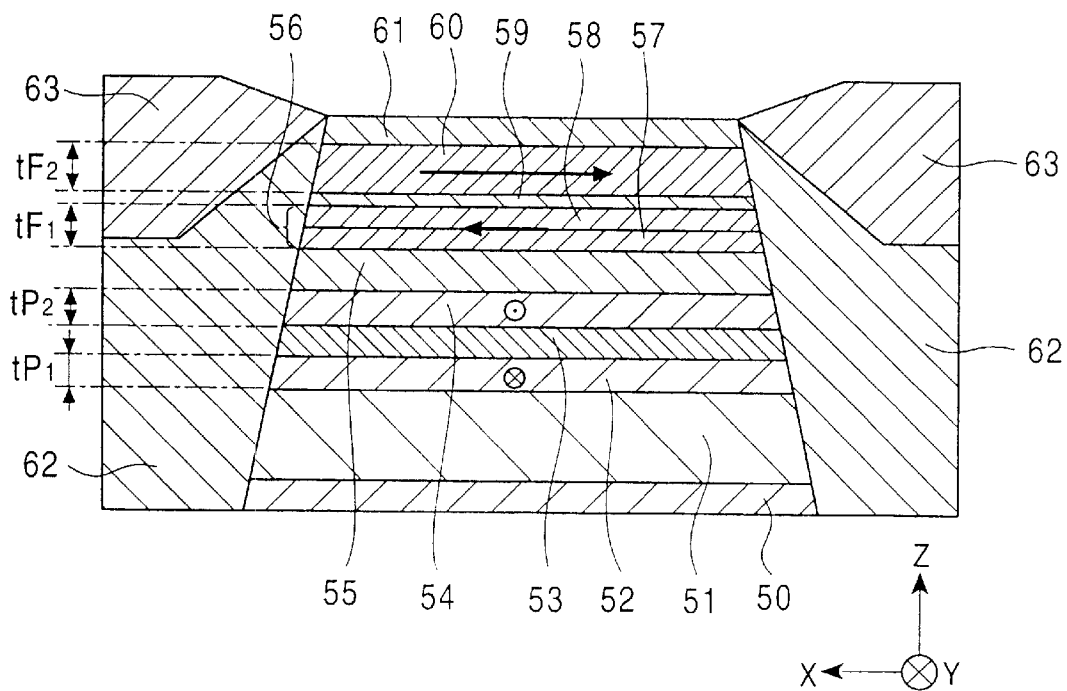
FIG. 8 is a cross-sectional view of the spin-valve magnetoresistive thin film element shown in FIG. 7, viewed from the side facing the recording medium.

FIG. 7 is a side cross-sectional view schematically showing the structure of a spin-valve magnetoresistive thin film element according to a fourth embodiment of the present invention, and FIG. 8 is a cross-sectional view of the spin valve magnetoresistive thin film element shown in FIG. 7, viewed from the side facing the recording medium.

As with the spin-valve magnetoresistive thin film elements shown in FIGS. 1 through 6, this spin-valve magnetoresistive thin film element also is provided to the trailing edge or the like of a floating slider provided in a hard disk drive, for detecting recorded magnetic fields on the hard disk or the like. Now, the direction of motion of the magnetic recording medium such as a hard disk is in the Z direction as shown in the Figure, and the direction of leaking magnetic field from the magnetic recording medium is in the Y direction.

Not only is the pinned magnetic layer in this spin-valve magnetoresistive thin film element divided into two layers, but also the free magnetic layer is divided into the two layers of a first free magnetic layer and second free magnetic layer, with a nonmagnetic intermediate layer introduced therebetween.

As shown in FIGS. 7 and 8, the spin-valve magnetoresistive thin film element comprises from the bottom: a base layer 50, antiferromagnetic layer 51, first pinned magnetic layer 52, nonmagnetic intermediate layer 53, second pinned magnetic layer 54, nonmagnetic electrically conductive layer 55, first free magnetic layer 56, nonmagnetic intermediate layer 59, second free magnetic layer 60, and protective layer 61, in that order.

The base layer 50 and protective layer 61 are formed of Ta, for example, also, the antiferromagnetic layer 51 is preferably formed of a PtMn alloy, for example. PtMn alloys have better corrosion-resistant properties than NiMn alloys or FeMn alloys conventionally used for antiferromagnetic layers, the blocking temperature is high, and a large exchange coupling magnetic field can be obtained. Also, with the present invention, X—Mn alloys (wherein X is one or a plurality of the following elements: Pd, Ir, Rh, Ru, Os) or PtMn—X alloys (wherein X is one or a plurality of the following elements: Pd, Ir, Rh, Ru, Os, Au, Ag) may be used instead of PtMn alloys.

The first pinned magnetic layer 52 and second pinned magnetic layer 54 are comprised of Co film, an NiFe alloy, Co—Fe alloy, Co—Ni alloy, Co—NiFe alloy, or the like. The nonmagnetic intermediate layer 53 is preferably formed of one of the following; or of an alloy of two or more thereof: Ru, Rh, Ir, Cr, Re, and Cu. Further, the nonmagnetic electrically conductive layer 55 is formed of Cu or the like.

The magnetization of the first pinned magnetic layer 52 and the magnetization of the second pinned magnetic layer 54 are in a Ferri-state wherein each is magnetized in a manner antiparallel with the other, with the magnetization of the first pinned magnetic layer 52 being pinned in the direction Y shown in the Figure, and the magnetization of the second pinned magnetic layer 54 in the direction opposite to Y. A large exchange coupling magnetic field is necessary to maintain the stability of this Ferri-state, and with the present invention, the following various types of optimization are performed in order to obtain a greater exchange coupling magnetic field.

With the spin-valve magnetoresistive thin film element shown in FIGS. 7 and 8, (the thickness tP1 of the first pinned magnetic layer 52)/(the thickness tP2 of the second pinned magnetic layer 54) preferably is in a range of 0.33 to 0.95, or in a range of 1.05 to 4, and more preferably is in a range of 0.53 to 0.95, or in a range of 1.08 to 1.8.

It is preferable that the film thickness of the first pinned magnetic layer 52 and the film thickness of the second pinned magnetic layer 54 be in a range of 10 to 70 angstrom, and also the film thickness tP1 of the first pinned magnetic layer 52 minus the film thickness tP2 of the second pinned magnetic layer 54|≧2 angstrom. It is even more preferable to be in a range of 10 to 50 angstrom, and also the film thickness tP1 of the first pinned magnetic layer 52 minus the film thickness tP2 of the second pinned magnetic layer 54|≧2 angstrom.

As described above, unless there is a certain degree of difference between the magnetic film thickness Ms·tP1 of the first pinned magnetic layer 52 and the magnetic film thickness Ms·tP2 of the second pinned magnetic layer 54, the magnetization state does not easily achieve a Ferri-state.

On the other hand, if the difference between the magnetic film thickness Ms·tP1 of the first pinned magnetic layer 52 and the magnetic film thickness Ms·tP2 of the second pinned magnetic layer 54 is too large, this leads to undesirable deterioration in the exchange coupling magnetic field. Accordingly, with the present invention, as with the film thickness ratio between the film thickness tp1 of the first pinned magnetic layer 52 and the film thickness tP2 of the second pinned magnetic layer 54, it is preferable that (the magnetic film thickness Ms tP1 of the first pinned magnetic layer 52)/(the magnetic film thickness Ms·tP2 of the second pinned magnetic layer 54) be in a range of 0.33 to 0.95, or in a range of 1.05 to 4. Also, with the present invention, it is preferable that the magnetic film thickness Ms·tP1 of the first pinned magnetic layer 52 and the magnetic film thickness Ms·tp2 of the second pinned magnetic layer 54 be in a range of 10 to 70 (ångström tesla), and that an absolute value obtained by subtracting the magnetic film thickness Ms·tP2 of the second pinned magnetic layer 54 from the magnetic film thickness Ms·tP1 of the first pinned magnetic layer 52 is equal to or greater than 2 (ångström tesla).

It is even more preferable that (the magnetic film thickness Ms·tP1 of the first pinned magnetic layer 52)/(the magnetic film thickness Ms·tP2 of the second pinned magnetic layer 54) be in a range of 0.53 to 0.95 or in a range of 1.05 to 1.8. Also, in the above ranges, it is preferable that the magnetic film thickness Ms·tP1 of the first pinned magnetic layer 52 and the magnetic film thickness Ms·tP2 of the second pinned magnetic layer 54 be in a range of 10 to 50 (ångström tesla), and that an absolute value obtained by subtracting the magnetic film thickness Ms·tP2 of the second pinned magnetic layer 54 from the magnetic film thickness Ms·tP1 of the first pinned magnetic layer 52 is equal to or greater than 2 (ångström tesla).

Also, it is preferable that the film thickness of the nonmagnetic intermediate layer 53 introduced between the first pinned magnetic layer 52 and second pinned magnetic layer 54 be in the range of 3.6 to 9.6 ångström. Within this range, an exchange coupling magnetic field of 500 (Oe) or greater can be obtained. It is further preferable for this to be in the range of 4 to 9.4, since an exchange coupling magnetic field of 1,000 (Oe) or greater can be obtained.

Also, a thickness of at least 90 ångström or greater for the antiferromagnetic layer 51 is preferable, since it can obtain an exchange coupling magnetic field of 500 (Oe) or greater. Further preferable is a thickness of at least 100 ångström or greater, which can obtain an exchange coupling magnetic field of 1,000 (Oe) or greater.

The first free magnetic layer 56 is formed on the nonmagnetic electrically conductive layer 55 shown in FIGS. 7 and 8. As shown in FIGS. 7 and 8, the first free magnetic layer 56 is formed of two layers, with a Co film 57 being formed on the side coming into contact with the nonmagneticelectrically conductive layer 55. The reason that the Co film 57 is formed on the side in contact with the nonmagnetic electrically conductive layer 55 is that firstly, a greater ΔMR can be obtained, and secondly that dispersion with the electrically conductive layer 55 can be prevented.

An NiFe alloy film 58 is formed on the Co film 57. Further formed on the NiFe alloy film 58 is a nonmagnetic intermediate layer 59. Formed on the nonmagnetic intermediate layer 59 is the second free magnetic layer 60, and further formed on the second free magnetic layer 60 is the protective layer 61 formed of Ta or the like.

The second free magnetic layer 60 is comprised of a Co film, an NiFe alloy, Co—Fe alloy, Co—NiFe alloy, or the like.

The spin-valve film from the base layer 50 through the protective layer 61 shown in FIG. 8 has the sides thereof inclined, so the spin-valve film is formed in the shape of a trapezoid. Hard magnetic bias layers 62 and electrically conductive layers 63 are formed on either side of the spin-valve film. The hard magnetic bias layers 62 are formed of a Co—Pt alloy, Co—Cr—Pt alloy, etc., and the electrically conductive layers 63 are formed of Cu, Cr, or the like.

A nonmagnetic intermediate layer 59 is introduced between the first free magnetic layer 56 and second free magnetic layer 60 shown in FIGS. 7 and 8, so the magnetization of the first free magnetic layer 56 and the magnetization of the second free magnetic layer 60 are in a mutually antiparallel state (Ferri-state), due to an exchange coupling magnetic field (RKKY interaction) generated between the first free magnetic layer 56 and second free magnetic layer 60.

With the spin-valve magnetoresistive thin film element shown in FIG. 8, for example, the film thickness tF1 of the first free magnetic layer 56 is made to be smaller than the film thickness tF2 of the second free magnetic layer 60, and also the Ms·tF1 of the first free magnetic layer 56 is made to be smaller than the Ms·tF2 of the second free magnetic layer 60. If a bias magnetic field is applied from the hard magnetic bias layers 62 in the direction X in the Figures, the magnetization of the second free magnetic layer 60 with the greater Ms·tF2 is affected by the bias magnetic field so as to be aligned in the direction X in the Figure, and the magnetization of the first free magnetic layer 56 with the smaller Ms·tF1 is in a direction opposite to X in the Figure, due to the exchange coupling magnetic field (RKKY interaction) generated between the first free magnetic layer 56 and second free magnetic layer 60.

If an external magnetic field intrudes from the direction Y in the Figure, the magnetization of the first free magnetic layer 56 and second free magnetic layer 60 maintains the Ferri-state, and at the same time rotates due to being affected by the external magnetic field. Then, electrical resistance changes due to the relationship between the fluctuating magnetism of the first free magnetic layer 56 which contributes to the ΔMR and the pinned magnetism of the second pinned magnetic layer 54 (magnetized in the direction opposite to Y in the Figures, for example), thereby detecting the signals of the external magnetic field.

With the present invention, the film thickness ratio between the film thickness tF1 of the first free magnetic layer 56 and the film thickness tF2 of the second free magnetic layer 60 is optimized, thereby allowing an even greater exchange coupling magnetic field to be obtained, and at the same time, allowing ΔMR around the same as with known arrangements to be obtained.

With the present invention, (the film thickness tF1 of the first free magnetic layer 56/the film thickness tF2 of the second free magnetic layer 60) is preferably in a range of 0.56 to 0.83 or 1.25 to 5. Within this range, an exchange coupling magnetic field of 500 (Oe) or greater can be obtained. With the present invention, (the film thickness tF1 of the first free magnetic layer 56/the film thickness tF2 of the second free magnetic layer 60) is even more preferably in a range of 0.61 to 0.83 or 1.25 to 2.1. Within this range, an exchange coupling magnetic field of 1,000 (Oe) or greater can be obtained.

The reason that the range of 0.83 to 1.25 has been excluded for (the film thickness tF1 of the first free magnetic layer 56/the film thickness tF2 of the second free magnetic layer 60) is that if the film thickness tF1 of the first free magnetic layer 56 and the magnetic film thickness tF2 of the second free magnetic layer 60 are formed to approximately the same value, and that the Ms·tF1 of the first free magnetic layer 56 and the Ms·tF2 of the second free magnetic layer 60 are formed to approximately the same value, the magnetization of both the first free magnetic layer 56 and second free magnetic layer 60 are affected by the bias magnetic field from the hard magnetic bias layer 62, and attempt to turn in the direction of that bias magnetic field. Consequently, the magnetization of each of both the first free magnetic layer 56 and second free magnetic layer 60 do not achieve an antiparallel state, and a stable magnetization state cannot be maintained.

Also, unless there is a certain degree of difference between the magnetic film thickness Ms·tF1 of the first free magnetic layer 56 and the magnetic film thickness Ms·tF2 of the second free magnetic layer 60, the magnetization state does not easily achieve a Ferri-stateOn the other hand, if the difference between the magnetic film thickness Ms·tF1 of the first free magnetic layer 56 and the magnetic film thickness Ms·tF1 of the second free magnetic layer 60 is too large, this leads to undesirable deterioration in the exchange coupling magnetic field. Accordingly, with the present invention, as with the film thickness ratio between the film thickness tF1 of the first free magnetic layer 56 and the film thickness tF2 of the second free magnetic layer 60, it is preferable that (the magnetic film thickness Ms·tF1 of the first free magnetic layer 56)/(the magnetic film thickness Ms·tF2 of the second free magnetic layer 60) be in a range of 0.56 to 0.83, or in a range of 1.25 to 5. It is further preferable with the present invention that (the magnetic film thickness Ms·tF1 of the first free magnetic layer 56)/(the magnetic film thickness Ms·tF2 of the second free magnetic layer 60) be in a range of 0.61 to 0.83, or in a range of 1.25 to 2.1.

Also, with the present invention, the nonmagnetic intermediate layer 59 introduced between the first free magnetic layer 56 and the second free magnetic layer 60 is preferably formed of one of the following; or of an alloy of two or more thereof: Ru, Rh, Ir, Cr, Re, and Cu. Further, it is preferable that the film thickness of the nonmagnetic intermediate layer 59 be in the range of 5.5 to 10.0 ångström. Within this range, an exchange coupling magnetic field of 500 (Oe) or greater can be obtained. It is even more preferable for the film thickness of the nonmagnetic intermediate layer 59 to be in the range of 5.9 to 9.4 ångström, since an exchange coupling magnetic field of 1,000 (Oe) or greater can be obtained.

Adjusting the film thickness ratio of the first pinned magnetic layer 52 and the second pinned magnetic layer 54, the film thickness of both the nonmagnetic intermediate layer 53 and antiferromagnetic layer 51, the film thickness ratio of the first free magnetic layer 56 and the second free magnetic layer 60, and the film thickness of the nonmagnetic intermediate layer 59, within the above value ranges, allows a ΔMR (rate of resistance change) around that obtained by known arrangements to be obtained.

Next, the method of thermal treatment will be described. With the spin-valve magnetoresistive thin film element shown in FIGS. 7 and 8, an antiferromagnetic material which generates an exchange coupling magnetic field (exchange anisotropic magnetic field) at the interface between the first pinned magnetic layer 52 and the antiferromagnetic layer 51 is used, such as subjecting a PtMn alloy to thermal treatment. Accordingly, there is the need to appropriately control the direction and magnitude of the magnetic field applied in the thermal treatment, so as to adjust the direction of magnetization of the first pinned magnetic layer 52 and the second pinned magnetic layer 54.

For instance, if the Ms·tP1 of the first pinned magnetic layer 52 is greater than the Ms·tP2 of the second pinned magnetic layer 54, a magnetic field of 100 (Oe) to 1 k(Oe), or 5 k(Oe) should be applied in the direction that the magnetization of the first pinned magnetic layer 52 is to be directed. For example, if the first pinned magnetic layer 52 is to be directed in the direction Y shown in the Figures, a magnetic field of 100 (Oe) to 1 k(Oe) is applied in the direction Y. The first pinned magnetic layer 52 with the large Ms tP1 is directed in the direction of the magnetic field, i.e., in the direction Y, and the magnetization of the first pinned magnetic layer 52 is pinned in the direction Y in the Figure, due to the exchange coupling magnetic field (exchange anisotropic magnetic field) generated at the interface between the first pinned magnetic layer 52 and the antiferromagnetic layer 51. On the other hand, the magnetization of the second pinned magnetic layer 54 is pinned in the direction opposite to Y in the Figure, due to the exchange coupling magnetic field (RKKY interaction) generated between the first pinned magnetic layer 52 and second pinned magnetic layer 54 or, a magnetic field of 5 k(Oe) or greater is applied in the direction Y. This exchange coupling magnetic field (RKKY interaction) between the first pinned magnetic layer 52 and second pinned magnetic layer 54 is around 1 k(Oe) to 5 k(Oe), so applying a magnetic field of 5 k(Oe) or greater causes the magnetization of the first pinned magnetic layer 52 and the magnetization of the second pinned magnetic layer 54 to be both directed in the direction Y. At this time, the magnetization of the first pinned magnetic layer 52 is pinned in the direction Y, due to the exchange coupling magnetic field (exchange anisotropic magnetic field) generated at the interface between the first pinned magnetic layer 52 and the antiferromagnetic layer 51. On the other hand, at the time that the magnetic field of 5 k(Oe) or greater is removed, the magnetization of the second pinned magnetic layer 54 is directed and pinned in the opposite direction to Y in the Figure, by the exchange coupling magnetic field (RKKY interaction) between the first pinned magnetic layer 52 and second pinned magnetic layer 54.

Alternatively, if the Ms·tP1 of the first pinned magnetic layer 52 is smaller than the Ms·tP2 of the second pinned magnetic layer 54, a magnetic field of 100 (Oe) to 1 k(Oe) should be applied in the direction opposite to the direction in which the magnetization of the first pinned magnetic layer 52 is to be directed, or a magnetic field of 5 k(Oe) or greater should be applied in the direction that the magnetization of the first pinned magnetic layer 52 is to be directed. For example, if the first pinned magnetic layer 52 is to be directed in the direction Y shown in the Figures, a magnetic field of 100 (Oe) to 1 k(Oe) is applied in the direction opposite to Y. Accordingly, the second pinned magnetic layer 54 with the large Ms·tP2 is directed in the direction of the magnetic field, i.e., in the direction opposite to Y, and the magnetization of the first pinned magnetic layer 52 is directed in the direction Y in the Figure, due to the exchange coupling magnetic field (RKKY interaction) between the first pinned magnetic layer 52 and second pinned magnetic layer 54. The magnetization of the first pinned magnetic layer 52 is pinned in the Y direction due to the exchange coupling magnetic field (exchange anisotropic magnetic field) generated at the interface between the first pinned magnetic layer 52 and the antiferromagnetic layer 51, and the magnetization of the second pinned magnetic layer 54 is pinned in the direction opposite to Y in the Figure. Or, a magnetic field of 5 k(Oe) or greater is applied in the direction Y. Applying a magnetic field of 5 k(Oe) or greater causes the magnetization of the first pinned magnetic layer 52 and the magnetization of the second pinned magnetic layer 54 to be both directed in the direction Y, and the magnetization of the first pinned magnetic layer 52 to be pinned in the direction Y, due to the exchange coupling magnetic field (exchange anisotropic magnetic field) generated at the interface between the first pinned magnetic layer 52 and the antiferromagnetic layer 51. At the time that the magnetic field of 5 k(Oe) or greater is removed, the magnetization of the second pinned magnetic layer 54 which had been directed in the direction Y, is directed and pinned in the opposite direction to Y in the Figure, by the exchange coupling magnetic field (RKKY interaction) between the first pinned magnetic layer 52 and second pinned magnetic layer 54.

Also, with the present invention, with the direction X and direction Y in the Figure as the positive direction, and with the direction opposite to X and the direction opposite to Y in the Figure as the negative direction, it is preferable that the absolute value of the so-called synthesized magnetic moment obtained by adding the Ms·tF1 of the first free magnetic layer 56 and the Ms·tF2 of the second free magnetic layer 60 be greater than the absolute value of the synthesized magnetic moment obtained by adding the Ms·tP1 of the first pinned magnetic layer 52 and the Ms·tP2 of the second pinned magnetic layer 54. That is to say, |(Ms·tF1+Ms·tF2)/(Ms·tP1+Ms·tP2)|>1 is desirable.

An arrangement wherein the absolute value of the synthesized magnetic moment of the first free magnetic layer 56 and second free magnetic layer 60 is greater than the absolute value of the synthesized magnetic moment of the first pinned magnetic layer 52 and second pinned magnetic layer 54 has the advantages that the magnetization of the first free magnetic layer 56 and second free magnetic layer 60 is not easily affected by the synthesized magnetic moment of the first pinned magnetic layer 52 and second pinned magnetic layer 54, and the magnetization of the first free magnetic layer 56 and second free magnetic layer 60 rotates with higher sensitivity of external magnetic fields, thereby enabling increases in output.

Figure 9:
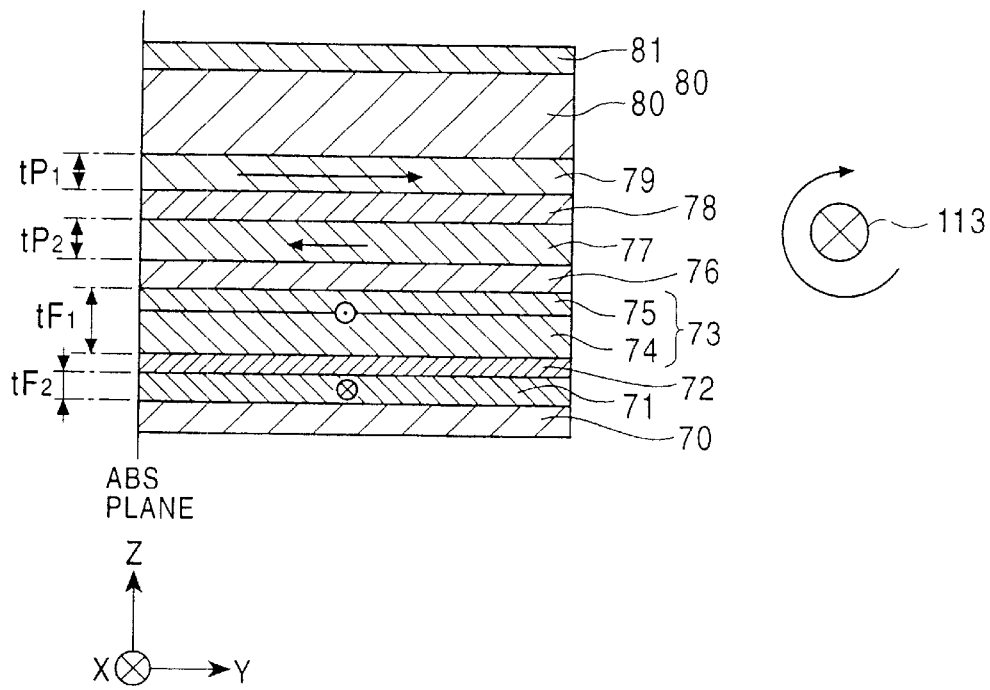
FIG. 9 is a side cross-sectional view of a spin-valve magnetoresistive thin film element according to a fifth embodiment of the present invention.
Figure 10:
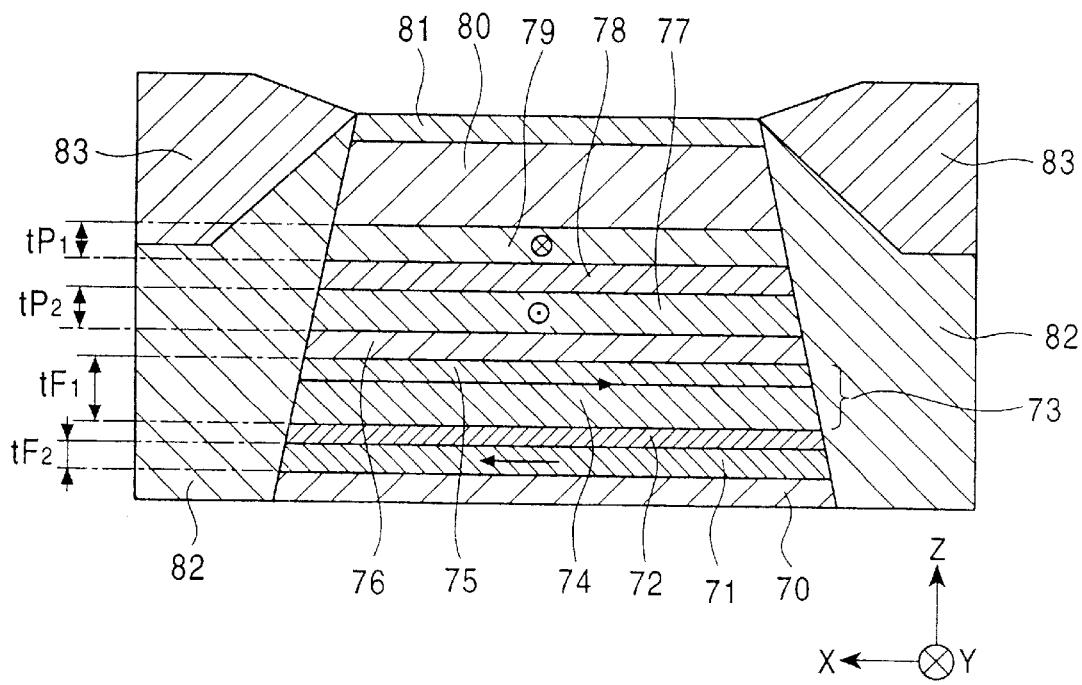
FIG. 10 is a cross-sectional view of the spin-valve magnetoresistive thin film element shown in FIG. 9, viewed from the side facing the recording medium.

FIG. 9 is a side cross-sectional view schematically showing the structure of a spin-valve magnetoresistive thin film element according to a fifth embodiment of the present invention, and FIG. 10 is a cross-sectional view of the spin-valve magnetoresistive thin film element shown in FIG. 9, viewed from the side facing the recording medium.

This spin-valve magnetoresistive thin film element has been formed by reversing the order of layers in the spin valve magnetoresistive thin film element shown in FIGS. 7 and 8.

That is, the spin-valve magnetoresistive thin film element comprises from the bottom: a base layer 70, second free magnetic layer 71, nonmagnetic intermediate layer 72, first free magnetic layer 73, nonmagnetic electrically conductive layer 76, second pinned magnetic layer 77, nonmagnetic intermediate layer 78, first pinned magnetic layer 79, antiferromagnetic layer 80, and protective layer 81, in that order.

The base layer 70 and protective layer 81 are formed of Ta or the like. The antiferromagnetic layer 80 is preferably formed of a PtMn alloy. PtMn alloys have better corrosion-resistant properties than NiMn alloys or FeMn alloys conventionally used for antiferromagnetic layers, the blocking temperature is high, and a large exchange coupling magnetic field can be obtained. Also, with the present invention, X—Mn alloys (wherein X is one or a plurality of the following elements: Pd, Ir, Rh, Ru, Os) or PtMn—X alloys (wherein X is one or a plurality of the following elements: Pd, Ir, Rh, Ru, Os, Au, Ag) may be used instead of PtMn alloys.

The first pinned magnetic layer 79 and second pinned magnetic layer 77 are comprised of Co film, an NiFe alloy, Co—Fe alloy, Co—Ni alloy, Co—NiFe alloy, or the like. Also, the nonmagnetic intermediate layer 78 is preferably formed of one of the following; or of an alloy of two or more thereof: Ru, Rh, Ir, Cr, Re, and Cu. Further, the nonmagnetic electrically conductive layer 76 is formed of Cu or the like.

With the spin-valve magnetoresistive thin film element shown in FIGS. 9 and 10, (the thickness tP1 of the first pinned magnetic layer 79)/(the thickness tP2 of the second pinned magnetic layer 77) preferably is in a range of 0.33 to 0.95, or in a range of 1.05 to 4, and that the film thickness tP1 of the first pinned magnetic layer 79 and the film thickness tP2 of the second pinned magnetic layer 77 both be in a range of 10 to 70 ångström, and also that |the film thickness tP1 of the first pinned magnetic layer 79 minus the film thickness tP2 of the second pinned magnetic layer 77|≧2 ångström. Appropriate adjustment within these ranges enables an exchange coupling magnetic field of 500 (Oe) or greater to be obtained.

Further, with the present invention, (the film thickness tP1 of the first pinned magnetic layer 79)/(the film thickness tP2 of the second pinned magnetic layer 77) is even more preferably in a range of 0.53 to 0.95, or in a range of 1.05 to 1.8, and the film thickness tP1 of the first pinned magnetic layer 79 and the film thickness tP2 of the second pinned magnetic layer 77 both are even more preferably in a range of 10 to 50 ångström, with |the film thickness tP1 of the first pinned magnetic layer 79 minus the film thickness tP2 of the second pinned magnetic layer 77|≧2 ångström. Appropriate adjustment within these ranges enables an exchange coupling magnetic field of 1,000 (Oe) or greater to be obtained.

As described above, unless there is a certain degree of difference between the magnetic film thickness Ms·tP1 of the first pinned magnetic layer 79 and the magnetic film thickness Ms·tP2 of the second pinned magnetic layer 77, the magnetization state does not easily achieve a Ferri-state. On the other hand, if the difference between the magnetic film thickness Ms·tP1 of the first pinned magnetic layer 79 and the magnetic film thickness Ms·tP2 of the second pinned magnetic layer 77 is too large, this leads to undesirable deterioration in the exchange coupling magnetic field. Accordingly, with the present invention, as with the film thickness ratio of the film thickness tP1 of the first pinned magnetic layer 79 and the film thickness tP2 of the second pinned magnetic layer 77, it is preferable that (the magnetic film thickness Ms·tP1 of the first pinned magnetic layer 79)/(the magnetic film thickness Ms·tP2 of the second pinned magnetic layer 77) be in a range of 0.33 to 0.95, or in a range of 1.05 to 4. Also, with the present invention, it is preferable that the magnetic film thickness Ms·tP1 of the first pinned magnetic layer 79 and the magnetic film thickness Ms·tP2 of the second pinned magnetic layer 77 be in a range of 10 to 70 (ångström tesla), and that an absolute value obtained by subtracting the magnetic film thickness Ms·tP2 of the second pinned magnetic layer 77 from the magnetic film thickness Ms·tP1 of the first pinned magnetic layer 79 is equal to or greater than 2 (ångström tesla).

It is even more preferable that (the magnetic film thickness Ms tP1 of the first pinned magnetic layer 79)/(the magnetic film thickness Ms·tP2 of the second pinned magnetic layer 77) be in a range of 0.53 to 0.95 or in a range of 1.05 to 1.8. Also, in the above ranges, it is preferable that the magnetic film thickness Ms·tp1 of the first pinned magnetic layer 79 and the magnetic film thickness Ms·tP2 of the second pinned magnetic layer 77 be in a range of 10 to 50 (angstrom tesla), and that an absolute value obtained by subtracting the magnetic film thickness Ms·tP2 of the second pinned magnetic layer 77 from the magnetic film thickness Ms·tP1 of the first pinned magnetic layer 79 is equal to or greater than 2 (angstrom tesla).

Also, it is preferable that the film thickness of the nonmagnetic intermediate layer 78 introduced between the first pinned magnetic layer 79 and second pinned magnetic layer 77 be in the range of 2.5 to 6.4, or 6.6 to 10.7 angstrom. Within this range, an exchange coupling magnetic field of 500 (Oe) or greater can be obtained. It is further preferable for this to be in the range of 2.8 to 6.2 angstrom or 6.8 to 10.3 angstrom, since an exchange coupling magnetic field of 1,000 (Oe) or greater can be obtained.

Also, a thickness of 90 angstrom or greater for the antiferromagnetic layer 80 is preferable. An exchange coupling magnetic field of 500 (Oe) or greater can be obtained within this range. Further preferable is a thickness of 100 angstrom or greater, whereby an exchange coupling magnetic field of 1,000 (Oe) or greater can be obtained within this range.

With the spin-valve magnetoresistive thin film element shown in FIG. 10, the free magnetic layer is divided and formed of two layers, with a first free magnetic layer 73 being formed on the side coming into contact with the nonmagnetic electrically conductive layer 76, and the other free magnetic layer comprising the second free magnetic layer 71. As shown in FIG. 10, the first free magnetic layer 73 is formed of two layers, with a the film 75 formed on the side coming into contact with the nonmagnetic electrically conductive layer 76 being formed of a Co film. The layer 74 formed on the side coming into contact with the nonmagnetic intermediate layer 72, and the second free Magnetic layer 71 are comprised of, e.g., an NiFe alloy, Co—Fe alloy, Co—Ni alloy, Co—NiFe alloy, or the like.

The spin-valve film from the base layer 70 through the protective layer 81 shown in FIG. 10 has the sides thereof inclined, so the spin-valve film is formed in the shape of a trapezoid. Hard magnetic bias layers 82 and electrically conductive layers 83 are formed on either side of the spin valve film. The hard magnetic bias layers 82 are formed of a Co—Pt alloy, Co—Cr—Pt alloy, etc., and the electrically conductive layers 83 are formed of Cu, Cr, or the like.

A nonmagnetic intermediate layer 72 is introduced between the first free magnetic layer 73 and second free magnetic layer 71 shown in FIG. 10, so the magnetism of the first free magnetic layer 73 and the magnetism of the second free magnetic layer 71 are in a mutually antiparallel state (Ferri-state), due to an exchange coupling magnetic field (RKKY interaction) generated between the first free magnetic layer 73 and second free magnetic layer 71. With the spin-valve magnetoresistive thin film element shown in FIG. 10, the film thickness tF1 of the first free magnetic layer 73 is made to be greater than the film thickness tF2 of the second free magnetic layer 71, and also the Ms·tF1 of the first free magnetic layer 73 is made to be greater than the Ms·tF2 of the second free magnetic layer 71, so if a bias magnetic field is applied from the hard magnetic bias layers 82 in the direction X in the Figures, the magnetization of the first free magnetic layer 73 with the greater Ms·tF1 is affected by the bias magnetic field so as to be aligned in the direction X in the Figure, and the magnetization of the second free magnetic layer 71 with the smaller Ms·tF2 is in a direction opposite to X in the Figure, due to the exchange coupling magnetic field (RKKY interaction) generated between the first free magnetic layer 73 and second free magnetic layer 71. Also, with the present invention, film thickness tF1 of the first free magnetic layer 73 may be made to be smaller than the film thickness tF2 of the second free magnetic layer 71, and also the Ms·tF1 of the first free magnetic layer 73 may be made to be smaller than the Ms·tF2 of the second free magnetic layer 71.

If an external magnetic field intrudes from the direction Y in the Figure, the magnetization of the first free magnetic layer 73 and second free magnetic layer 71 maintains the Ferri-state, and at the same time rotates due to being affected by the external magnetic field. Then, electrical resistance changes due to the relationship between the magnetization direction of the first free magnetic layer 73 which contributes to the ΔMR and the pinned magnetization of the second pinned magnetic layer 71, thereby detecting the signals of the external magnetic field.

With the present invention, the film thickness ratio between the film thickness tF1 of the first free magnetic layer 73 and the film thickness tF2 of the second free magnetic layer 71 is optimized, thereby allowing an even greater exchange coupling magnetic field to be obtained, and at the same time, allowing ΔMR around the same as with known arrangements to be obtained.

With the present invention, (the film thickness tF1 Of the first free magnetic layer 73/the film thickness tF1 of the second free magnetic layer 71) is preferably in a range of 0.56 to 0.83 or 1.25 to 5. Within this range, an exchange coupling magnetic field of 500 (Oe) or greater can be obtained. Also with the present invention, (the film thickness tF1 of the first free magnetic layer 73/the film thickness tF2 of the second free magnetic layer 71) is even more preferably in a range of 0.61 to 0.83 or 1.25 to 2.1. Within this range, an exchange coupling magnetic field of 1,000 (Oe) or greater can be obtained.

Also, unless there is a certain degree of difference between the magnetic film thickness Ms·tF1 of the first free magnetic layer 73 and the magnetic film thickness Ms·tF2 of the second free magnetic layer 71, the magnetization state does not easily achieve a Ferri-state. On the other hand, if the difference between the magnetic film thickness Ms·tF1 of the first free magnetic layer 73 and the magnetic film thickness Ms·tF2 of the second free magnetic layer 71 is too large, this leads to undesirable deterioration in the exchange coupling magnetic field. Accordingly, with the present invention, as with the film thickness ratio between the film thickness tF1 of the first free magnetic layer 73 and the film thickness tF2 of the second free magnetic layer 71, it is preferable that (the magnetic film thickness Ms·tF1 of the first free magnetic layer 73)/(the magnetic film thickness Ms·tF2 of the second free magnetic layer 71) be in a range of 0.56 to 0.83, or in a range of 1.25 to 5. It is further preferable with the present invention that (the magnetic film thickness Ms·tF1 of the first free magnetic layer 73)/(the magnetic film thickness Ms·tF2 of the second free magnetic layer 71) be in a range of 0.61 to 0.83, or in a range of 1.25 to 2.1.

Also, with the present invention, the nonmagnetic intermediate layer 72 introduced between the first free magnetic layer 73 and the second free magnetic layer 71 is preferably formed of one of the following; or of an alloy of two or more thereof: Ru, Rh, Ir, Cr, Re, and Cu. Further, it is preferable that the film thickness of the nonmagnetic intermediate layer 72 be in the range of 5.5 to 10.0 angstrom. Within this range, an exchange coupling magnetic field of 500 (Oe) or greater can be obtained. It is even more preferable for the film thickness of the nonmagnetic intermediate layer 72 to be in the range of 5.9 to 9.4 ångström. Within this range, an exchange coupling magnetic field of 1,000 (Oe) or greater can be obtained.

Adjusting the film thickness ratio of the first pinned magnetic layer 79 and the second pinned magnetic layer 77, the film thickness of the nonmagnetic intermediate layer 78 and antiferromagnetic layer 80, the film thickness ratio of the first free magnetic layer 73 and the second free magnetic layer 71, and the film thickness of the nonmagnetic intermediate layer 72, so as to be within the above ranges, allows a ΔMR (rate of resistance change) around that obtained by known arrangements to be obtained.

Next, the method of thermal treatment will be described. For instance, if the Ms·tP1 of the first pinned magnetic layer 79 is greater than the Ms·tP2 of the second pinned magnetic layer 77, a magnetic field of 100 (Oe) to 1 k(Oe), or 5 k(Oe) should be applied in the direction that the magnetization of the first pinned magnetic layer 79 is to be directed. Alternatively, if the Ms·tP1 of the first pinned magnetic layer 79 is smaller than the Ms·tP2 of the second pinned magnetic layer 77, a magnetic field of 100 (Oe) to 1 k(Oe) should be applied in the direction opposite to the direction in which the magnetization of the first pinned magnetic layer 79 is to be directed, or a magnetic field of 5 k(Oe) or greater should be applied in the direction that the magnetization of the first pinned magnetic layer 79 is to be directed. In the present invention, the magnetization of the first pinned magnetic layer 79 is pinned in the Y direction, and the magnetization of the second pinned magnetic layer 77 is pinned in the direction opposite to Y in the Figure. Or, the magnetization of the first pinned magnetic layer 79 is pinned in the direction opposite to Y, and the magnetization of the second pinned magnetic layer 77 is pinned in the direction Y in the Figure.

Also, with the present invention, with the direction X and direction Y in the Figure as the positive direction, and with the direction opposite to X and the direction opposite to Y in the Figure as the negative direction, it is preferable that the absolute value of the so-called synthesized magnetic moment obtained by adding the Ms·tF1 of the first free magnetic layer 73 and the Ms·tF2 of the second free magnetic layer 71 be greater than the absolute value of the synthesized magnetic moment obtained by adding the Ms·tP1 of the first pinned magnetic layer 79 and the Ms·tP2 of the second pinned magnetic layer 77. That is to say, |(Ms·tF1+Ms·tF2)/(Ms·tP1+Ms·tP2)|>1 is desirable.

An arrangement wherein the absolute value of the synthesized magnetic moment of the first free magnetic layer 73 and second free magnetic layer 71 is greater than the absolute value of the synthesized magnetic moment of the first pinned magnetic layer 79 and second pinned magnetic layer 77 has the advantages that the magnetization of the first free magnetic layer 79 and second free magnetic layer 77 is not easily affected by the synthesized magnetic moment of the first pinned magnetic layer 79 and second pinned magnetic layer 77, and the magnetization of the first free magnetic layer 73 and second free magnetic layer 71 rotates with higher sensitivity of external magnetic fields, thereby enabling increases in output.

Figure 11:
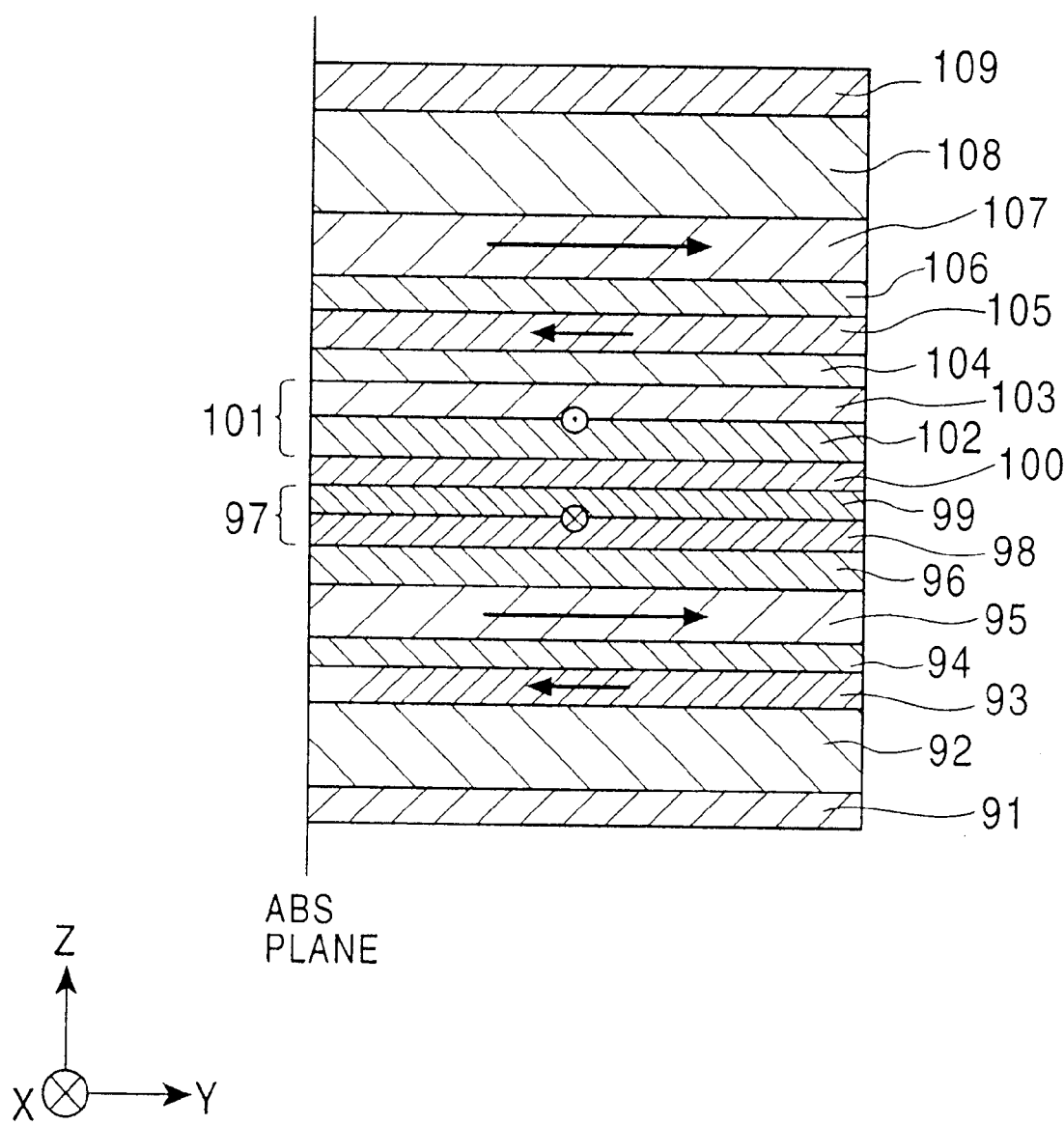
FIG. 11 is a side cross-sectional view of a spin-valve magnetoresistive thin film element according to a sixth embodiment of the present invention.
Figure 12:
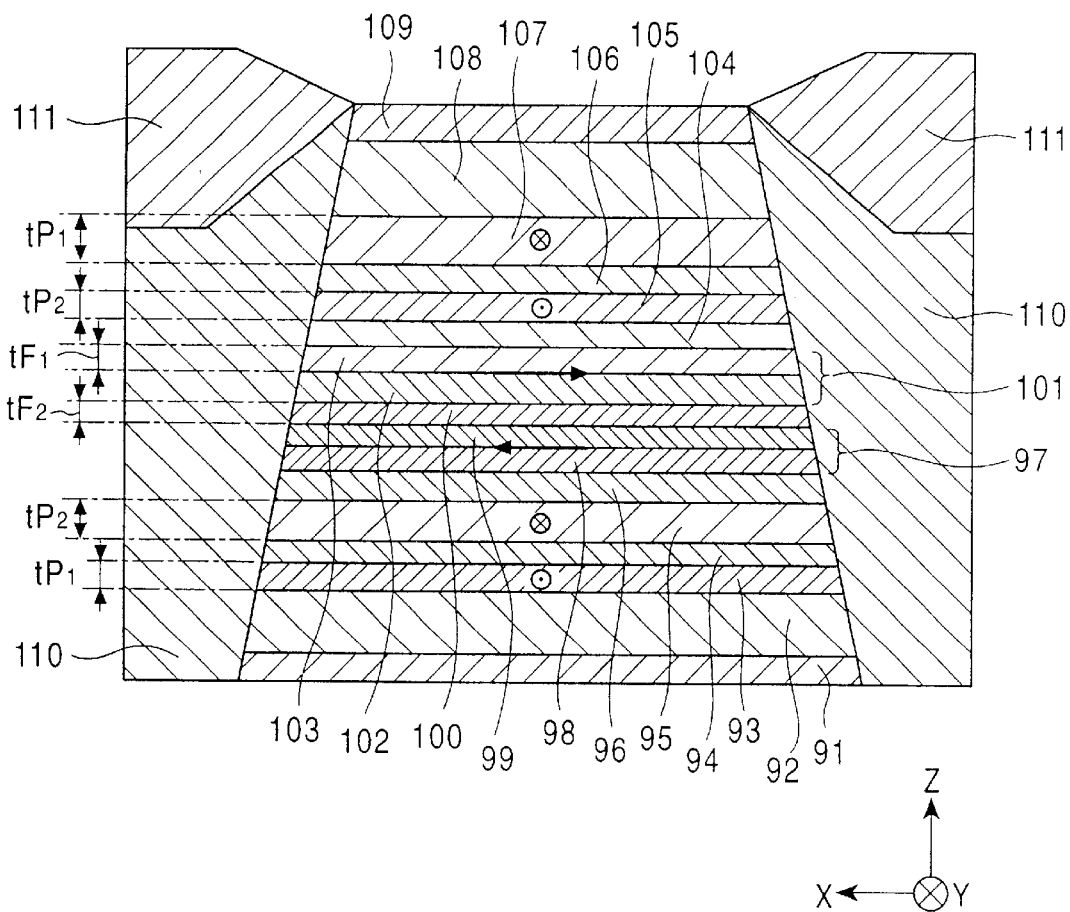
FIG. 12 is a cross-sectional view of the spin-valve magnetoresistive thin film element shown in FIG. 11, viewed from the side facing the recording medium.

FIG. 11 is a side cross-sectional view illustrating the structure of a spin-valve magnetoresistive thin film element according to a sixth embodiment of the present invention, and FIG. 12 is a cross-sectional view of the spin-valve magnetoresistive thin film element shown in FIG. 11, viewed from the side facing the recording medium;

This spin-valve magnetoresistive thin film element is a so-called dual spin-valve magnetoresistive thin film element comprising nonmagnetic electrically conductive layers, pinned magnetic layers, and antiferromagnetic layers formed above and below a free magnetic layer as the center thereof, with the free magnetic layers and pinned magnetic layers each being divided into two layers with nonmagnetic intermediate layers introduced therebetween.

The bottom-most layer shown in FIGS. 11 and 12 is a base layer 91, and formed on this base layer 91 are the following layers in order from the bottom up: an antiferromagnetic layer 92, first pinned magnetic layer (lower) 93, nonmagnetic intermediate layer (lower) 94, second pinned magnetic layer (lower) 95, nonmagnetic electrically conductive layer 96, second free magnetic layer 97, nonmagnetic intermediate layer 100, first free magnetic layer 101, nonmagnetic electrically conductive layer 104, second pinned magnetic layer (upper) 105, nonmagnetic intermediate layer (upper) 106, first pinned magnetic layer (upper) 107, antiferromagnetic layer 108, and protective layer 109.

First, description will be given regarding materials. It is preferable that the antiferromagnetic layers 92 and 108 be formed of a PtMn alloy. PtMn alloys have better corrosion-resistant properties than NiMn alloys or FeMn alloys conventionally used for antiferromagnetic layers, the blocking temperature is high, and a large exchange coupling magnetic field (exchange anisotropic magnetic field) can be obtained. Also, with the present invention, X—Mn alloys (wherein X is one or a plurality of the following elements: Pd, Ir, Rh, Ru, Os) or PtMn—X' alloys (wherein X, is one or a plurality of the following elements: Pd, Ir, Rh, Ru, Os, Au, Ag) may be used instead of the PtMn alloys.

The first pinned magnetic layers (lower) 93 and (upper) 107, and second pinned magnetic layers (lower) 95 and (upper) 105 are comprised of a Co film, an NiFe alloy, Co—Fe alloy, Co—Ni alloy, Co—NiFe alloy, or the like. Also, the nonmagnetic intermediate layers (lower) 94 and (upper) 106, formed between the first pinned magnetic layers (lower) 93 and (upper) 107, and second pinned magnetic layers (lower) 95 and (upper) 105, and the nonmagnetic intermediate layer 100 formed between the first free magnetic layer 101 and second free magnetic layer 97, are preferably formed of one of the following; or of an alloy of two or more thereof: Ru, Rh, Ir, Cr, Re, and Cu. Further, the nonmagnetic electrically conductive layers 96 and 104 formed of Cu or the like.

As shown in FIG. 11, the first free magnetic layer 101 and the second free magnetic layer 97 are comprised of two layers. The layer 103 of the first free magnetic layer 101, and the layer 98 of the second free magnetic layer 97, formed to the side coming into contact with the nonmagnetic electrically conductive layers 96 and 104, are formed of Co films. Also, the layer 102 of the first free magnetic layer 101, and the layer 99 of the second free magnetic layer 97, with the nonmagnetic intermediate layer 100 introduced therebetween, are formed of an NiFe alloy, Co—Fe alloy, Co Ni alloy, Co—NiFe alloy, or the like.

Forming the layers 98 and 103 at the side coming into contact with the nonmagnetic electrically conductive layers 96 and 104 of Co films allows a greater ΔMR to be obtained, and also prevents dispersion of the nonmagnetic electrically conductive layers 96 and 104.

Next, the appropriate ranges for the film thickness of each layer will be described. It is preferable that the film thickness ratio between the film thickness tP1 of the first pinned magnetic layer (lower) 93 and the film thickness tP2 of the second pinned magnetic layer (lower) 95 formed below the free magnetic layer, and the film thickness ratio between the film thickness tp1 of the first pinned magnetic layer (upper) 107 and the film thickness tp2 of the second pinned magnetic layer (upper) 105 formed above the free magnetic layer be such wherein (film thickness tP1 of first pinned magnetic layer (lower) 93 and (upper) 107)/(film thickness tP2 of second pinned magnetic layer (lower) 95 and (upper) 105) is in a range of 0.33 to 0.95, or in a range of 1.05 to 4. Also, it is preferable that the film thickness of the first pinned magnetic layer (lower) 93 and (upper) 107, and the film thickness of the second pinned magnetic layer (lower) 95 and (upper) 105 be in a range of 10 to 70 ångström, and that |film thickness tp1 of first pinned magnetic layers (lower) 93 and (upper) 107 minus film thickness tP2 of second pinned magnetic layers (lower) 95 and (upper) 105 |≧2 ångström. In the above ranges, an exchange coupling magnetic field of 500 (Oe) or greater can be obtained.

It is also preferable with the present invention that the (film thickness tp1 of first pinned magnetic layer (lower) 93, (upper) 107)/(film thickness tP2 of second pinned magnetic layer (lower) 95, (upper) 105) be in a range of 0.53 to 0.95, or in a range of 1.05 to 1.8, and moreover, that the film thickness tp1 of the first pinned magnetic layers (lower) 93 and (upper) 107, and the film thickness tP2 of the second pinned magnetic layers (lower) 95 and (upper) 105, be in a range of 10 to 50 ångström, and that film thickness tP1 of first pinned magnetic layers (lower) 93 and (upper) 107 minus film thickness tP2 of second pinned magnetic layers (lower) 95 and (upper) 105|≧2 ångström. In these ranges, an exchange coupling magnetic field of 1,000 (Oe) or greater can be obtained.

Further, as described above, with the present invention, an antiferromagnetic material is used for the antiferromagnetic layers 92 and 108, such as a PtMn alloy or the like which requires thermal treatment for generating an exchange coupling magnetic field (exchange anisotropic magnetic field) at the interface between the first pinned magnetic layers (lower) 93 and (upper) 107 and the antiferromagnetic layers 92 and 108.

However, dispersion of metal elements easily occurs at the interface between the antiferromagnetic layer 92 formed below the free magnetic layer and the first pinned magnetic layer (lower) 93, and a thermal dispersion layer is easily formed, so the magnetic layer serving as the first pinned magnetic layer (lower) 93 is thinner than the actual film thickness tP1. Accordingly, in order to approximately equalize the exchange coupling magnetic field generated in the layers above the free magnetic layer and the exchange coupling magnetic field generated in the layers below the free magnetic layer, it is preferable that the (film thickness tP1 of first pinned magnetic layer (lower) 93/film thickness tP2 of second pinned magnetic layer (lower) 95) formed below the free magnetic layer be greater than the (film thickness tP1 of first pinned magnetic layer (upper) 107/film thickness tP2 of second pinned magnetic layer (upper) 105) formed above the free magnetic layer. Equalizing the exchange coupling magnetic field generated in the layers above the free magnetic layer and the exchange coupling magnetic field generated in the layers below the free magnetic layer reduces deterioration of the exchange coupling magnetic field in the manufacturing process, and improves the reliability of the magnetic head.

As described above, unless there is a certain degree of difference between the magnetic film thickness Ms tP1 of the first pinned magnetic layers (lower) 93 and (upper) 107, and the magnetic film thickness MS tP2 of the second pinned magnetic layers (lower) 95 and (upper) 105, the magnetization state does not easily achieve a Ferri-state. On the other hand, if the difference between the magnetic film thickness Ms·tP1 of the first pinned magnetic layers (lower) 93 and (upper) 107, and the magnetic film thickness Ms·tP2 of the second pinned magnetic layers (lower) 95 and (upper) 105 is too large, this leads to undesirable deterioration in the exchange coupling magnetic field. Accordingly, with the present invention, as with the film thickness ratio of the film thickness tp1 of the first pinned magnetic layer (lower) 93 and (upper) 107, and the film thickness tP2 of the second pinned magnetic layer (lower) 95 and (upper) 105, it is preferable that (the magnetic film thickness Ms·tp1, of the first pinned magnetic layers (lower) 93 and (upper) 107)/(the magnetic film thickness Ms·tP2 of the second pinned magnetic layers (lower) 95 and (upper) 105) be in a range of 0.33. to 0.95, or in a range of 1.05 to 4. Also, with the present invention, it is preferable that the magnetic film thickness Ms·tP1 of the first pinned magnetic layers (lower) 93 and (upper) 107 and the magnetic film thickness Ms tP2 of the second pinned magnetic layers (lower) 95 and (upper) 105 be in a range of 10 to 70 (ångström tesla), and that an absolute value obtained by subtracting the magnetic film thickness Ms·tp2 of the second pinned magnetic layers (lower) 95 and (upper) 105 from the magnetic film thickness Ms tP1 of the first pinned magnetic layers (lower) 93 and (upper) 107 be equal to or greater than 2 (ångström tesla).

It is even more preferable that (the magnetic film thickness Ms·tP1 of the first pinned magnetic layers (lower) 93 and (upper) 107)/(the magnetic film thickness Ms·tP2 of the second pinned magnetic layers (lower) 95 and (upper) 105) be in a range of 0.53 to 0.95 or 1.05 to 1.8. Also, in the above ranges, it is preferable that the magnetic film thickness Ms·tP1 of the first pinned magnetic layers (lower) 93 and (upper) 107 and the magnetic film thickness Ms·tP2 of the second pinned magnetic layers (lower) 95 and (upper) 105 be in a range of 10 to 50 (ångström tesla), and that an absolute value obtained by subtracting the magnetic film thickness Ms·tP2 of the second pinned magnetic layers (lower) 95 and (upper) 105 from the magnetic film thickness Ms·tP1 of the first pinned magnetic layers (lower) 93 and (upper) 107 be equal to or greater than 2 (ångström tesla).

Also, with the present invention, the film thickness value of the nonmagnetic intermediate layer (lower) 94, introduced between the first pinned magnetic layer (lower) 93 and second pinned magnetic layer (lower) 95 formed below the free magnetic layer, is preferably in the range of 3.6 to 9.6 ångström. Within this range, an exchange coupling magnetic field of 500 (Oe) or greater can be obtained. It is further preferable that this film thickness be in the range of 4 to 9.4 ångström. Within this range, an exchange coupling magnetic field of at least 1,000 (Oe) or greater can be obtained.

Also, the film thickness value of the nonmagnetic intermediate layer (upper) 106, introduced between the first pinned magnetic layer (upper) 107 and second pinned magnetic layer (upper) 105 formed above the free magnetic layer, is preferably in the range of 2.5 to 6.4 ångström, or in the range of 6.6 to 10.7 ångström. Within this range, an exchange coupling magnetic field of 500 (Oe) or greater can be obtained. It is further preferable that this film thickness be in the range of 2.8 to 6.2 ångström, or in the range of 6.8 to 10.3 ångström. Within this range, an exchange coupling magnetic field of at least 1,000 (Oe) or greater can be obtained.

Also, with the present invention, it is preferable that the thickness of the antiferromagnetic layers 92 and 108 be at least 100 ångström or greater, since thickness of at least 100 ångström or greater for the antiferromagnetic layers 92 and 108 can obtain an exchange coupling magnetic field of at least 500 (Oe) or greater. Further, with the present invention, a thickness of at least 110 ångström or greater for the antiferromagnetic layers 92 and 108 can obtain an exchange coupling magnetic field of 1,000 (Oe) or greater.

Also according to the present invention, with the film thickness of the first free magnetic layer 101 as tF1, and with the film thickness of the second free magnetic layer 97 as tF2, (the film thickness tF1 of the first free magnetic layer 101/the film thickness tF2 of the second free magnetic layer 97) is preferably in a range of 0.56 to 0.83 or 1.25 to 5. Within this range, an exchange coupling magnetic field of 500 (Oe) or greater can be obtained. Also, (the film thickness of the first free magnetic layer/the film thickness of the second free magnetic layer) is even more preferably in a range of 0.61 to 0.83 or 1.25 to 2.1. Within this range, an exchange coupling magnetic field of 1,000 (Oe) or greater can be obtained.

Also, unless there is a certain degree of difference between the magnetic film thickness Ms·tF1 of the first free magnetic layer 101 and the magnetic film thickness Ms·tF2 Of the second free magnetic layer 97, the magnetization state does not easily achieve a Ferri-state. On the other hand, if the difference between the magnetic film thickness Ms·tF1 of the first free magnetic layer 101 and the magnetic film thickness Ms·tF2 of the second free magnetic layer 97 is too large, this leads to undesirable deterioration in the exchange coupling magnetic field. Accordingly, with the present invention, as with the film thickness ratio between the film thickness tF1 of the first free magnetic layer 101 and the film thickness tF2 of the second free magnetic layer 97, it is preferable that (the magnetic film thickness Ms·tF1 of the first free magnetic layer 101)/(the magnetic film thickness Ms·tF2 of the second free magnetic layer 97) be in a range of 0.56 to 0.83, or in a range of 1.25 to 5. It is further preferable with the present invention that (the magnetic film thickness Ms·tF1 of the first free magnetic layer 101)/(the magnetic film thickness Ms·tF2 of the second free magnetic layer 97) be in a range of 0.61 to 0.83, or in a range of 1.25 to 2.1.

Also, regarding the nonmagnetic intermediate layer 100 introduced between the first free magnetic layer 101 and the second free magnetic layer 97, it is preferable that the film thickness thereof be in the range of 5.5 to 10.0 ångström, since within this range, an exchange coupling magnetic field of 500 (Oe) or greater can be obtained. It is even more preferable for the film thickness of the nonmagnetic intermediate layer 100 to be in the range of 5.9 to 9.4 ångström, since an exchange coupling magnetic field of 1,000 (Oe) or greater can be obtained in these ranges.

According to the present invention, appropriately adjusting the film thickness ratio of the first pinned magnetic layers (lower) 93 and (upper) 107 and the second pinned magnetic layers (lower) 95 and (upper) 105; the film thickness of the first pinned magnetic layers (lower) 93 and (upper) 107 and the second pinned magnetic layers (lower) 95 and (upper) 105, the nonmagnetic intermediate layers (lower) 94 and (upper) 106, and antiferromagnetic layers 92 and 108; and further the film thickness ratio of the first free magnetic layer 101 and the second free magnetic layer 97; and the film thickness of the nonmagnetic intermediate layer 100; so as to be in the above ranges, allows a ΔMR around that obtained by known arrangements to be obtained.

Now, with the dual spin-valve magnetoresistive thin film element shown in FIGS. 11 and 12, the magnetization of each of the second pinned magnetic layers (lower) 95 and (upper) 105 formed above and below the free magnetic layer need to be in mutually opposing directions. This is due to the fact that the free magnetic layer is divided into the first free magnetic layer 101 and second free magnetic layer 97, and that the magnetization of the first free magnetic layer 101 and the magnetization of the second free magnetic layer 97 are in an antiparallel state.

For example, as shown in FIGS. 11 and 12, if the magnetization of the first free magnetic layer 101 is magnetized in the opposite direction of the direction X in the Figures, the magnetization of the second free magnetic layer 97 is in the state of being magnetized in the direction X due to the exchange coupling magnetic field (RKKY interaction) between the first free magnetic layer 101 and second free magnetic layer 97. The magnetization of the first free magnetic layer 101 and the second free magnetic layer 97 maintains a Ferri-state, but is inverted upon being affected by an external magnetic field.

With the dual spin-valve magnetoresistive thin film element shown in FIGS. 11 and 12, the magnetization of the first free magnetic layer 101 and the second free magnetic layer 97 are both layers contributing to the ΔMR, with electric resistance changing due to the relationship between the fluctuating magnetization of the first free magnetic layer 101 and the second free magnetic layer 97, and the pinned magnetism of the second pinned magnetic layers (lower) 95 and (upper) 105. In order to exhibit the functions of the dual spin-valve magnetoresistive thin film element from which a greater ΔMR can be expected than with a single spin-valve magnetoresistive thin film element, there is the need to control the direction of the magnetization of the second pinned magnetic layers (lower) 95 and (upper) 105 so that the change in resistance of the first free magnetic layer 101 and second pinned magnetic layer (upper) 105, and the change in resistance of the second free magnetic layer 97 and second pinned magnetic layer (lower) 95, both demonstrate the same fluctuation. That is, the arrangement should be such that if the change in resistance of the first free magnetic layer 101 and second pinned magnetic layer (upper) 105 reaches a maximum value, the change in resistance of the second free magnetic layer 97 and second pinned magnetic layer (lower) 95 also reaches a maximum value, and that if the change in resistance of the first free magnetic layer 101 and second pinned magnetic layer (upper) 105 reaches a minimum value, the change in resistance of the second free magnetic layer 97 and second pinned magnetic layer (lower) 95 also reaches a minimum value.

Accordingly, with the dual spin-valve magnetoresistive thin film element shown in FIGS. 11 and 12, the magnetization of the first free magnetic layer 101 and the second free magnetic layer 97 are magnetized in an antiparallel manner. Thus is the need to magnetize the magnetization of the second pinned magnetic layer (upper) 105 and the magnetization of the second pinned magnetic layer (lower) 95 in mutually opposing directions.

In light of the above, with the present invention, the magnetization of the second pinned magnetic layer (upper) 105 and the magnetization of the second pinned magnetic layer (lower) 95 are pinned in opposing directions. However there is the need to appropriately adjust the Ms t of each pinned magnetic layer, and the direction and magnitude of the magnetic field applied during thermal treatment, in order to perform such control of magnetization direction.

First, regarding the Ms·t of each pinned magnetic layer, it is necessary that the Ms·tP1 of the first pinned magnetic layer (upper) 107 formed above the free magnetic layer is made to be greater than the Ms·tP2 of the second pinned magnetic layer (upper) 105, and the Ms·tP1 of the first pinned magnetic layer (lower) 93 formed below the free magnetic layer is made to be smaller than the Ms·tP2 of the second pinned magnetic layer (lower) 95, or that the Ms·tP1 of the first pinned magnetic layer (upper) 107 formed above the free magnetic layer is made to be smaller than the Ms·tP2 of the second pinned magnetic layer (upper) 105, and the Ms·tP1 of the first pinned magnetic layer (lower) 93 formed below the free magnetic layer is made to be greater than the Ms·tP2 of the second pinned magnetic layer (lower) 95.

With the present invention, an antiferromagnetic material is used for the antiferromagnetic layers 92 and 108, such as a PtMn alloy or the like which requires annealing (thermal treatment) in a magnetic field for generating an exchange coupling magnetic field at the interface between the first pinned magnetic layers (lower) 93 and (upper) 107 and the antiferromagnetic layers 92 and 108, so the direction and magnitude of the magnetic field applied during this thermal treatment must be appropriately adjusted. With the present invention, if the Ms·tP1 of the first pinned magnetic layer (upper) 107 formed above the free magnetic layer is greater than the Ms·tP2 of the second pinned magnetic layer (upper) 105, and the Ms·tP1 of the first pinned magnetic layer (lower) 93 formed below the free magnetic layer is smaller than the Ms·tP2 of the second pinned magnetic layer (lower) 95, a magnetic field of 100 (Oe) to 1 k(Oe) is applied in the direction in which the magnetization of the first pinned magnetic layer (upper) 107 formed above the free magnetic layer is to be directed.

For example, as shown in FIG. 11, if the magnetization of the first pinned magnetic layer (upper) 107 is to be directed in the direction Y in the Figure, a magnetic field of 100 (Oe) to 1 k(Oe) is applied in the direction Y. At this point, the first pinned magnetic layer (upper) 107 with the greater Ms·tp1, and the second pinned magnetic layer (lower) 95 formed below the free magnetic layer are both turned in the direction of the applied magnetic field, i.e., the direction Y in the Figure. On the other hand, the magnetization of the second pinned magnetic layer (upper) 105 with the smaller Ms tP1 formed above the free magnetic layer is magnetized in a manner antiparallel with the magnetization direction of the first pinned magnetic layer (upper) 107, due to the exchange coupling magnetic field (RKKY interaction) between the second pinned magnetic layer (upper) 105 and the first pinned magnetic layer (upper) 107. In the same way, the magnetization of the first pinned magnetic layer (lower) 93 with the smaller Ms tP2 formed below the free magnetic layer attempts to attain a Ferri-state with the magnetization of the second pinned magnetic layer (lower) 95 and is magnetized in the opposite direction to Y. The magnetization of the first pinned magnetic layer (upper) 107 formed above the free magnetic layer is pinned in the direction Y by means of the exchange coupling magnetic field (exchange anisotropic magnetic field) generated at the interface between the first pinned magnetic layer (upper) 107 and the antiferromagnetic layer 108 at the time of thermal treatment, and the magnetization of the second pinned magnetic layer (upper) 105 is pinned in the opposite direction to Y. In the same way, magnetization of the first pinned magnetic layer (lower) 93 formed below the free magnetic layer is pinned in the direction opposite to Y by means of the exchange coupling magnetic field (exchange anisotropic magnetic field), and the magnetization of the second pinned magnetic layer (lower) 95 is pinned in the direction Y.

Also, if the Ms·tP1 of the first pinned magnetic layer (upper) 107 formed above the free magnetic layer is made to be smaller than the Ms·tP2 of the second pinned magnetic layer (upper) 105, and the Ms·tP1 of the first pinned magnetic layer (lower) 93 formed below the free magnetic layer is made to be greater than the Ms·tP2 of the second pinned magnetic layer (lower) 95, a magnetic field of 100 (Oe) to 1 k(Oe) is applied in the direction in which the magnetization of the first pinned magnetic layer (lower) 93 formed below the free magnetic layer is to be directed.

In this way, magnetizing the second pinned magnetic layers (lower) 95 and (upper) 105 formed above and below the free magnetic layer in opposite directions allows a ΔMR around that obtained by known dual spin-valve magnetoresistive thin film elements to be obtained.

Also, with the present invention, in order to arrange for the magnetization of the first free magnetic layer 101 and the magnetization of the second free magnetic layer 97 which are in a Ferri-state to be inverted with better sensitivity to external magnetic fields, the synthesized magnetic moment obtained by adding the magnetic moment of the first free magnetic layer 101 and the magnetic moment of the second free magnetic layer 97 should be greater than the synthesized magnetic moment obtained by adding the magnetic moment of the first pinned magnetic layer (lower) 93 and the magnetic moment of the second pinned magnetic layer (lower) 95 formed below the free magnetic layer, and the synthesized magnetic moment obtained by adding the magnetic moment of the first pinned magnetic layer (upper) 107 and the magnetic moment of the second pinned magnetic layer (upper) 105 formed above the free magnetic layer. That is to say, for example, with magnetic moments in the direction X and direction Y in the Figure as the positive values, and with magnetic moments in the direction opposite to X and the direction opposite to Y in the Figure as negative values, it is preferable that the synthesized magnetic moment |Ms·tF1+Ms·tF2| be greater than the synthesized magnetic moment |Ms·tP1+Ms·tP2| of the first pinned magnetic layer (upper) 107 and the magnetic moment of the second pinned magnetic layer (upper) 105, and the synthesized magnetic moment |Ms·tP1+Ms·tP2| of the first pinned magnetic layer (lower) 93 and the second pinned magnetic layer (lower) 95.

As described above, with the spin-valve magnetoresistive thin film elements shown in FIG. 7 through FIG. 12, not only are the pinned magnetic layers divided into two layers, but the free magnetic layer is divided into a first free magnetic layer and second free magnetic layer with a nonmagnetic intermediate layer introduced therebetween, and the magnetization of the two free magnetic layers is placed in an antiparallel state (Ferri-state) by the exchange coupling magnetic field (RKKY interaction) generated between the two free magnetic layers, thereby enabling the magnetization of the first free magnetic layer and second free magnetic layer to be inverted with good sensitivity to external magnetic fields.

Also, according to the present invention, forming the film thickness ratio of the first free magnetic layer and the second free magnetic layer, the film thickness of the nonmagnetic intermediate layer introduced between the first free magnetic layer and the second free magnetic layer, or the film thickness ratio of the first pinned magnetic layer and the second pinned magnetic layer, the nonmagnetic intermediate layer introduced between the first pinned magnetic layer and the second pinned magnetic layer, and the antiferromagnetic layers, so as to be in the above ranges, increases the exchange coupling magnetic field. The magnetization state of the first pinned magnetic layer and the second pinned magnetic layer is pinned magnetization and the magnetization state of the first free magnetic layer and the second free magnetic layer is fluctuating magnetization, so a thermally stable Ferri-state can be maintained, and further, a ΔMR around that obtained by known arrangements can be obtained.

With the present invention, further adjusting the direction of the sensing current allows an even more thermally stable antiparallel state (Ferri-state) between the magnetization of the first pinned magnetic layer and the magnetization of the second pinned magnetic layer to be maintained.

With spin-valve magnetoresistive thin, film elements, electrically conductive layers are formed on either side of the layered structure formed of antiferromagnetic layers, pinned magnetic layers, nonmagnetic electrically conductive layers, and free magnetic layers, with sensing current being caused to flow from these electrically conductive layers. The sensing current mainly flows through the low-resistance nonmagnetic electrically conductive layers, the interface between the nonmagnetic electrically conductive layers and pinned magnetic layers, and the interface between the nonmagnetic electrically conductive layers and free magnetic layers. With the present invention, the pinned magnetic layer is divided into a first pinned magnetic layer and second pinned magnetic layer, and the sensing current mainly flows over the interface between the second pinned magnetic layer and nonmagnetic electrically conductive layer.

Causing the sensing current to flow forms a sensing current magnetic field due to the corkscrew rule. With the present invention, the direction in which the sensing current is caused to flow is adjusted so that the direction of the sensing current magnetic field is the same direction as that of the synthesized magnetic moment obtained by adding the magnetic moment of the first pinned magnetic layer and the magnetic moment of the second pinned magnetic layer.

With the spin-valve magnetoresistive thin film element shown in FIG. 1, a second pinned magnetic layer 54 is formed below the nonmagnetic electrically conductive layer 15. In this case, the direction of the sensing current magnetic field is matched with the magnetization direction of the pinned magnetic layer with the greater magnetic moment (i.e., either the first pinned magnetic layer 52 or second pinned magnetic layer 54).

As shown in FIG. 1, the magnetic moment of the second pinned magnetic layer 54 is greater than the magnetic moment of the first pinned magnetic layer 52, and the magnetic moment of the second pinned magnetic layer 54 is in the direction opposite to Y in the Figure (i.e., to the left direction in the Figure). Accordingly, the synthesized magnetic moment obtained by adding the magnetic moment of the first pinned magnetic layer 52 and the magnetic moment of the second pinned magnetic layer 54 is in the direction opposite to Y in the Figure (i.e., to the left in the Figure).

As noted above, the nonmagnetic electrically conductive layer 15 is formed above the second pinned magnetic layer 54 and the first pinned magnetic layer 52. Accordingly, the direction in which the sensing current 112 flows should be controlled such that the sensing current magnetic field, formed by the sensing current 112 which flows centrally along the nonmagnetic electrically conductive layer 15, is directed in the left direction in the Figure below the nonmagnetic electrically conductive layer 15, thus matching the direction of the synthesized magnetic moment of the first pinned magnetic layer 52 and the second pinned magnetic layer 54, and the direction of the sensing current magnetic field.

As shown in FIG. 1, the sensing current 112 is caused to flow in the direction X in the Figure, due to the corkscrew rule. The sensing current magnetic field due to the sensing current is formed so as to turn to the right as viewed in the Figure. Accordingly, a sensing current magnetic field in the left direction in the Figure (opposite to the direction Y) is applied to the layers below the nonmagnetic electrically conductive layer 15. This sensing current magnetic field acts to reinforce the synthesized magnetic moment, the exchange coupling magnetic field (RKKY interaction) acting between the first pinned magnetic layer 52 and the second pinned magnetic layer 54 is amplified, and the antiparallel state between the magnetization of the first pinned magnetic layer 52 and the magnetization of the second pinned magnetic layer 54 can be further thermally stabilized.

Particularly, it is known that causing a sensing current of 1 mA to flow generates a sensing current magnetic field of approximately 30 (Oe), and further that the element temperature rises by about 15° C. Moreover, the number of revolutions of the recording medium speeds up to around 1,000 rpm, and this increase in revolutions raises the temperature within the device to around 100° C. Accordingly, if a sensing current of 10 mA is caused to flow, the temperature of the spin-valve magnetoresistive thin film element rises to about 250° C., and a large sensing current magnetic field of approximately 300 (Oe) is generated.

In an arrangement with such a very high environment temperature and large sensing current, the antiparallel state between the magnetization of the first pinned magnetic layer 52 and the magnetization of the second pinned magnetic layer 54 easily collapses if the direction of the synthesized magnetic moment obtained by adding the magnetic moments of the first pinned magnetic layer 52 and the second pinned magnetic layer 54, and the direction of the sensing current magnetic field, are opposed.

Also, besides adjusting the direction of the sensing current magnetic field, there is the need to use an antiferromagnetic material with a high blocking temperature as the antiferromagnetic layer 11 in order to endure high environment temperatures. Accordingly, the present invention uses a PtMn alloy with a blocking temperature of approximately 400° C.

Incidentally, if the synthesized magnetic moment of the magnetic moment of the first pinned magnetic layer 52 and the magnetic moment of the second pinned magnetic layer 54 shown in FIG. 1 is facing in the right direction in the Figure, (i.e., in the direction Y), the sensing current should be caused to flow in the direction opposite to X in the Figure, so that the sensing current magnetic field is formed turning to the left as viewed in the Figure.

Next, description will be made regarding the sensing current direction of the spin-valve magnetoresistive thin film element shown in FIG. 3 will be described.

In FIG. 3, the second pinned magnetic layer 25 and the first pinned magnetic layer 27 are formed above the nonmagnetic electrically conductive layer 24. As shown in FIG. 3, the magnetic moment of the first pinned magnetic layer 27 is greater than the magnetic moment of the second pinned magnetic layer 25, and the direction of the magnetic moment of the first pinned magnetic layer 27 is in the direction Y (toward the right in the Figure). Accordingly, the direction of the synthesized magnetic moment obtained by adding the magnetic moment of the first pinned magnetic layer 27 and the magnetic moment of the second pinned magnetic layer 25 faces the right in the Figure.

As shown in FIG. 3, the sensing current 113 is caused to flow in the direction X shown in the Figure. The sensing current magnetic field created due to the corkscrew rule by causing the sensing current 113 to flow turns to the right as viewed in the Figure. The second pinned magnetic layer 25 and the first pinned magnetic layer 27 are formed above the nonmagnetic electrically conductive layer 24, so a sensing current magnetic field intrudes into the second pinned magnetic layer 25 and the first pinned magnetic layer 27 from the right direction in the Figure (the direction opposite to Y), so the direction matches that of the synthesized magnetic moment, and consequently, the antiparallel state between the magnetization of the second pinned magnetic layer 25 and the magnetization of the first pinned magnetic layer 27 does not easily collapse.

Incidentally, if the synthesized magnetic moment is facing the left direction in the Figure (the direction opposite to Y), there is the need to cause the sensing current 113 to flow in the direction opposite to X, thereby generating a sensing current magnetic field turning to the left as viewed in the Figure, thus aligning the direction of the synthesized magnetic moment of the first pinned magnetic layer 27 and the second pinned magnetic layer 25.

The spin-valve magnetoresistive thin film element shown in FIG. 5 is a dual spin-valve magnetoresistive thin film element wherein first pinned magnetic layers (lower) 32 and (upper) 43, and second pinned magnetic layers (lower) 34 and (upper) 41 are formed above and below the free magnetic layer 36.

With this dual spin-valve magnetoresistive thin film element, there is the need to control the direction and magnitude of the magnetic moment of the first pinned magnetic layers (lower) 32 and (upper) 43, and the direction and magnitude of the magnetic moment of the second pinned magnetic layers (lower) 34 and (upper) 41, so that the synthesized magnetic moments formed above and below the free magnetic layer 36 are directed in mutually opposing directions.

As shown in FIG. 5, the magnetic moment of the second pinned magnetic layer (lower) 34 formed below the free magnetic layer 36 is greater than the magnetic moment of the first pinned magnetic layer (lower) 32, and the magnetic moment of the second pinned magnetic layer (lower) 34 is facing the right in the Figure (direction Y in the Figure). Accordingly, the synthesized magnetic moment obtained by adding the magnetic moment of the first pinned magnetic layer (lower) 32 and the magnetic moment of the second pinned magnetic layer (lower) 34 is facing the right in the Figure (direction Y in the Figure). Also, the magnetic moment of the first pinned magnetic layer (upper) 43 formed above the free magnetic layer 36 is greater than the magnetic moment of the second pinned magnetic layer (upper) 41, and the magnetic moment of the first pinned magnetic layer (upper) 43 is facing the left in the Figure (the direction opposite to Y). Accordingly, the synthesized magnetic moment obtained by adding the magnetic moment of the first pinned magnetic layer (upper) 43 and the magnetic moment of the second pinned magnetic layer (upper) 41 is facing the left in the Figure (the direction opposite to Y). In this way, with the present invention, the synthesized magnetic moments formed above and below the free magnetic layer 36 are directed in mutually opposing directions.

As shown in FIG. 5, with the present invention, the sensing current 114 is caused to flow in the direction opposite to X, thereby generating a sensing current magnetic field turning to the left as viewed in the Figure.

The synthesized magnetic moment formed below the free magnetic layer 36 is facing the right in the Figure (the direction Y), and the synthesized magnetic moment formed above the free magnetic layer 36 is facing the left in the Figure (the direction opposite to Y), so the direction of the two synthesized moments match the direction of the sensing current magnetic field. Thus, the antiparallel state of the magnetization of the first pinned magnetic layer (lower) 32 and the magnetization of the second pinned magnetic layer (lower) 34 formed below the free magnetic layer 36, and also the antiparallel state of the magnetization of the first pinned magnetic layer (upper) 43 and the magnetization of the second pinned magnetic layer (upper) 41 formed above the free magnetic layer 36, can be maintained in a thermally stable state.

If the synthesized magnetic moment formed below the free magnetic layer 36 is facing the left, and the synthesized magnetic moment formed above the free magnetic layer 36 is facing the right, there is the need to cause the sensing current 114 to flow in the direction X in the Figure, thereby aligning the direction of the sensing current magnetic field formed by causing the sensing current to flow, and the synthesized magnetic moment.

FIG. 7 and FIG. 9 are embodiments of spin-valve magnetoresistive thin film elements wherein the free magnetic layer has been divided into a first free magnetic layer and a second free magnetic layer with a nonmagnetic intermediate layer introduced therebetween. If the first pinned magnetic layer 52 and second pinned magnetic layer 54 are formed below the nonmagnetic electrically conductive layer 55 as with the spin-valve magnetoresistive thin film element shown in FIG. 7, control of the sensing current should be performed in the same manner as with the spin-valve magnetoresistive thin film element shown in FIG. 1.

Also, if the first pinned magnetic layer 79 and second pinned magnetic layer 77 are formed above the nonmagnetic electrically conductive layer 76 as with the spin-valve magnetoresistive thin film element shown in FIG. 9, control of the sensing current direction should be performed in the same manner as with the spin-valve magnetoresistive thin film element shown in FIG. 3.

As described above, according to the present invention, matching the direction of the sensing current magnetic field formed by causing the sensing current to flow, and the synthesized magnetic moment obtained by adding the magnetic moment of the first pinned magnetic layer and the magnetic moment of the second pinned magnetic layer. Consequently, the exchange coupling magnetic field (RKKY interaction) acting between the first pinned magnetic layer and the second pinned magnetic layer is amplified, and the antiparallel state (Ferri-state) between the magnetization of the first pinned magnetic layer and the magnetization of the second pinned magnetic layer can be further thermally stabilized.

Particularly, in order to further improve thermal stability, the present invention uses a PtMn alloy or the like with a high blocking temperature for the antiferromagnetic material comprising the antiferromagnetic layer, and so even if the environment temperature rises greatly in comparison with known arrangements, the antiparallel state (Ferri-state) between the magnetization of the first pinned magnetic layer and the magnetization of the second pinned magnetic layer does not easily collapse.

Also, if the amount of sensing current is increased to deal with high recording density, thereby increasing the reproduction output, the sensing current magnetic field also increases accordingly. However with the present invention, this sensing current magnetic field acts to amplify the exchange coupling magnetic field acting between the first pinned magnetic layer and the second pinned magnetic layer, so the magnetization state of the first pinned magnetic layer and the second pinned magnetic layer is even more stabilized by the increase in the sensing current magnetic field.

This control of the sensing current can be applied in any case using any antiferromagnetic material for the antiferromagnetic material, regardless of whether or not thermal treatment is necessary for generating an exchange coupling magnetic field (exchange anisotropic magnetic field) at the interface between the antiferromagnetic layer and the pinned magnetic layer (first pinned magnetic layer), for example.

Further, the magnetization of the pinned magnetic layer can be thermally stabilized even in the case of conventional single spin-valve magnetoresistive thin film elements wherein the pinned magnetic layer is formed of a single layer, by matching the direction of the sensing current magnetic field generated by causing the sensing current to flow and the direction of magnetization of the pinned magnetic layer.

With the present invention, the relationship between the film thickness ratio of the first pinned magnetic layer and second pinned magnetic layer, the exchange coupling magnetic field (Hex), and ΔMR (rate of resistance change), was measured, using a spin-valve magnetoresistive thin film element wherein the pinned magnetic layer is divided into a first pinned magnetic layer and second pinned magnetic layer with a nonmagnetic intermediate layer introduced therebetween.

First, the first pinned magnetic layer (the pinned magnetic layer on the side coming into contact with the antiferromagnetic layer) was fixed at 20 ångström or 40 ångström, and the film thickness of the second pinned magnetic layer was varied, whereby the relationship between the thickness of the second pinned magnetic layer, and the exchange coupling magnetic field and ΔMR was researched. The film configuration used in the experiments is from the bottom; the Si substrate/Alumina/Ta (30)/antiferromagnetic layer of PtMn (150)/first pinned magnetic layer of Co (20 or 40)/ nonmagnetic intermediate layer of Ru (7)/second pinned magnetic layer of Co (X) Cu (25)/nonmagnetic electrically conductive layer of Cu (25)/free magnetic layer of Co (10)+NiFe (40)/Ta (30). The numerals in the parentheses for each layer represent film thickness in units of ångström.

Also, with the present invention, following completion of the layers of the above the spin-valve magnetoresistive thin film element, the spin-valve magnetoresistive thin film element was subjected to thermal treatment at 260° C. for four hours while applying a magnetic field of 200 (Oe), following formation. The results of the experiments are shown in FIGS. 14 and 15.

Figure 14:
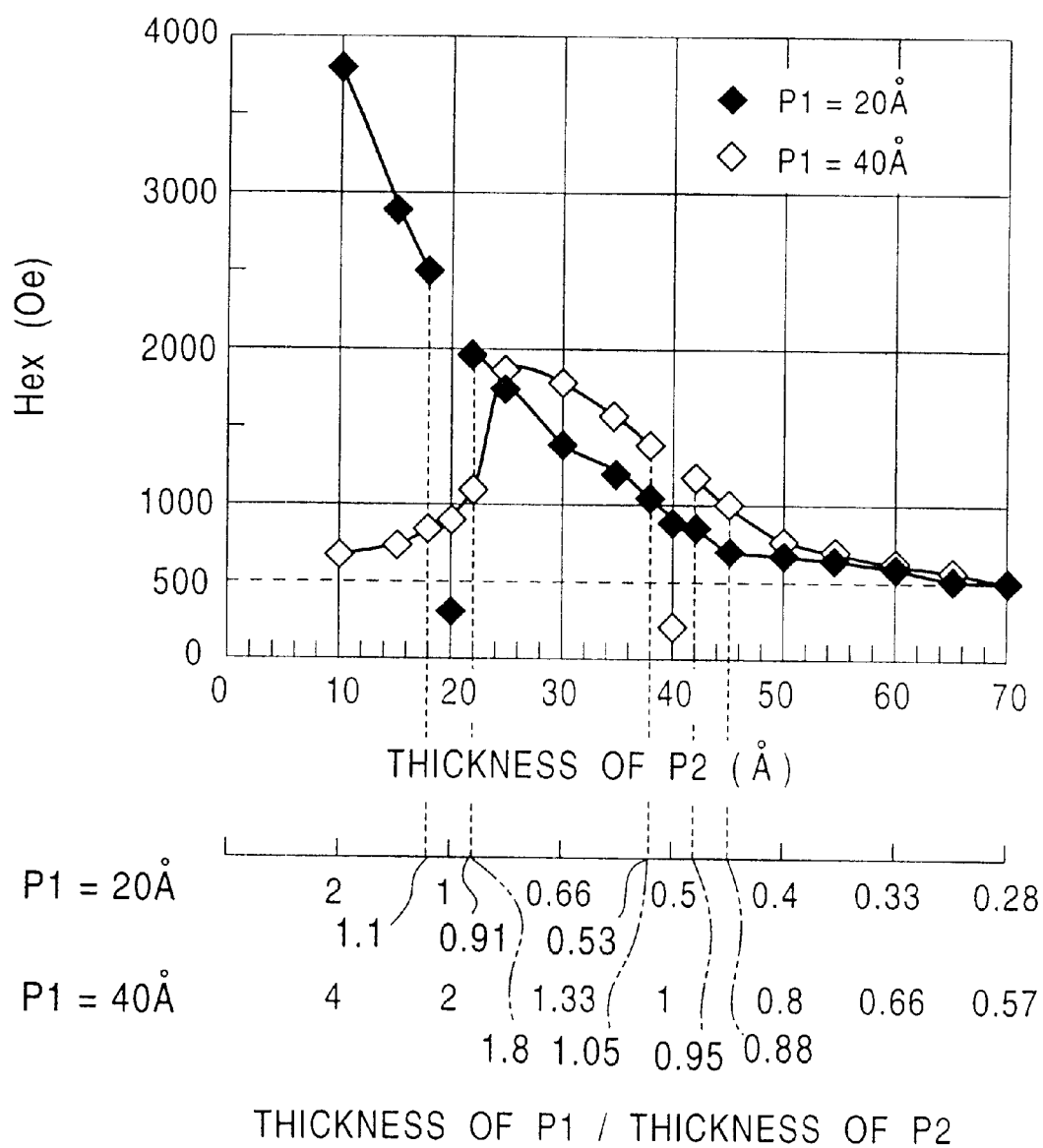
FIG. 14 is a graph illustrating the relationship between the thickness of a second pinned magnetic layer (P2) if the thickness of a first pinned magnetic layer (P1) is fixed at 20 or 40 ångström, and the exchange coupling magnetic field, and also the relationship between (the thickness of the first pinned magnetic layer (PI))/(the thickness of the second pinned magnetic layer (P2)) and the exchange coupling magnetic field (Hex)
Figure 15:
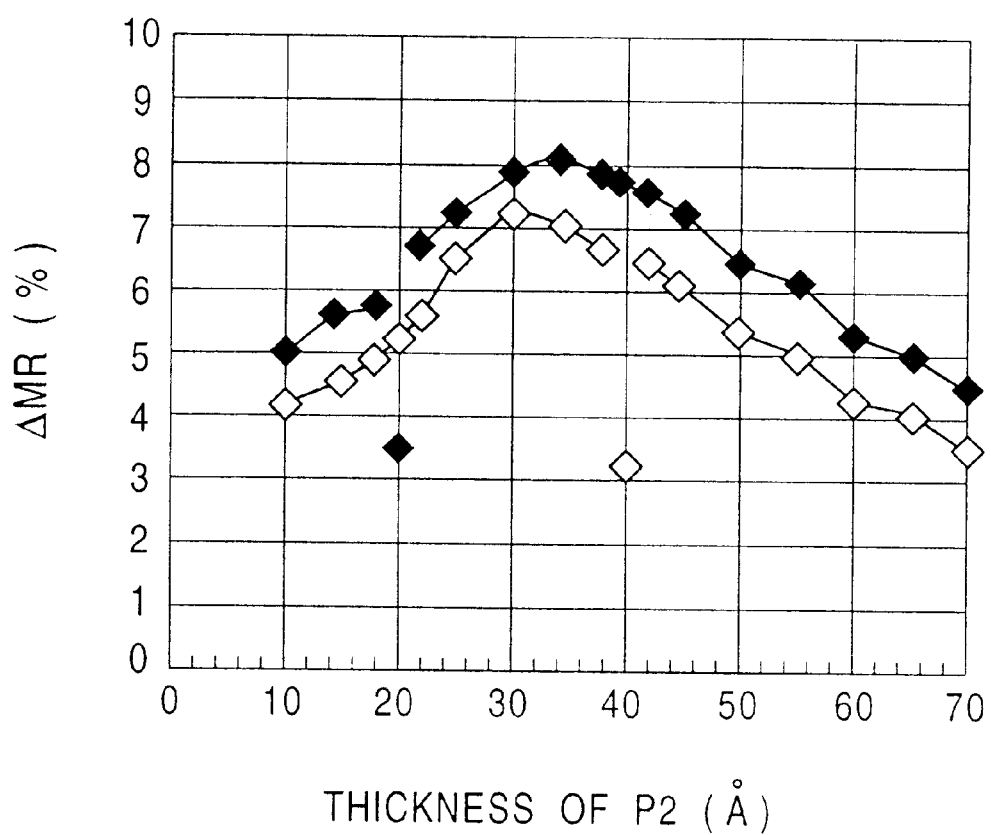
FIG. 15 is a graph illustrating the relationship between the thickness of the second pinned magnetic layer (P2) if the thickness of the first pinned magnetic layer (P1) is fixed at 20 or 40 ångström, and ΔMR.

As shown in FIG. 14, it can be understood that if the thickness tP1 of the first pinned magnetic layer (P1) is fixed at 20 ångström, setting the thickness tp2 of the second pinned magnetic layer (P2) at 20 ångström results in the exchange coupling magnetic field (Hex) dropping rapidly, and increasing the thickness of the thickness tP2 results in the exchange coupling magnetic field dropping gradually. Also, it can be understood that if the thickness tP1 of the first pinned magnetic layer (P1) is fixed at 40 ångström, setting the thickness tP2 of the second pinned magnetic layer (P2) at 40 ångström results in the exchange coupling magnetic field dropping rapidly, and increasing the thickness of the thickness tP2 above 40 ångström results in the exchange coupling magnetic field dropping gradually. It can also be understood that reducing the thickness of the thickness tP2 under 40 ångström results in the exchange coupling magnetic field increasing to 26 ångström, but that reducing the thickness of the thickness tP2 under 26 ångström results in the exchange coupling magnetic field dropping.

Now, it is supposed that the reason that the exchange coupling magnetic field drops drastically if the thickness tP1 of the first pinned magnetic layer (P1) and the thickness tP2 of the second pinned magnetic layer (P2) are the same is because the magnetism of the first pinned magnetic layer (P1) and magnetism of the second pinned magnetic layer (P2) do not enter an antiparallel state easily, i.e., it is difficult to achieve a so-called Ferri-state.

Now, as shown in the above-described film configuration, the first pinned magnetic layer (P1) and the second pinned magnetic layer (P2) are both formed of Co films, and thus have the same saturation magnetization (Ms). Further, due to being set at approximately the same thickness, the magnetic moment (Ms·tP1) of the first pinned magnetic layer (P1) and the magnetic moment (MS·tP2) of the second pinned magnetic layer (P2) are set at approximately the same value.

The present invention uses a PtMn alloy for the antiferromagnetic layer, and purports to generate an exchange coupling magnetic field at the interface between the antiferromagnetic layer and the first pinned magnetic layer (P1) by subjecting the formed films to annealing in a magnetic field, thereby pinning the first pinned magnetic layer (P1) in a certain direction.

However, if the magnetic moment of the first pinned magnetic layer (P1) and the second pinned magnetic layer (P2) are approximately the same value, both the first pinned magnetic layer (P1) and the second pinned magnetic layer (P2) attempt to face the direction of the magnetic field at the time of applying the magnetic field and subjecting to thermal treatment. Originally, an exchange coupling magnetic field (RKKY interaction) should be generated between the first pinned magnetic layer (P1) and the second pinned magnetic layer (P2), with the magnetization of the first pinned magnetic layer (P1) and the magnetization of the second pinned magnetic layer (P2) being magnetized in an antiparallel state (Ferri-state). However here the magnetization of each of the first pinned magnetic layer (P1) and the second pinned magnetic layer (P2) both face in the direction of the magnetic field, not easily being magnetized in an antiparallel state. Consequently the magnification state of the first pinned magnetic layer (P1) and the second pinned magnetic layer (P2) is extremely unstable regarding external magnetic fields or the like.

Accordingly, it is preferable to have a certain amount of difference between the magnetic moment of the first pinned magnetic layer (P1) and the magnetic moment of the second pinned magnetic layer (P2), but as shown in FIG. 14, too large a difference between the film thickness tP1 of the first pinned magnetic layer (P1) and the film thickness tP2 of the second pinned magnetic layer (P2) and too large a difference between the magnetic moment of the first pinned magnetic layer (P1) and the magnetic moment of the second pinned magnetic layer (P2) is a problem since this causes the exchange coupling magnetic field to deteriorate, and the antiparallel state easily collapses.

Figure 16:
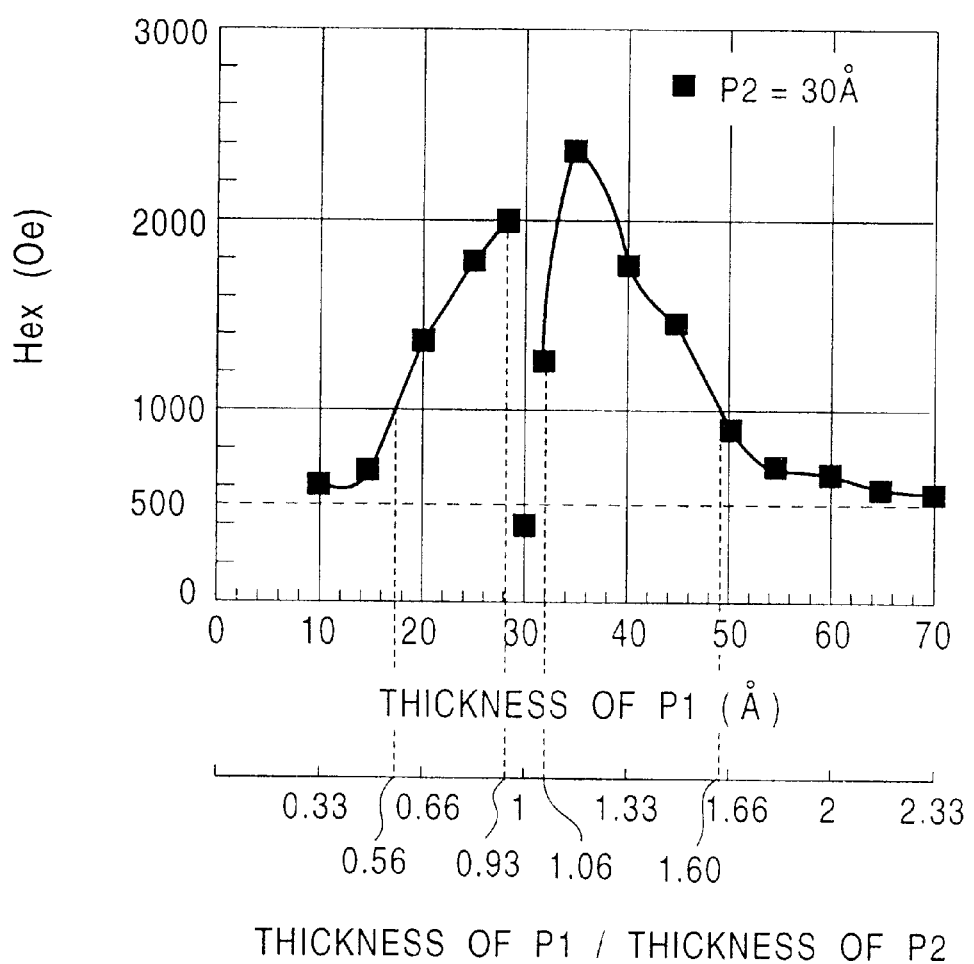
FIG. 16 is a graph illustrating the relationship between the thickness of the first pinned magnetic layer (P1) if the second pinned magnetic layer (P2) is fixed at 30 ångström, and the exchange coupling magnetic field, and also the relationship between (the thickness of the first pinned magnetic layer (P1))/(the thickness of the second pinned magnetic layer (P2)) and the exchange coupling magnetic field (Hex)
Figure 17:
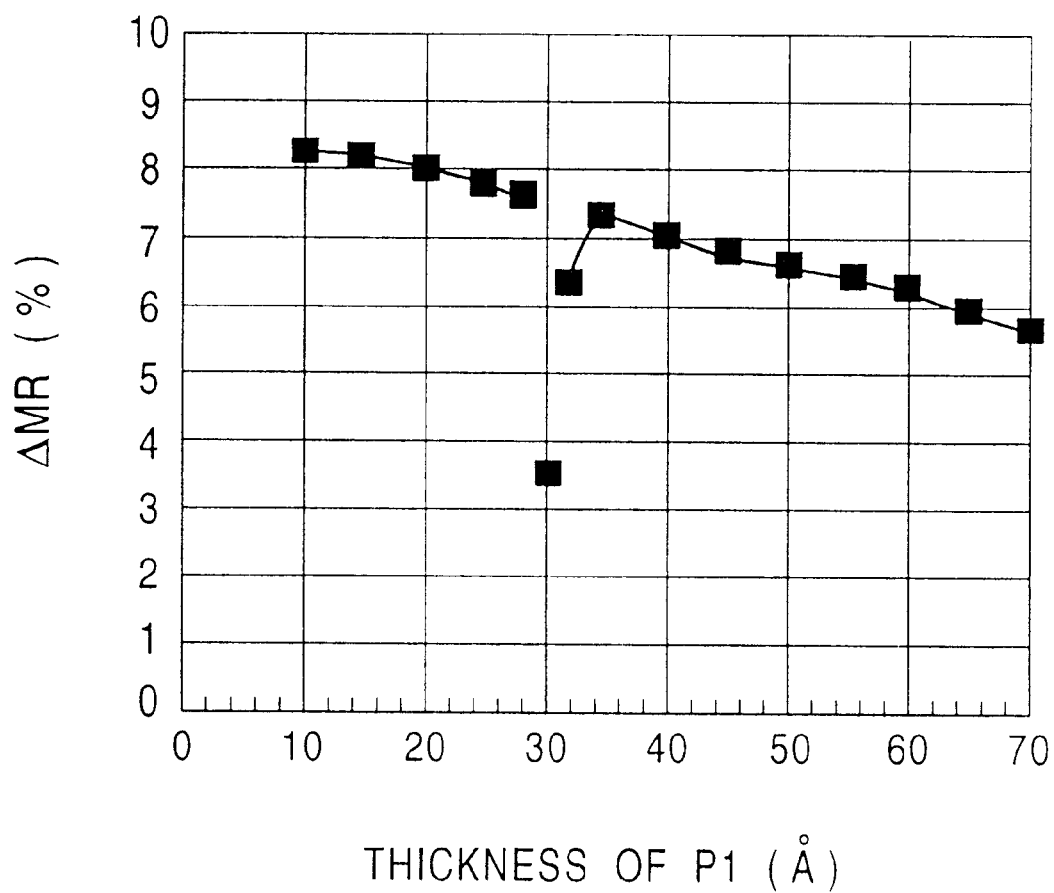
FIG. 17 is a graph illustrating the relationship between the thickness of the first pinned magnetic layer (P1) if the second pinned magnetic layer (P2) is fixed at 30 ångström, and ΔMR (%)

FIGS. 16 and 17 are graphs representing the relationship between the thickness tP1 of the first pinned magnetic layer, and the exchange coupling magnetic field (Hex) and ΔMR, if the thickness tP2 of the second pinned magnetic layer (P2) was fixed at 30 ångström, and the film thickness tP1 of the first pinned magnetic layer (P1) was varied. The film configuration of the spin-valve magnetoresistive thin film element used in the experiments is from the bottom; the Si substrate/Alumina/Ta (30) PtMn (150)/first pinned magnetic layer of Co (X)/nonmagnetic intermediate layer of Ru (7)/second pinned magnetic layer of Co (30)/nonmagnetic electrically conductive layer of Cu (25)/free magnetic layer of Co (10)+NiFe (40)/Ta (30). The numerals in the parentheses for each layer represent film thickness in units of ångström.

Also, with the present invention, upon completion of the layers of the above spin-valve magnetoresistive thin film element, the spin-valve magnetoresistive thin film element was subjected to thermal treatment at 260° C. for four hours while applying a magnetic field of 200 (Oe).

As shown in FIG. 16, it can be understood that if the thickness tP1 of the first pinned magnetic layer (P1) is set at 30 ångström, which is the same film thickness, as the tP2 of the second pinned magnetic layer (P2), the exchange coupling magnetic field (Hex) drops drastically. This is due to the above-described reason.

Also, it can also be understood that the exchange coupling magnetic field becomes smaller if the thickness tp1 of the first pinned magnetic layer (P1) is approximately 32 ångström. This is because the magnetic thickness of the first pinned magnetic layer becomes smaller than the actual thickness tP1 due to a thermal dispersion layer being generated, and approaches the thickness tP2 of the second pinned magnetic layer (=30 ångström).

This thermal dispersion layer is formed at the interface of the antiferromagnetic layer and the first pinned magnetic layer due to metal elements being dispersed, and as shown in the film configuration used for this experiment, the thermal dispersion layer is easily generated if the antiferromagnetic layer and pinned magnetic layer are formed below the free magnetic layer.

Figure 18:
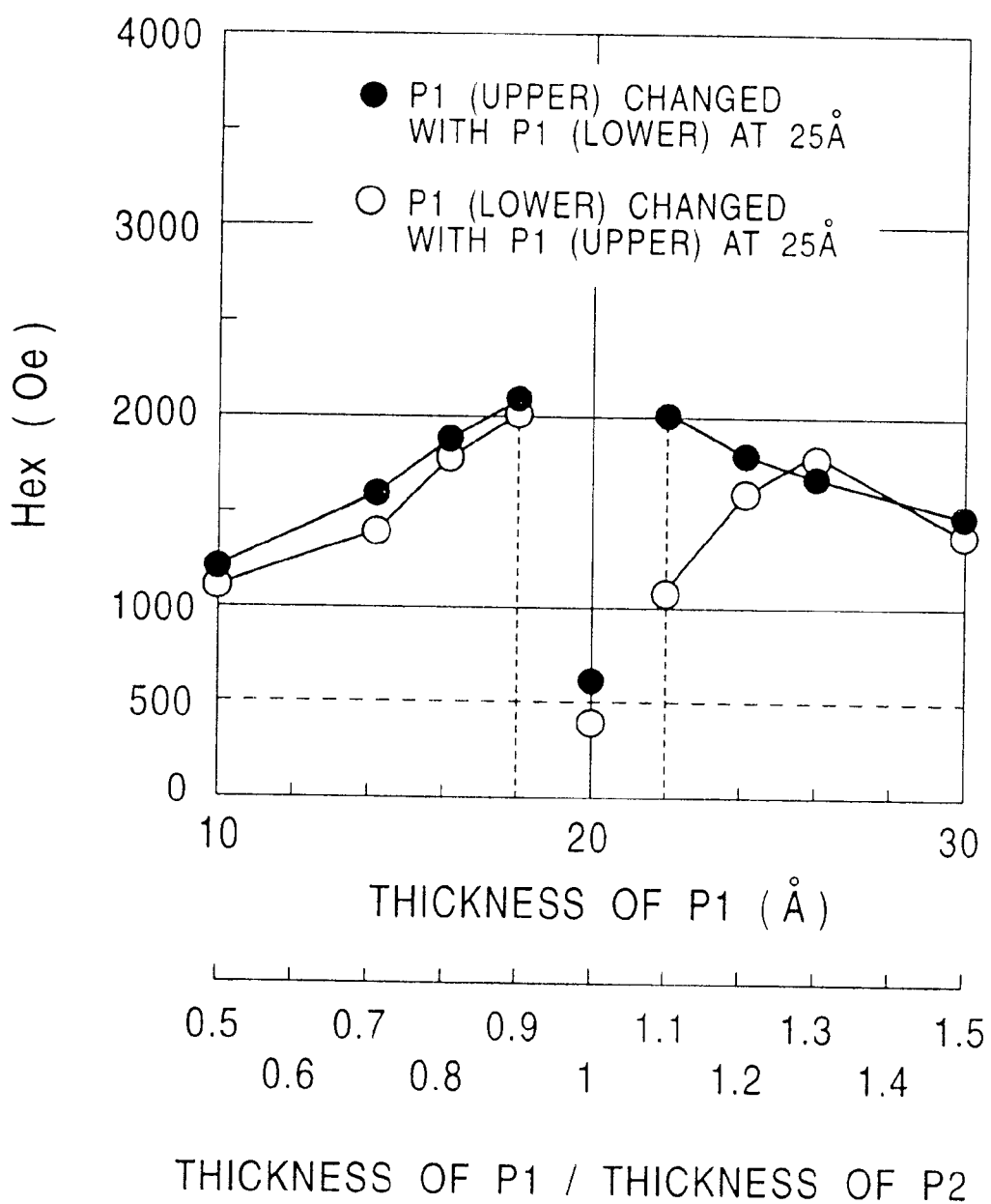
FIG. 18 is a graph illustrating, with regard to a dual spin-valve magnetoresistive thin film element, the relationship between the thicknesses of a first pinned magnetic layer (upper) and first pinned magnetic layer (lower), and the exchange coupling magnetic field (Hex); and further, the relationship between (the thickness of the first pinned magnetic layer (P1 upper))/(the thickness of the second pinned magnetic layer (P2 upper)) and (the thickness of the first magnetic layer (P1 lower))/(the thickness of the second pinned magnetic layer (P2 lower)), and the exchange coupling magnetic field (Hex)

FIG. 18 is a graph representing the relationship between the thickness of the first pinned magnetic layer and the exchange coupling magnetic field (Hex), if a dual spin-valve magnetoresistive thin film element is manufactured, with the two second pinned magnetic layers of the dual spin-valve magnetoresistive thin film element being fixed at 20 ångström, and the film thickness of the two first pinned magnetic layers being varied. The film configuration of the spin-valve magnetoresistive thin film element used in the experiments is from the bottom; the Si substrate Alumina/Ta (30)/ antiferromagnetic layer of PtMn (150) first pinned magnetic layer (P1 lower) of Co (X)/nonmagnetic intermediate layer of Ru (6)/second pinned magnetic layer (p2 lower) of Co (20)/nonmagnetic electrically conductive layer of Cu (20)/ free magnetic layer of Co (10)+NiFe (40)+Co (10)/ nonmagnetic electrically conductive layer of Cu (20)/second pinned magnetic layer (12 upper) of Co (20)/nonmagnetic intermediate layer of Ru (8)/first pinned magnetic layer (P1 upper) of Co (X)/antiferromagnetic layer of PtMn (150)/ protecting layer of Ta (30). The numerals in the parentheses for each layer represent film thickness in units of ångström.

Also, with the present invention, upon completion of the layers of the above spin-valve magnetoresistive thin film element, the spin-valve magnetoresistive thin film element was subjected to thermal treatment at 260° C. for four hours while applying a magnetic field of 200 (Oe), following formation.

Also, in the experiments, the first pinned magnetic layer (P1 lower) formed below the free magnetic layer was fixed at 25 ångström and the thickness of the first pinned magnetic layer (P1 upper) formed above the free magnetic layer was changed, and the relationship between the thickness of the first pinned magnetic layer (P1 upper) and the exchange coupling magnetic field was studied.

Further, the first pinned magnetic layer (P1 upper) formed above the free magnetic layer was fixed at 25 ångström and the thickness of the first pinned magnetic layer (P1 lower) formed below the free magnetic layer was changed, and the relationship between the thickness of the first pinned magnetic layer (P1 lower) and the exchange coupling magnetic field (Hex) was studied.

As shown in FIG. 18, if the first pinned magnetic layer (P1 lower) is fixed at 25 ångström and the thickness of the first pinned magnetic layer (P1 upper) is brought closer to 20 ångström, the exchange coupling magnetic field gradually grows greater. However at the point that the thickness of the first pinned magnetic layer (P1 upper) reaches around 18 to 22 ångström, this thickness is approximately the same as the film thickness of the first pinned magnetic layer (P1 lower), so the exchange coupling magnetic field rapidly drops. It can also be understood that the exchange coupling magnetic field gradually drops when the thickness of the first pinned magnetic layer (P1 upper) is gradually increased from 22 ångström to 30 ångström.

Also, as shown in FIG. 18, if the first pinned magnetic layer (P1 upper) is fixed at 25 ångström and the thickness of the first pinned magnetic layer (P1 lower) is brought closer to 20 ångström, the exchange coupling magnetic field gradually grows greater. However at the point that the thickness of the first pinned magnetic layer (P1 lower) reaches around 18 to 22 ångström, the exchange coupling magnetic field rapidly drops. It can also be understood that the exchange coupling magnetic field increases when the thickness of the first pinned magnetic layer (P1 lower) is increased from 22 ångström as far as 26 ångström, but that the exchange coupling magnetic field drops if this is 26 ångström or greater.

Now, comparing the exchange coupling magnetic field in the first pinned magnetic layer (P1) and the exchange coupling magnetic field in the first pinned magnetic layer (P1 lower), with the film thickness of the first pinned magnetic layer (P1 upper) at around 22 ångström, it can be understood that the exchange coupling magnetic field can be made to be greater in an arrangement wherein the film thickness of the first pinned magnetic layer (P1 upper) is set at around 22 ångström, as compared to an arrangement wherein the film thickness of the first pinned magnetic layer (P1 lower) is set at around 22 ångström. As described above, this is due to the fact that a thermal dispersion layer is easily formed at the interface between the first pinned magnetic layer (P1 lower) and the antiferromagnetic layer, whereby the magnetic thickness of the first pinned magnetic layer essentially becomes smaller, and becomes about the same as the thickness of the second pinned magnetic layer (p2 lower).

The (film thickness of the first pinned magnetic layer (P1))/(film thickness of the second pinned magnetic layer (P2)) whereby an exchange coupling magnetic field of 500 Oe or greater can be obtained with the present invention was studied based on the experiment results shown in FIGS. 14, 16, and 18.

First, as shown in FIG. 14, it can be understood that if the thickness of the first pinned magnetic layer (P1) is fixed at 20 ångström, the (film thickness of the first pinned magnetic layer (P1))/(film thickness of the second pinned magnetic layer (P2)) must be set between 0.33 or greater and 0.91 or smaller, or 1.1 or greater, in order to obtain an exchange coupling magnetic field of 500 (Oe) or greater. Incidentally, the film thickness of the second pinned magnetic layer (P2) at this time is within the range of 10 to 60 ångström (excluding 18 to 22 ångström).

Next, as shown in FIG. 14, it can be understood that if the film thickness of the first pinned magnetic layer (P1) is fixed at 40 ångström, the (film thickness of the first pinned magnetic layer (P1))/(film thickness of the second pinned magnetic layer (P2)) must be set between 0.57 or greater and 0.95 or smaller, or 1.05 or greater and 4 or smaller, in order to obtain an exchange coupling magnetic field of 500 (Oe) or greater. The film thickness of the second pinned magnetic layer (P2) at this time is within the range of 10 to 60 ångström (excluding 38 to 42 ångström).

Next, as shown in FIG. 16, it can be understood that if the film thickness of the second pinned magnetic layer (P2) is fixed at 30 ångström, the (film thickness of the first pinned magnetic layer (P1))/(film thickness of the second pinned magnetic layer (P2)) must be set between 0.33 or greater and 0.93 or smaller, or 1.06 or greater and 2.33 or smaller, in order to obtain an exchange coupling magnetic field of 500 (Oe) or greater. The film thickness of the first pinned magnetic layer (P1) at this time is within the range of 10 to 70 ångström (excluding 28 to 32 ångström).

Further, as shown in FIG. 18, it can be understood that in the case of a dual spin-valve magnetoresistive thin film element, an exchange coupling magnetic field of 500 (Oe) or greater can be obtained as long as the range of 0.9 or greater and 1.1 or smaller is excluded from the range of the (film thickness of the first pinned magnetic layer (P1))/(film thickness of the second pinned magnetic layer (P2)).

Now, the widest range wherein an exchange coupling magnetic field of 500 (Oe) or greater can be obtained is between 0.33 or greater and 0.95 or smaller, or 1.05 or greater and 4 or smaller, for the (film thickness of the first pinned magnetic layer (P1))/(film thickness of the second pinned magnetic layer (P2)).

However, in addition to film thickness ratio, the film thickness of the first pinned magnetic layer (P1) and the film thickness of the second pinned magnetic layer (P2) is also an important factor regarding the exchange coupling magnetic field. Accordingly, with the thickness ratio as described above, and further with the film thickness of the first pinned magnetic layer (P1) and the film thickness of the second pinned magnetic layer (P2) within a range of 10 to 70 ångström, and moreover with the absolute value obtained by subtracting the film thickness of the second pinned magnetic layer (P2) from the film thickness of the first pinned magnetic layer (P1) at 2 ångström or greater, an exchange coupling magnetic field of 500 (Oe) or greater can be obtained.

Next, the (film thickness of the first pinned magnetic layer (P1))/(film thickness of the second pinned magnetic layer (P2)) whereby an exchange coupling magnetic field of 1,000 (Oe) or greater can be obtained with the present invention was studied.

First, as shown in FIG. 14, if the film thickness of the first pinned magnetic layer (P1) is fixed at 20 ångström, setting the (film thickness of the first pinned magnetic layer (P1))/(film thickness of the second pinned magnetic layer (P2)) between 0.53 and 0.91, or at 1.1 or greater, enables an exchange coupling magnetic field of 1,000 (Oe) or greater to be obtained. The film thickness of the second pinned magnetic layer (P2) at this time is within the range of 10 to 38 ångström (excluding 18 to 22 ångström).

Next, as shown in FIG. 14, if the film thickness of the first pinned magnetic layer (P1) is fixed at 40 ångström, setting the (film thickness of the first pinned magnetic layer (P1))/(film thickness of the second pinned magnetic layer (P2)) between 0.88 and 0.95, or between 1.05 and 1.8, enables an exchange coupling magnetic field of 1,000 (Oe) or greater to be obtained. The film thickness of the second pinned magnetic layer (P2) at this time is within the range of 22 to 45 ångström (excluding 38 to 42 ångström).

Further, as shown in FIG. 16, if the film thickness of the second pinned magnetic layer (P2) is fixed at 30 ångström, setting the (film thickness of the first pinned magnetic layer (P1))/(film thickness of the second pinned magnetic layer (P2)) between 0.56 and 0.93, or 1.06 and 1.6, enables an exchange coupling magnetic field of 1,000 (Oe) or greater to be obtained. The film thickness of the first pinned magnetic layer (P1) at this time is within the range of 10 to 50 ångström (excluding 28 to 32 ångström).

Also, as shown in FIG. 18, in the case of a dual spin valve magnetoresistive thin film element, setting the (film thickness of the first pinned magnetic layer (P1))/(film thickness of the second pinned magnetic layer (P2)) between 0.5 and 0.9, or 1.1 and 1.5, enables an exchange coupling magnetic field of 1,000 (Oe) or greater to be obtained.

Accordingly, in order to obtain an exchange coupling magnetic field of 1,000 (Oe) or greater, the (film thickness of the first pinned magnetic layer (P1))/(film thickness of the second pinned magnetic layer (P2)) should be set to a range between 0.53 to 0.9 or 1.05 to 1.8, and it is further preferable that the film thickness of the first pinned magnetic layer (P1) and second pinned magnetic layer (P2) at this time is within the range of 10 to 50 ångström, and even more preferable that the absolute value obtained by subtracting the film thickness of the second pinned magnetic layer (P2) from the film thickness of the first pinned magnetic layer (P1) is 2 ångström or greater.

Also, as shown in FIG. 15 and FIG. 17, as long as the film thickness ratio and film thickness are within the above ranges, there is little drop in ΔMR, and a ΔMR of around 6% or higher can be obtained. This ΔMR value is either around the same or somewhat lower than the ΔMR of known spin-valve magnetoresistive thin film elements (speaking only of single spin-valve magnetoresistive thin film elements).

Also, it can be understood that if the first pinned magnetic layer (P1) is set at 40 ångström, the ΔMR is somewhat smaller than if the first pinned magnetic layer (P1) is set at 20 ångström.

The first pinned magnetic layer (P1) is actually a layer which does not have bearing on the ΔMR, and this ΔMR is determined by the relationship between the pinned magnetism of the second pinned magnetic layer (P2) and the fluctuating magnetization of the free magnetic layer. However, the sensing current also flows to the first pinned magnetic layer (P1) which does not have bearing on the ΔMR, thus generating a so-called shunt loss (diversion loss), and this shunt loss increases as the film thickness of the first pinned magnetic layer (P1) increases. Due to the above reasons, ΔMR tends to drop as the film thickness of the first pinned magnetic layer (P1) increases.

Next, measurement was made regarding the appropriate thickness of the nonmagnetic intermediate layer formed between the first pinned magnetic layer (P1) and the second pinned magnetic layer (P2). For this experiment, two types of spin-valve magnetoresistive thin film elements were manufactured: a bottom type wherein the antiferromagnetic layer is formed below the free magnetic layer, and a top type wherein the antiferromagnetic layer is formed above the free magnetic layer. The relationship between the thickness of the nonmagnetic intermediate layer and the exchange coupling magnetic field was then studied for these. The film configuration of the bottom type spin-valve magnetoresistive thin film element used in the experiment is from the bottom; the Si substrate Alumina Ta (30)/antiferromagnetic layer of PtMn (200)/first pinned magnetic layer of Co (20)/nonmagnetic intermediate layer of Ru (X)/second pinned magnetic layer of Co (25)/nonmagnetic electrically conductive layer of Co (10)/free magnetic layer of Co (10)+NiFe (40)/Ta (30).

The film configuration of the top type spin-valve magnetoresistive thin film element used in the experiment is from the bottom; the Si substrate/Alumina/Ta (30)/free magnetic layer of NiFe (40)+Co (10) nonmagnetic electrically conductive layer of Cu (25)/second pinned magnetic layer of Co (25)/nonmagnetic intermediate layer of Ru (X)/first pinned magnetic layer of Co (20)/antiferromagnetic layer of PtMn (200)/Ta (30). The numerals in the parentheses for each layer represent film thickness in units of ångström.

Also, with the present invention, upon completion of the layers of the above spin-valve magnetoresistive thin film element, the spin-valve magnetoresistive thin film element was subjected to thermal treatment at 260° C. for four hours while applying a magnetic field of 200 (Oe), following formation. The experiment results are shown in FIG. 19.

Figure 19:
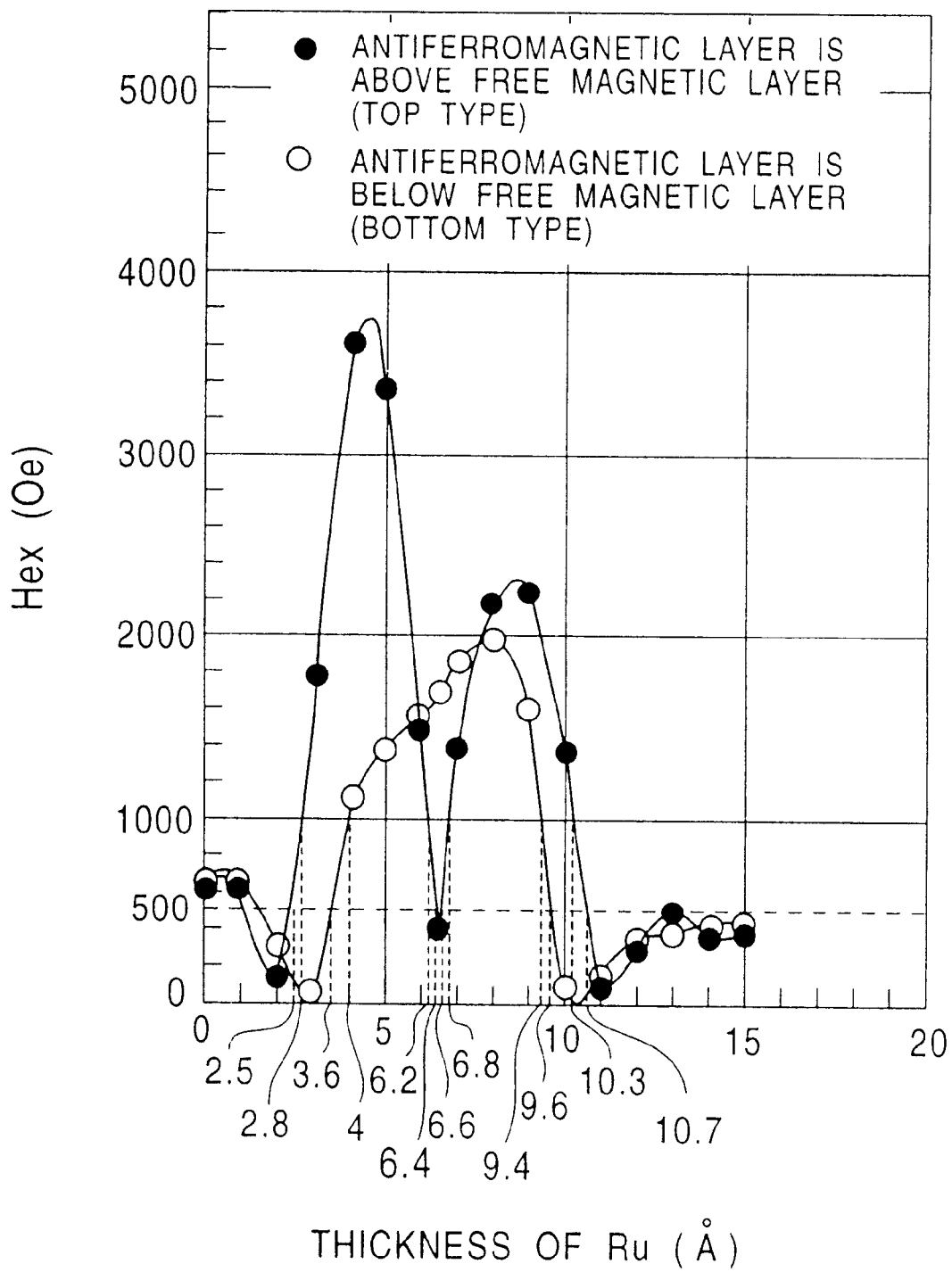
FIG. 19 is a graph illustrating the relationship between the thickness of the Ru (nonmagnetic intermediate layer) introduced between the first pinned magnetic layer and second pinned magnetic layer, and the exchange coupling magnetic field (Hex)

As can be seen in FIG. 19, the behavior of the exchange coupling magnetic field in regard to the thickness of the Ru layer (the nonmagnetic intermediate layer) changes greatly between the top type and the bottom type.

Since the present invention holds that a range wherein an exchange coupling magnetic field of 500 (Oe) or greater can be obtained is preferable, it can be understood that the thickness range of the Ru layer in the top type spin-valve magnetoresistive thin film element wherein an exchange coupling magnetic field of 500 (Oe) or greater can be obtained is from 2.5 to 6.2 ångström or 6.6 to 10.7 ångström. Further preferable is a range wherein an exchange coupling magnetic field of 1,000 (Oe) or greater can be obtained, and it can be understood that the thickness range of the Ru layer wherein an exchange coupling magnetic field of 1,000 (Oe) or greater can be obtained is from 2.8 to 6.2 ångström or 6.8 to 10.3 ångström.

Next, with the bottom type spin-valve magnetoresistive thin film element, it can be understood that the thickness range of the Ru layer wherein an exchange coupling magnetic field of 500 (Oe) or greater can be obtained is from 3.6 to 9.6 ångström. Further, a range for the Ru layer of 4.0 to 9.4 ångström will yield an exchange coupling magnetic field of 1,000 (Oe) or greater.

It is supposed that the reason why the appropriate thickness range for the nonmagnetic intermediate layer differs between the case of a top type spin-valve magnetoresistive thin film element and a bottom type spin valve magnetoresistive thin film element, is that the exchange coupling magnetic field (RKKY interaction) acting between the first pinned magnetic layer and the second pinned magnetic layer reacts to the relationship with the lattice constants of the base layer or the energy band value of conduction electrons at the magnetic layers, in an extremely sensitive manner.

Next, with the present invention, four types of spin valve magnetoresistive thin film elements (single spin-valve magnetoresistive thin film elements) were manufactured, and the relationship between the thickness of the antiferromagnetic layer (PtMn alloy) of each spin-valve magnetoresistive thin film element and the exchange coupling magnetic field was measured.

The first and second embodiments are spin-valve magnetoresistive thin film elements wherein the pinned magnetic layer is divided into the two layers of the first pinned magnetic layer and the second pinned magnetic layer, with a nonmagnetic intermediate layer introduced therebetween, and the first and second comparative examples are known spin-valve magnetoresistive thin film element wherein the pinned magnetic layer is formed of a single layer.

First, the spin-valve magnetoresistive thin film element according to the first embodiment is a top type wherein the antiferromagnetic layer is formed above the free magnetic layer. The film configuration is from the bottom; the Si substrate Alumina/Ta (30)/free magnetic layer of NiFe (40)+Co (10)/nonmagnetic electrically conductive layer of Cu (25)/second pinned magnetic layer of Co (25)/nonmagnetic intermediate layer of Ru (4)/first pinned magnetic layer of Co (20)/antiferromagnetic layer of PtMn (X)/Ta (30).

The spin-valve magnetoresistive thin film element according to the second embodiment is a bottom type wherein the antiferromagnetic layer is formed below the free magnetic layer. The film configuration is from the bottom; the Si substrate/Alumina/Ta (30)/antiferromagnetic layer of PtMn (X)/first pinned magnetic layer of Co (20) nonmagnetic intermediate layer of Ru (8)/second pinned magnetic layer of Co (25)/nonmagnetic electrically conductive layer of Cu (25)/free magnetic layer of Co (10)+NiFe (40)/Ta (30).

Also, the spin-valve magnetoresistive thin film element according to the first comparative example is a top type wherein the antiferromagnetic layer is formed above the free magnetic layer. The film configuration is from the bottom; the Si substrate/Alumina/Ta (30)/free magnetic layer of NiFe (40)+Co (10)/nonmagnetic electrically conductive layer of Cu (25)/pinned magnetic layer of Co (40)/antiferromagnetic layer of PtMn (X)/Ta (30).

The spin-valve magnetoresistive thin film element according to the second comparative example is a bottom type wherein the antiferromagnetic layer is formed below the free magnetic layer. The film configuration is from the bottom; the Si substrate/Alumina/Ta (30)/antiferromagnetic layer of PtMn (X)/pinned magnetic layer of Co (40)/nonmagnetic electrically conductive layer of Cu (25)/free magnetic layer of Co (10)+NiFe (40)/Ta (30).

The numerals in the parentheses for each layer represent film thickness in units of ångström, for the film structure of each spin-valve magnetoresistive thin film element.

Also, with the present invention, the spin-valve magnetoresistive thin film elements according to the first and second embodiments were subjected to thermal treatment at 260° C. for four hours while applying a magnetic field of 200 (oe), following formation. The spin-valve magnetoresistive thin film elements according to the first and second comparative examples were subjected to the same, only while applying a magnetic field of 2 k(Oe).

Figure 20:
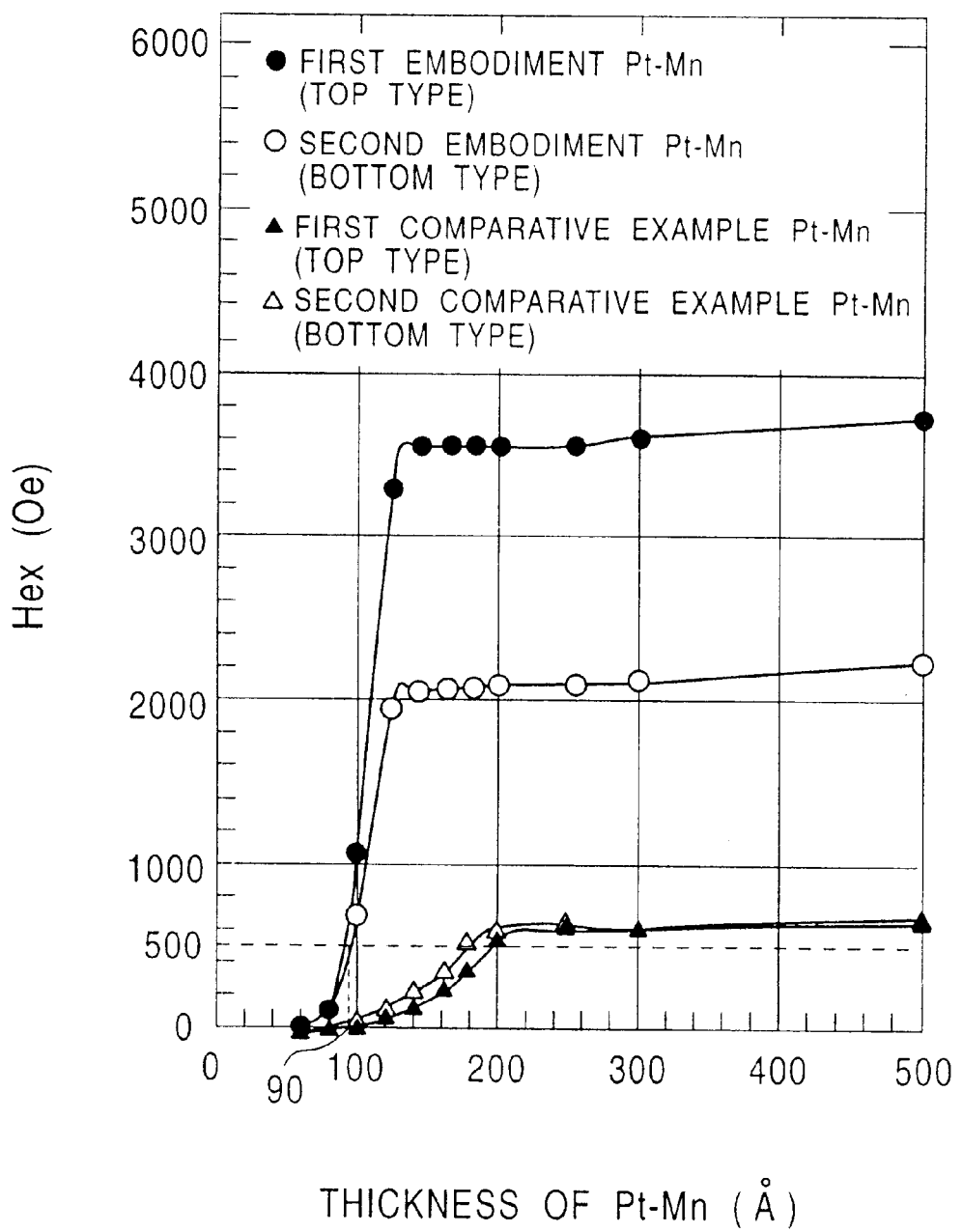
FIG. 20 is a graph illustrating, with regard to four types of spin-valve magnetoresistive thin film elements, the relationship between the thickness of the PtMn (antiferromagnetic layer) of each spin-valve magnetoresistive thin film element, and the exchange coupling magnetic field (Hex)

As shown in FIG. 20, the exchange coupling magnetic field can be increased with each of the four types of spin valve magnetoresistive thin film elements by increasing the thickness of the PtMn alloy.

Now, since the present invention holds that a range wherein an exchange coupling magnetic field of 500 (oe) or greater can be obtained is a preferable range, it can be understood that both the first and second comparative examples require the PtMn alloy to be formed to a thickness of at least 200 ångström; otherwise, an exchange coupling magnetic field of 500 (oe) or greater cannot be obtained.

On the other hand, it can be understood that the first and second embodiments can obtain an exchange coupling magnetic field of 500 (oe) or greater by the PtMn alloy being formed to a thickness of at 90 ångström or more. Accordingly, with the present invention, the preferable range for the thickness of the PtMn alloy is set within the range of 90 to 200 ångström.

Further, as can be seen in FIG. 20, the first and second embodiments can obtain an exchange coupling magnetic field of 1,000 (oe) or greater by the PtMn alloy being formed to a thickness of at 100 ångström or more. Accordingly, with the present invention, an even more preferable range for the thickness of the PtMn alloy is set within the range of 100 to 200 ångström.

Next, with the present invention, two types of dual spin-valve magnetoresistive thin film elements were manufactured, and the relationship between the thickness of the antiferromagnetic layer (PtMn alloy) of each spin-valve magnetoresistive thin film element and the exchange coupling magnetic field was measured.

The present invention is a dual spin-valve magnetoresistive thin film element wherein the pinned magnetic layers are divided into the two layers of the first pinned magnetic layer and the second pinned magnetic layer, with a nonmagnetic intermediate layer introduced therebetween, and the comparative example is a known dual spin-valve magnetoresistive thin film element wherein the pinned magnetic layers are formed of a single layer.

The film configuration of the spin-valve magnetoresistive thin film element according to the embodiment is from the bottom; the Si substrate/Alumina/Ta (30)/antiferromagnetic layer of PtMn (X)/first pinned magnetic layer of Co (20)/ nonmagnetic intermediate layer of Ru (6)/second pinned magnetic layer of Co (25)/nonmagnetic electrically conductive layer of Cu (20)/free magnetic layer of Co (10)+NiFe (40)+Co (10)/nonmagnetic electrically conductive layer of Cu (20)/second pinned magnetic layer of Co (20)/ nonmagnetic intermediate layer of Ru (8)/first pinned magnetic layer of Co (25)/antiferromagnetic layer of PtMn (X)/Ta (30).

The film configuration of the spin-valve magnetoresistive thin film element according to the comparative example is from the bottom; the Si substrate/Alumina/Ta (30) antiferromagnetic layer of PtMn (X)/pinned magnetic layer of Co (30)/nonmagnetic electrically conductive layer of Cu (20)/ free magnetic layer of Co (10)+NiFe (40)+Co (10)/ nonmagnetic electrically conductive layer of Cu (20)/pinned magnetic layer of Co (30)/antiferromagnetic layer of PtMn (X)/Ta (30).

The numerals in the parentheses for each layer represent film thickness in units of ångström, for the film structures of each spin-valve magnetoresistive thin film element.

Also, following completion of the layers of the spin valve magnetoresistive thin film element, the embodiment was subjected to thermal treatment at 260° C. for four hours while applying a magnetic field of 200 (Oe), and the comparative example was subjected to the same while applying a magnetic field of 2 k(Oe). The experiment results are shown in FIG. 21.

Figure 21:
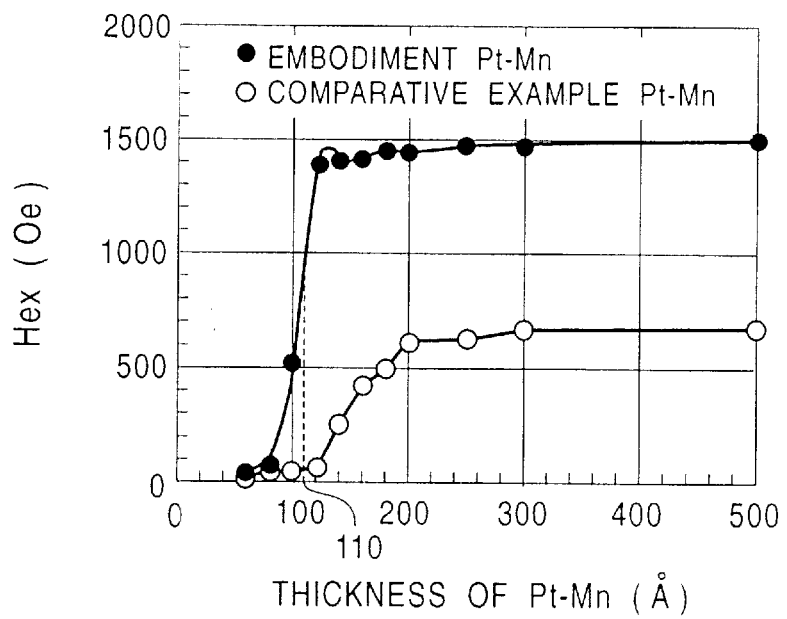
FIG. 21 is a graph illustrating, with regard to two types of dual spin-valve magnetoresistive thin film elements, the relationship between the thickness of the PtMn (antiferromagnetic layer) of each dual spin-valve magnetoresistive thin film element, and the exchange coupling magnetic field (Hex)

As shown in FIG. 21, it can be understood that the comparative example requires the PtMn alloy to be formed to a thickness of at least 200 ångström; otherwise, an exchange coupling magnetic field of 500 (Oe) or greater cannot be obtained.

On the other hand, it can be understood that the embodiment can obtain an exchange coupling magnetic field of 500 (Oe) or greater by the PtMn alloy being formed to a thickness of at 100 ångström or more. Accordingly, with the present invention, the preferable range for the thickness of the antiferromagnetic layer is set within the range of 100 to 200 ångström. Further, the embodiment can obtain an exchange coupling magnetic field of 1,000 (Oe) or greater by the PtMn alloy being formed to a thickness of at 110 ångström or more. Accordingly, with the present invention, an even more preferable range for the thickness of the antiferromagnetic layer is set within the range of 110 to 200 ångström.

Figure 22:
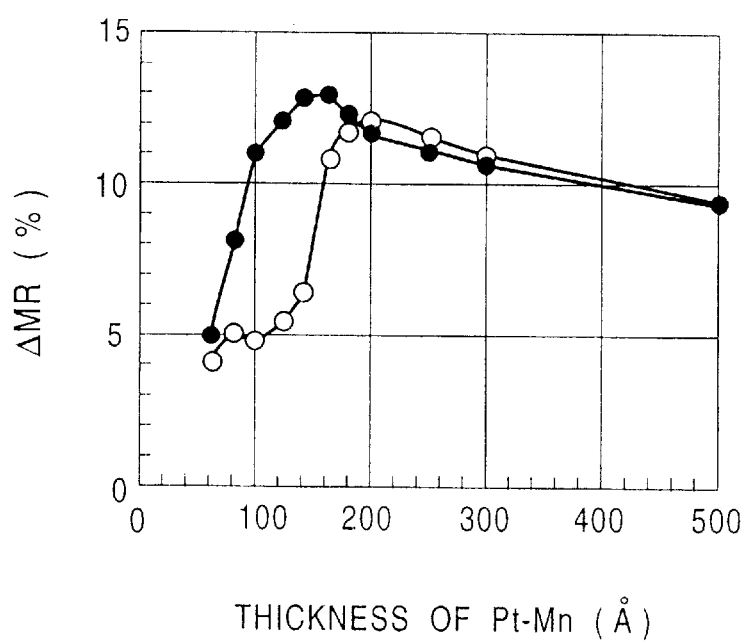
FIG. 22 is a graph illustrating, with regard to two types of dual spin-valve magnetoresistive thin film elements, the relationship between the thickness of the PtMn (antiferromagnetic layer) of each dual spin-valve magnetoresistive thin film element, and the ΔMR (%)

FIG. 22 is a graph showing the relationship between the film thickness of the PtMn alloy and the ΔMR. As shown in FIG. 22, with the comparative example, forming the thickness of the PtMn alloy at 200 ångström or more enables ΔMR of around 10% or more to be obtained, but with the embodiment, ΔMR around that of known arrangements can be secured even though the thickness of the PtMn alloy is reduced to around 100 ångström.

Now, of the layered films making up the spin-valve magnetoresistive thin film element, the thickest is the antiferromagnetic layer. Thus, according to the present invention, even if the thickness of the antiferromagnetic layer is reduced as shown in FIGS. 20 and 21, specifically, forming the antiferromagnetic layer at less than half the thickness of known spin-valve magnetoresistive thin film elements, a large exchange coupling magnetic field can be obtained. Hence, according to the present invention, the thickness of the overall spin-valve magnetoresistive thin film element can be reduced, and as shown in FIG. 13, the gap length G1 can be reduced even if the gap layer 121 and gap layer 125 formed above and below the spin-valve magnetoresistive thin film element 122 are made to be thick enough to maintain sufficient insulation, thereby realizing a narrow gap.

Next, a spin-valve magnetoresistive thin film element according to the present invention wherein the free magnetic layer is divided into a first free magnetic layer and second free magnetic layer with a nonmagnetic intermediate layer introduced therebetween was manufactured, and the relationship between the thickness ratio of the first free magnetic layer and second free magnetic layer, and the exchange coupling magnetic field was measured. First, the film thickness of the first free magnetic layer (the free magnetic layer at the side which comes into contact with the nonmagnetic electrically conductive layer, and directly contributes to the ΔMR) was fixed at 50 ångström, and the film thickness of the second free magnetic layer (the free magnetic layer at the side which does not directly contribute to the ΔMR) was variable.

The film configuration is from the bottom; the Si substrate/Alumina/Ta (30)/second free magnetic layer (F2) of NiFe (X)/nonmagnetic intermediate layer of Ru (8)/first free magnetic layer (F1) of NiFe (40)+Co (10)/nonmagnetic electrically conductive layer of Cu (20)/Ru (8)/ antiferromagnetic layer of PtMn (150)/Ta (30). The numerals in the parentheses for each layer represent film thickness in units of ångström.

The spin-valve magnetoresistive thin film element was subjected to thermal treatment at 260° C. for four hours while applying a magnetic field of 200 (Oe), following formation.

Figure 23:
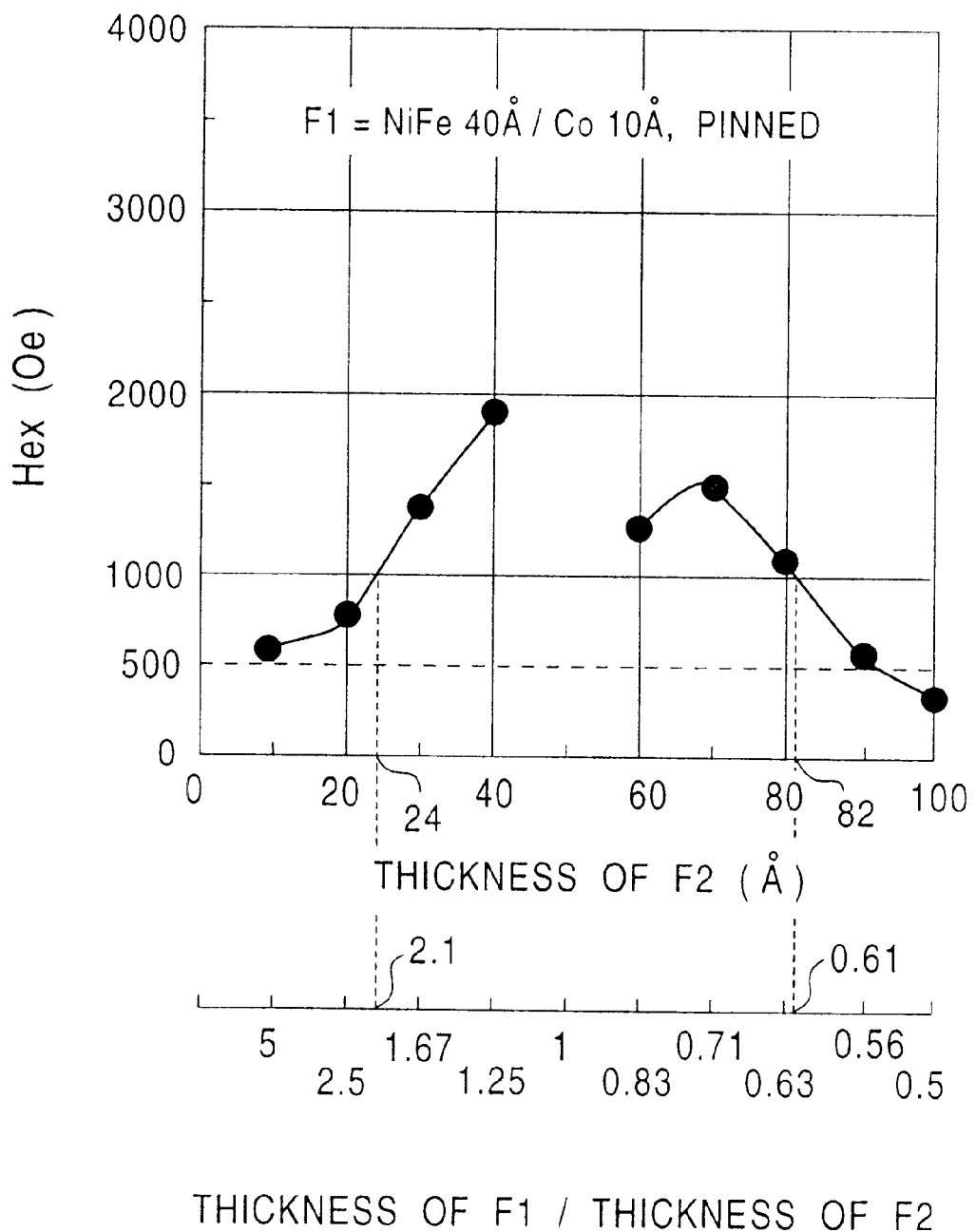
FIG. 23 is a graph illustrating the relationship between the thickness of the second free magnetic layer (F2) if the thickness of the first free magnetic layer (F1) is fixed at 50 ångström, and the exchange coupling magnetic field (Hex), and also the relationship between (the thickness of the first free magnetic layer (F1))/(the thickness of the second free magnetic layer (F2)) and the exchange coupling magnetic field (Hex)

As shown in FIG. 23, it can be understood that if the thickness of the second free magnetic layer (F2) increases to around 40 ångström, the exchange coupling magnetic field increases. It can also be understood that if the thickness of the second free magnetic layer (F2) increases to around 60 Ångström and above, the exchange coupling magnetic field gradually decreases.

The exchange coupling magnetic field rapidly became small to the point of being not measurable while the thickness of the second free magnetic layer (F2) was in the range between 40 to 60 ångström. The reason is that the thickness of the first free magnetic layer (F1) (=50 ångström) and the thickness of the second free magnetic layer become approximately the same value, so the magnetic moments of the first free magnetic layer (F1) and the second free magnetic layer (F2) are approximately the same, and both the magnetization of the first free magnetic layer (F1) and the magnetization of the second free magnetic layer (F2) attempt to face in the same direction, which is the direction of applying the magnetic field. If the magnetic moments are different, an exchange coupling magnetic field (RKKY interaction) is generated between the first free magnetic layer (F1) and the second free magnetic layer (F2), so the magnetization of the first free magnetic layer (F1) and the magnetization of the second free magnetic layer (F2) attempt to assume an antiparallel state. However here, as described above, the magnetization of both the first free magnetic layer (F1) and the second free magnetic layer (F2) attempt to face in the same direction, so the magnetization state between the first free magnetic layer (F1) and the second free magnetic layer (F2) becomes unstable, and as described later, the relative angle between the fluctuating magnetization of the second free magnetic layer (F2) and the pinned magnetization of the pinned magnetic layer (first pinned magnetic layer) cannot be controlled, and ΔMR drops rapidly.

Now, since the present invention holds that a range wherein an exchange coupling magnetic field of 500 (Oe) or greater can be obtained is a preferable range, it can be understood that, as shown in FIG. 23, forming the (thickness of the first free magnetic layer (F1))/(thickness of the second free magnetic layer (F2)) within a range of 0.56 to 0.83 or 1.25 to 5 allows an exchange coupling magnetic field of 500 (Oe) or greater to be obtained Further preferable is forming the (thickness of the first free magnetic layer (F1)/thickness of the second free magnetic layer (F2)) within a range of 0.61 to 0.83 or 1.25 to 2.1, as an exchange coupling magnetic field of 1,000 (Oe) or greater can be obtained.

Next, a spin-valve magnetoresistive thin film element according to the present invention wherein the free magnetic layer is divided into a first free magnetic layer and second free magnetic layer with a nonmagnetic intermediate layer introduced therebetween was manufactured, and the relationship between the thickness ratio of the first free magnetic layer and second free magnetic layer, and the ΔMR was measured. First, the film thickness of the second free magnetic layer (the free magnetic layer at the side which does not directly contribute to the ΔMR) was fixed at 20 ångström, and the film thickness of the first free magnetic layer (the free magnetic layer at the side which comes into contact with the nonmagnetic electrically conductive layer, and directly contributes to the ΔMR) was variable.

The film configuration is from the bottom; the Si substrate/Alumina/Ta (30)/second free magnetic layer of NiFe (20)/nonmagnetic intermediate layer of Ru (8)/first free magnetic layer of NiFe (X)+Co (10)/nonmagnetic electrically conductive layer of Cu (20)/first pinned magnetic layer of Co (25)/nonmagnetic intermediate layer of Ru (8)/second pinned magnetic layer of Co (20)/antiferromagnetic layer of PtMn (15)/Ta (30). The numerals in the parentheses for each layer represent film thickness in units of ångström.

Now, with the present invention, the spin-valve magnetoresistive thin film element was subjected to thermal treatment at 260° C. for four hours while applying a magnetic field of 200 (Oe), following formation. Also, as can be understood from the above film configuration, the first free magnetic layer in the present invention is formed of two layers, and the thickness of the NiFe film is changed. The results of the experiment are shown in FIG. 24, wherein the horizontal axis is the total thickness of the first free magnetic layer obtained by adding the thickness of the NiFe alloy and the thickness of the Co film (=10 ångström).

Figure 24:
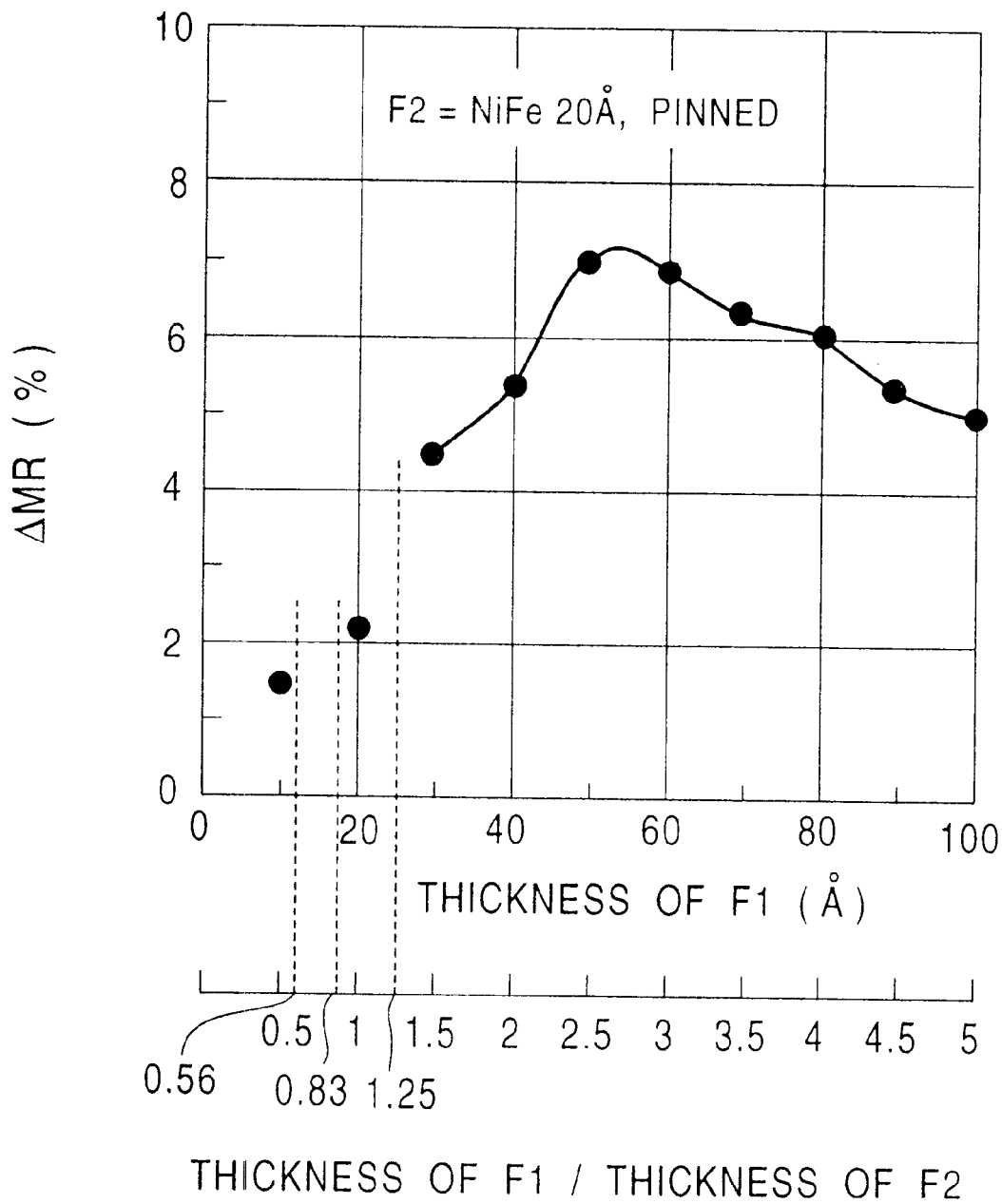
FIG. 24 is a graph illustrating the relationship between the thickness of the first free magnetic layer (F1) if the thickness of the second free magnetic layer (F2) is fixed at 20 ångström, and ΔMR (%); and also the relationship between (the thickness of the first free magnetic layer (F1))/(the thickness of the second free magnetic layer (F2)), and ΔMR (%)
Figure 25:
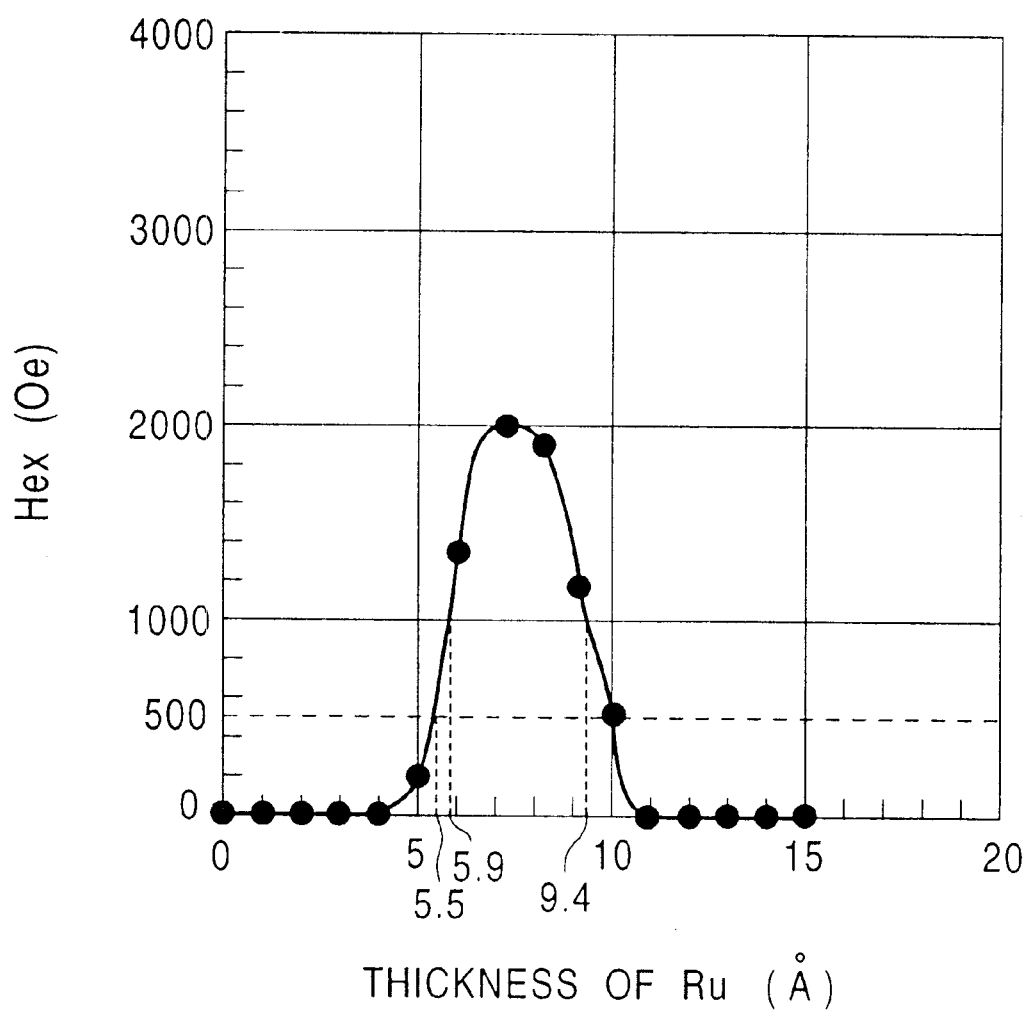
FIG. 25 is a graph illustrating the relationship between the thickness of the Ru (nonmagnetic intermediate layer) introduced between the first free magnetic layer (F1) and second free magnetic layer (F2), and the exchange coupling magnetic field (Hex)
Figure 26:
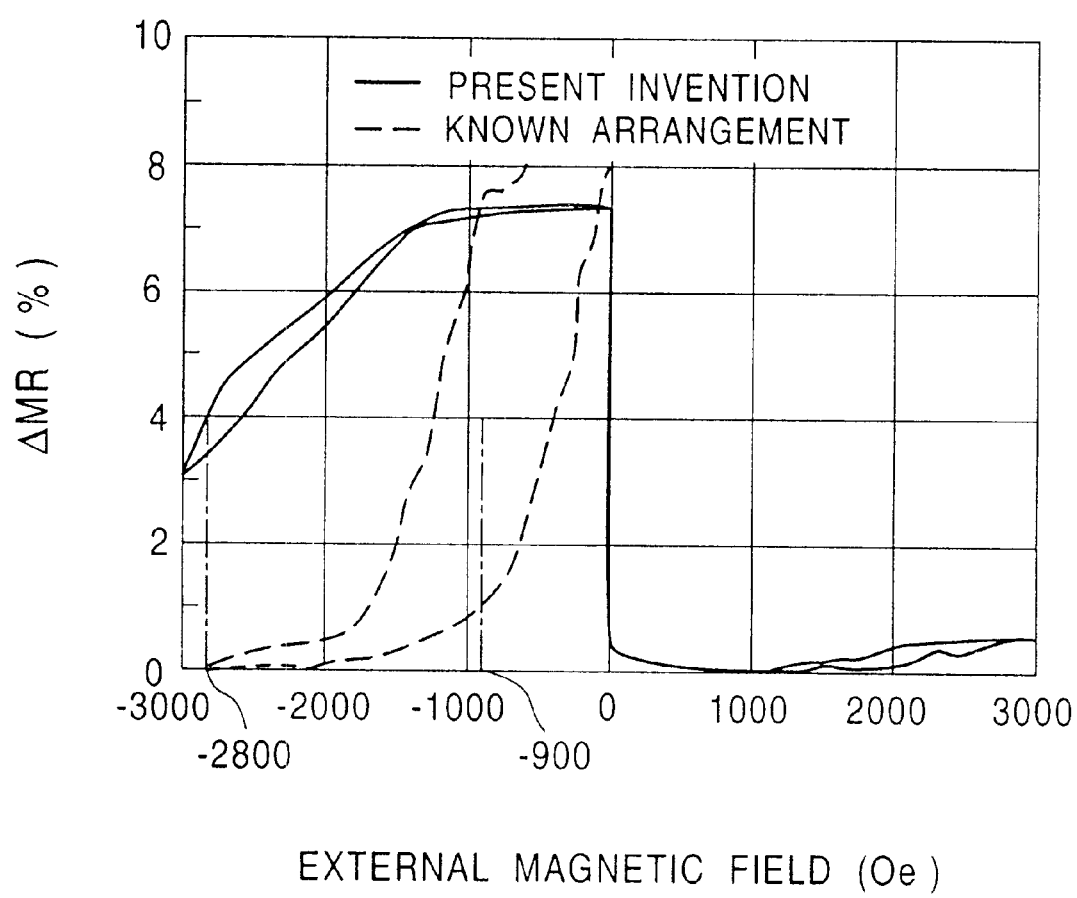
FIG. 26 illustrates the hysteresis loop of a spin-valve magnetoresistive thin film element according to the present invention, and a known spin-valve magnetoresistive thin film element.
Figure 27:
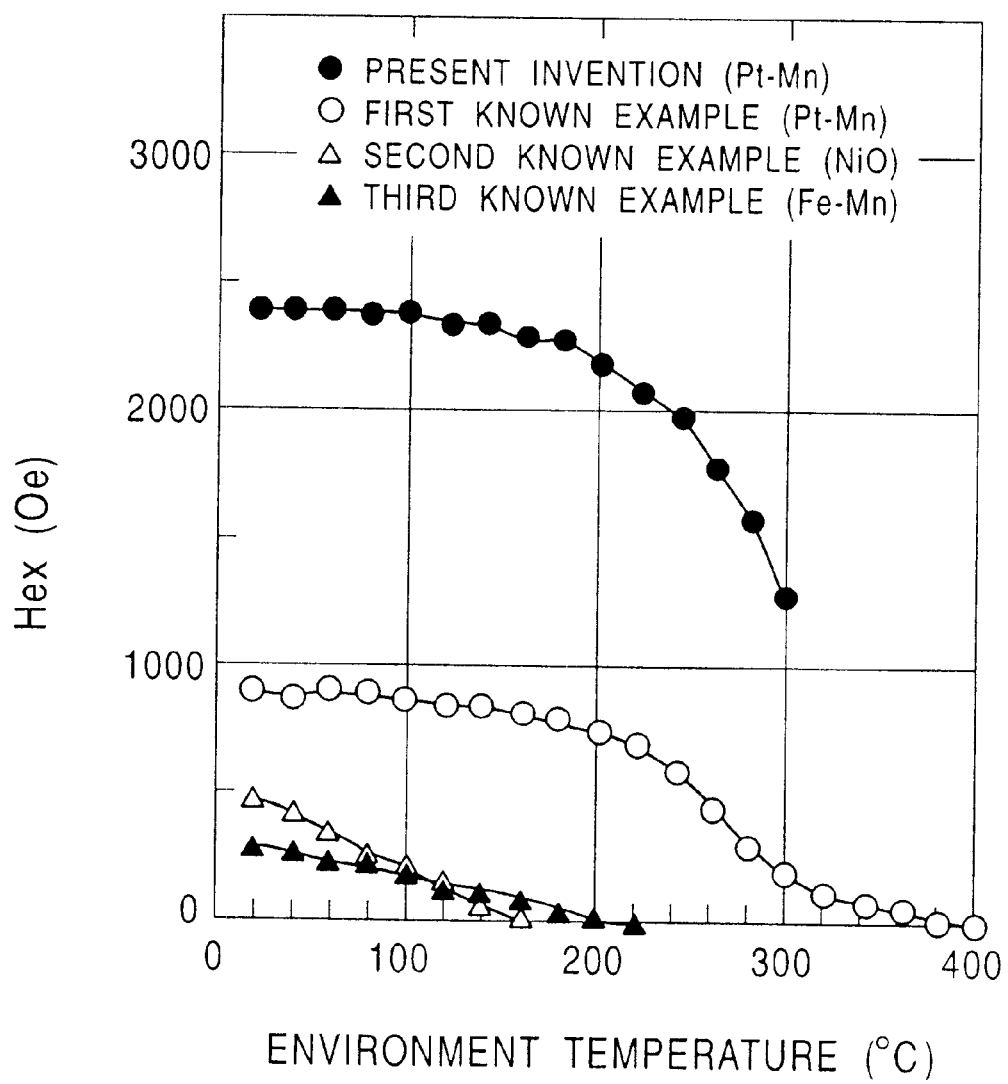
FIG. 27 is a graph illustrating the relationship between environment temperature (° C) and exchange coupling magnetic field (Hex) for several spin-valve magnetoresistive thin film elements, wherein the antiferromagnetic layer for one is formed of PtMn, another of Nio, and yet another of FeMn.
Figure 28:
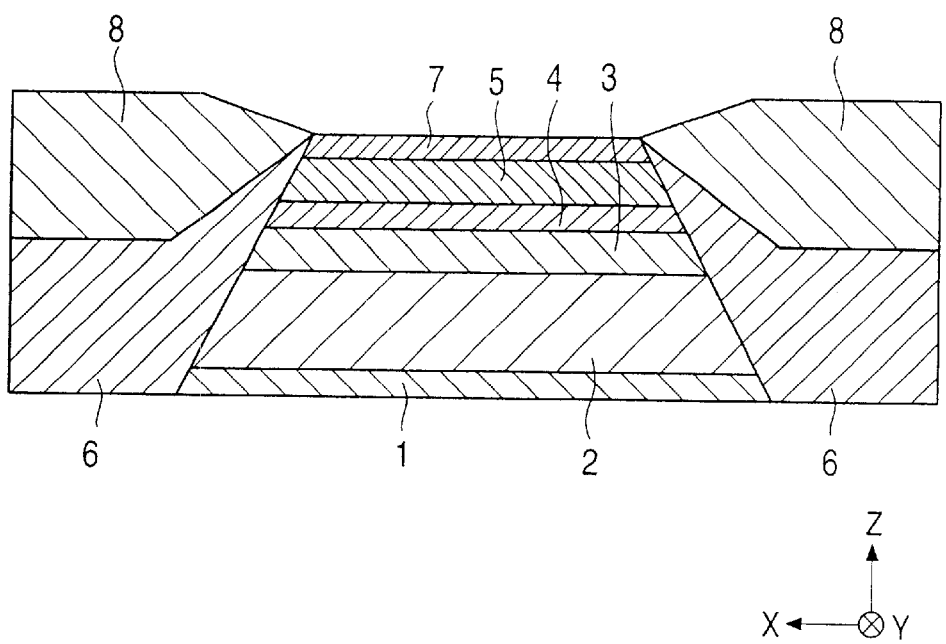
FIG. 28 is a cross-sectional view of a known spin-valve magnetoresistive thin film element, viewed from the side facing the recording medium.
Figure 29:
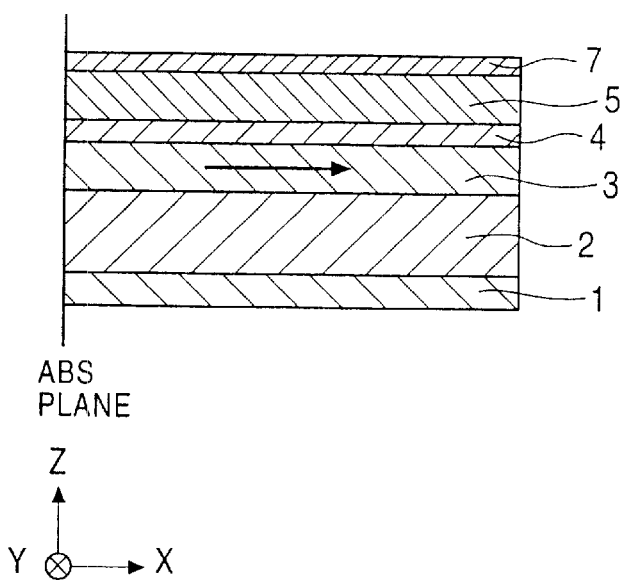
FIG. 29 is a side cross-sectional view of the spin valve magnetoresistive thin film element shown in FIG. 28.

As shown in FIG. 24, it can be understood that as the thickness of the first free magnetic layer (F1) approaches 20 ångström, the thickness becomes approximately the same as that of the second free magnetic layer (F2), so the ΔMR drops rapidly. Also, as shown in FIG. 24, if the thickness of the first free magnetic layer (F1) reaches around 30 ångström or more, the ΔMR increases, and ΔMR around that of known spin-valve magnetoresistive thin film elements (single spin-valve magnetoresistive thin film elements) can be obtained.

Now, as shown in FIG. 24, the range of the (thickness of the first free magnetic layer (F1)/(thickness of the second free magnetic layer (F2)) wherein an exchange coupling magnetic field of 500 (Oe) or greater can be obtained as yielded by FIG. 23, and high ΔMR can be obtained by setting the range of the (thickness of the first free magnetic layer (F1)/thickness of the second free magnetic layer (F2)) within the range of 1.25 to 5.

Next, in the present invention, the thickness of the nonmagnetic intermediate layer introduced between the first free magnetic layer and second free magnetic layer was changed, and the relationship between the thickness of the nonmagnetic intermediate layer and the exchange coupling magnetic field was measured.

The film configuration for the spin-valve magnetoresistive thin film element (dual spin-valve magnetoresistive thin film element) used in the experiment is from the bottom; the Si substrate/Alumina/Ta (30)/antiferromagnetic layer of PtMn (150)/Ru (6)/nonmagnetic electrically conductive layer of Cu (20)/first free magnetic layer of Co (10)+NiFe (50)/nonmagnetic intermediate layer of Ru (X)/first free magnetic layer of NiFe (30)+Co (10)/nonmagnetic electrically conductive layer of Cu (20)/Ru (8)/antiferromagnetic layer of PtMn (150)/Ta (30). The numerals in the parentheses for each layer represent film thickness in units of ångström.

Also, with the present invention, the spin-valve magnetoresistive thin film element was subjected to thermal treatment at 260° C. for four hours while applying a magnetic field of 200 (Oe), following formation. The experiment results are shown in FIG. 20.

As shown in FIG. 20, it can be understood that the Ru film should be formed to a thickness within a range of 5.5 to 10.0 ångström in order to obtain an exchange coupling magnetic field of 500 (Oe) or greater. It can also be understood that the Ru film should be formed to a thickness within a range of 5.9 to 9.4 ångström in order to obtain an exchange coupling magnetic field of 1,000 (Oe) or greater.

According to the present invention as described above, the magnetization state of the pinned magnetic layer can be maintained in an extremely stable state, by dividing the pinned magnetic layer into a first pinned magnetic layer and second pinned magnetic layer with a nonmagnetic intermediate layer introduced therebetween, and placing the magnetization of the first pinned magnetic layer and the magnetization of the second pinned magnetic layer in an antiparallel state by means of the exchange coupling magnetic field (RKKY interaction) generated between the first pinned magnetic layer and second pinned magnetic layer.

Particularly, with the present invention, an exchange coupling magnetic field of 500 (Oe) or greater, or even more preferably of 1,000 (Oe) or greater can be obtained by appropriately adjusting the thickness ratio between the first pinned magnetic layer and second pinned magnetic layer, and the film thickness thereof.

Also, with the present invention, the nonmagnetic intermediate layer introduced between the first pinned magnetic layer and second pinned magnetic layer is formed of Ru, Rh, Ir, Cr, Re, Cu, or the like, and further, the thickness of the nonmagnetic intermediate layer is adjusted to an appropriate level for both the case wherein the nonmagnetic intermediate layer is formed above the free magnetic layer and the case wherein the nonmagnetic intermediate layer is formed below the free magnetic layer, thereby obtaining an exchange coupling magnetic field of 500 (Oe) or greater, or even more preferably of 1,000 (Oe) or greater.

Further, with the present invention, a PtMn alloy is used as the antiferromagnetic layer, since PtMn alloys have high blocking temperature, the exchange coupling magnetic field (exchange anisotropic magnetic field) generated at the interface between the antiferromagnetic layer and the pinned magnetic layer (first pinned magnetic layer) is large, and the corrosion-resistant properties thereof are excellent, as an antiferromagnetic material. Alternatively, X—Mn alloys (wherein X is one or a plurality of the following elements: Pd, Ir, Rh, Ru, Os) or PtMn—X' alloys (wherein X' is one or a plurality of the following elements: Pd, Ir, Rh, Ru, Os, Au, Ag) may be used.

In an arrangement such as with the present invention wherein the pinned magnetic layer has been divided into the two layers of the first pinned magnetic layer and second pinned magnetic layer, an exchange coupling magnetic field of 500 (Oe) or greater, or even more preferably of 1,000 (Oe) or greater can be obtained, even if the thickness of the antiferromagnetic layer is around half as thick as known arrangements.

Further, with the present invention, it is preferable that, as with the pinned magnetic layer, the free magnetic layer be divided and formed of a first free magnetic layer and second free magnetic layer, with a nonmagnetic intermediate layer introduced therebetween. An exchange coupling magnetic field (RKKY interaction) is generated between the first free magnetic layer and second free magnetic layer, and the magnetization of the first free magnetic layer and the magnetization of the second free magnetic layer are magnetized in an antiparallel manner, so as to be inverted with good sensitivity to external magnetic fields.

Also, with the present invention, forming the film thickness ratio of the first free magnetic layer and the second free magnetic layer at an appropriate range, and also forming the nonmagnetic intermediate layer introduced between the first free magnetic layer and the second free magnetic layer of an Ru film or the like, and further forming the thickness of the nonmagnetic intermediate layer within an appropriate range, enables an exchange coupling magnetic field of 500 (Oe) or greater to be obtained, and more preferably, an exchange coupling magnetic field of 1,000 (Oe) or greater to be obtained.

Further, according to the present invention, in the event of using an antiferromagnetic layer which requires thermal treatment at the interface with the first pinned magnetic layer, appropriately adjusting the magnitude of the magnetic moment of the first pinned magnetic layer and the magnetic moment of the second pinned magnetic layer, and also appropriately adjusting the magnitude and direction of the magnetic field to be applied during thermal treatment, allows the magnetization of the first pinned magnetic layer to be directed in the desired direction, and further enables appropriate control of the magnetization of the first pinned magnetic layer and the magnetization of the second pinned magnetic layer in an antiparallel manner.

Further, according to the present invention, matching the direction of the sensing current magnetic field generated by causing the sensing current to flow, and the direction of the synthesized magnetic moment obtained by adding the magnetic moment of the first pinned magnetic layer and the magnetic moment of the second pinned magnetic layer, enables the magnetization state of the first pinned magnetic layer and second pinned magnetic layer to be even more thermally stable.

This control of the sensing current direction can be applied in any case using any antiferromagnetic material for the antiferromagnetic layer, regardless of whether or not thermal treatment is necessary for generating an exchange coupling magnetic field (exchange anisotropic magnetic field) at the interface between the antiferromagnetic layer and the pinned magnetic layer (first pinned magnetic layer), for example.

Further, the magnetization of the pinned magnetic layer can be thermally stabilized even in the case of known single spin-valve magnetoresistive thin film elements wherein the pinned magnetic layer is formed of a single layer, by matching the direction of the sensing current magnetic field generated by causing the sensing current to flow, and the direction of magnetization of the pinned magnetic layer.

Also, according to the second aspect of the present invention, the magnetization state of the pinned magnetic layer can be maintained in an extremely stable state, by dividing the pinned magnetic layer into a first pinned magnetic layer and second pinned magnetic layer with a nonmagnetic intermediate layer introduced therebetween, and placing the magnetization of the first pinned magnetic layer and the magnetization of the second pinned magnetic layer in an antiparallel state by means of the exchange coupling magnetic field (RKKY interaction) generated between the first pinned magnetic layer and second pinned magnetic layer.

Further, with the present invention, matching the direction of the sensing current magnetic field generated by causing the sensing current to flow, and the direction of the synthesized magnetic moment obtained by adding the magnetic moment of the first pinned magnetic layer and the magnetic moment of the second pinned magnetic layer, enables the magnetization state of the first pinned magnetic layer and second pinned magnetic layer to be even more thermally stable.

This control of the sensing current direction can be applied in any case using any antiferromagnetic material for the antiferromagnetic layer, regardless of whether or not thermal treatment is necessary for generating an exchange coupling magnetic field (exchange anisotropic magnetic field) at the interface between the antiferromagnetic layer and the pinned magnetic layer (first pinned magnetic layer), for example.

Further, the magnetization of the pinned magnetic layer can be thermally stabilized even in the case of known single spin-valve magnetoresistive thin film elements wherein the pinned magnetic layer is formed of a single layer, by matching the direction of the sensing current magnetic field generated by causing the sensing current to flow, and the direction of magnetization of the pinned magnetic layer.

Also, with the present invention, adjusting the film thickness ratio and the thickness of the first pinned magnetic layer and the second pinned magnetic layer within appropriate ranges enables an exchange coupling magnetic field of 500 (Oe) or greater to be obtained, and more preferably, an exchange coupling magnetic field of 1,000 (Oe) or greater to be obtained.

Also, with the present invention, the nonmagnetic intermediate layer introduced between the first pinned magnetic layer and second pinned magnetic layer is formed of Ru, Rh, Ir, Cr, Re, Cu, or the like, and further, the thickness of the nonmagnetic intermediate layer is adjusted to an appropriate level for both the case wherein the nonmagnetic intermediate layer is formed above the free magnetic layer and the case wherein the nonmagnetic intermediate layer is formed below the free magnetic layer, thereby obtaining an exchange coupling magnetic field of 500 (Oe) or greater, or even more preferably of 1,000 (Oe) or greater.

Further, with the present invention, a PtMn alloy is used as the antiferromagnetic layer, since PtMn alloys have high blocking temperature, the exchange coupling magnetic field (exchange anisotropic magnetic field) generated at the interface between the antiferromagnetic layer and the pinned magnetic layer (first pinned magnetic layer) is large, and the corrosion-resistant properties thereof are excellent, as an antiferromagnetic material. Alternatively, X—Mn alloys (wherein X is one or a plurality of the following elements: Pd, Ir, Rh, Ru, Os) or PtMn—X' alloys (wherein X' is one or a plurality of the following elements: Pd, Ir, Rh, Ru, Os, Au, Ag) may be used.

In an arrangement such as with the present invention wherein the pinned magnetic layer has been divided into the two layers of the first pinned magnetic layer and second pinned magnetic layer, an exchange coupling magnetic field of 500 (Oe) or greater, or even more preferably of 1,000 (Oe) or greater can be obtained, even if the thickness of the antiferromagnetic layer is around half as thick as known arrangements.

Further, with the present invention, it is preferable that, as with the pinned magnetic layer, the free magnetic layer be divided and formed of a first free magnetic layer and second free magnetic layer, with a nonmagnetic intermediate layer introduced therebetween. An exchange coupling magnetic field (RKKY interaction) is generated between the first free magnetic layer and second free magnetic layer, and the magnetization of the first free magnetic layer and the magnetization of the second free magnetic layer are magnetized in an antiparallel manner, so as to be inverted with good sensitivity to external magnetic fields.

Also, with the present invention, forming the film thickness ratio of the first free magnetic layer and the second free magnetic layer within an appropriate range, forming the nonmagnetic intermediate layer introduced between the first free magnetic layer and the second free magnetic layer of an Ru film or the like, and further forming the thickness of the nonmagnetic intermediate layer within an appropriate range, enables an exchange coupling magnetic field of 500 (Oe) or greater to be obtained, and more preferably, an exchange coupling magnetic field of 1,000 (Oe) or greater to be obtained.

Further, according to the present invention, in the event of using an antiferromagnetic layer which requires thermal treatment at the interface with the first pinned magnetic layer, appropriately adjusting the magnitude of the magnetic moment of the first pinned magnetic layer and the magnetic moment of the second pinned magnetic layer, and also appropriately adjusting the magnitude and direction of the magnetic field to be applied during thermal treatment, allows the magnetization of the first pinned magnetic layer to be directed in the desired direction, and further enables appropriate control of the magnetization of the first pinned magnetic layer and the magnetization of the second pinned magnetic layer in an antiparallel manner.

Also, according to the third aspect of the present invention, the magnetization state of the pinned magnetic layer can be maintained in an extremely stable state, by dividing the pinned magnetic layer into a first pinned magnetic layer and second pinned magnetic layer with a nonmagnetic intermediate layer introduced therebetween, and placing the magnetization of the first pinned magnetic layer and the magnetization of the second pinned magnetic layer in an antiparallel state by means of the exchange coupling magnetic field (RKKY interaction) generated between the first pinned magnetic layer and second pinned magnetic layer.

Particularly, with the present invention, in the event of using an antiferromagnetic layer which requires thermal treatment at the interface with the first pinned magnetic layer, appropriately adjusting the magnitude of the magnetic moment of the first pinned magnetic layer and the magnetic moment of the second pinned magnetic layer, and also appropriately adjusting the magnitude and direction of the magnetic field to be applied during thermal treatment, enables appropriate control of the magnetization of the first free magnetic layer and the magnetization of the second free magnetic layer in an antiparallel manner, and further allows the magnetization of the first pinned magnetic layer and the magnetization of the second pinned magnetic layer to be directed in the desired direction.

Further, with the present invention, a PtMn alloy is given as an antiferromagnetic layer used for the antiferromagnetic layer which requires thermal treatment in order to generate an exchange coupling magnetic field (exchange anisotropic magnetic field) at the interface between the antiferromagnetic layer and the first pinned magnetic layer, since PtMn alloys have high blocking temperature, the exchange coupling magnetic field (exchange anisotropic magnetic field) generated at the interface between the antiferromagnetic layer and the pinned magnetic layer (first pinned magnetic layer) is large, and the corrosion-resistant properties thereof are excellent. Also, with the present invention, X—Mn alloys (wherein X is one or a plurality of the following elements: Pd, Ir, Rh, Ru, Os) or PtMn—X' alloys (wherein X' is one or a plurality of the following elements: Pd, Ir, Rh, Ru, Os, Au, Ag) may be used instead of PtMn alloys.

Also, with the present invention, adjusting the film thickness ratio and the thickness of the first pinned magnetic layer and the second pinned magnetic layer within appropriate ranges enables an exchange coupling magnetic field of 500 (Oe) or greater to be obtained, and more preferably, an exchange coupling magnetic field of 1,000 (Oe) or greater to be obtained.

Also, with the present invention, the nonmagnetic intermediate layer introduced between the first pinned magnetic layer and second pinned magnetic layer is formed of Ru, Rh, Ir, Cr, Re, Cu, or the like, and further, the thickness of the nonmagnetic intermediate layer is adjusted to an appropriate level for both the case wherein the nonmagnetic intermediate layer is formed above the free magnetic layer and the case wherein the nonmagnetic intermediate layer is formed below the free magnetic layer, thereby obtaining an exchange coupling magnetic field of 500 (Oe) or greater, or even more preferably of 1,000 (Oe) or greater.

In an arrangement such as with the present invention wherein the pinned magnetic layer has been divided into the two layers of the first pinned magnetic layer and second pinned magnetic layer, an exchange coupling magnetic field of 500 (Oe) or greater, or even more preferably of 1,000 (Oe) or greater can be obtained, even if the thickness of the antiferromagnetic layer is around half as thick as known arrangements.

Further, with the present invention, it is preferable that, as with the pinned magnetic layer, the free magnetic layer be divided and formed of a first free magnetic layer and second free magnetic layer, with a nonmagnetic intermediate layer introduced therebetween. An exchange coupling magnetic field (RKKY interaction) is generated between the first free magnetic layer and second free magnetic layer, and the magnetization of the first free magnetic layer and the magnetization of the second free magnetic layer are magnetized in an antiparallel manner, so as to be inverted with good sensitivity to external magnetic fields.

Also, with the present invention, forming the film thickness ratio of the first free magnetic layer and the second free magnetic layer at an appropriate range, forming the nonmagnetic intermediate layer introduced between the first free magnetic layer and the second free magnetic layer of an Ru film or the like, and further forming the thickness of the nonmagnetic intermediate layer within an appropriate range, enables an exchange coupling magnetic field of 500 (Oe) or greater to be obtained, and more preferably, an exchange coupling magnetic field of 1,000 (Oe) or greater to be obtained.

Further, with the present invention, matching the direction of the sensing current magnetic field generated by causing the sensing current to flow, and the direction of the synthesized magnetic moment obtained by adding the magnetic moment of the first pinned magnetic layer and the magnetic moment of the second pinned magnetic layer, enables the magnetization state of the first pinned magnetic layer and second pinned magnetic layer to be even more thermally stable.

This control of the sensing current can be applied in any case using any antiferromagnetic material for the antiferromagnetic layer, regardless of whether or not thermal treatment is necessary for generating an exchange coupling magnetic field (exchange anisotropic magnetic field) at the interface between the antiferromagnetic layer and the pinned magnetic layer (first pinned magnetic layer), for example.

Further, the magnetization of the pinned magnetic layer can be thermally stabilized even in the case of single spin-valve magnetoresistive thin film elements wherein the pinned magnetic layer is formed of a single layer, by matching the direction of the sensing current magnetic field generated by causing the sensing current to flow, and the direction of magnetization of the pinned magnetic layer.

What is claimed is:

1. A dual spin-valve magnetoresistive thin film element, comprising;

a composite free magnetic layer including a first free magnetic layer and a second free magnetic layer with a nonmagnetic intermediate layer therebetween;

first and second nonmagnetic electrically conductive layers, wherein said first nonmagnetic electrically conductive layer resides below said composite free magnetic layer and wherein said second nonmagnetic electrically conductive layer overlies said composite free magnetic layer;

first and second dual pinned magnetic layers, each of said first and second dual pinned magnetic layers including a first pinned magnetic layer and a second pinned magnetic layer separated by a nonmagnetic intermediate layer, wherein said first dual pinned magnetic layer resides below said first nonmagnetic electrically conductive layer, and wherein said second dual pinned magnetic layer overlies said second nonmagnetic electrically conductive layer;

first and second antiferromagnetic layers, wherein said first antiferromagnetic layer resides below said first dual pinned magnetic layer, and wherein said second antiferromagnetic layer overlies second dual pinned magnetic layer;

wherein said first pinned magnetic layer of said first dual pinned magnetic layer contacts said first antiferromagnetic layer, and wherein said second pinned magnetic layer of said first dual pinned magnetic layer contacts said first nonmagnetic electrically conductive layer;

wherein said first pinned magnetic layer of said second dual pinned magnetic layer contacts said second antiferromagnetic layer, and wherein said second pinned magnetic layer of said second dual pinned magnetic layer contacts said second nonmagnetic electrically conductive layer;

wherein a magnetic moment of said first pinned magnetic layer in said first dual pinned magnetic layer is greater than a magnetic moment of said second pinned magnetic layer in said first dual pinned magnetic layer;

wherein a magnetic moment of said first pinned magnetic layer in said second dual pinned magnetic layer is smaller than a magnetic moment of said second pinned magnetic layer in said second dual pinned magnetic layer;

wherein each of said magnetic moments is a product of a saturation magnetization Ms and a film thickness t of each of said pinned magnetic layers;

wherein a pinned magnetization of said first pinned magnetic layers in said first and second dual pinned magnetic layers are facing in opposite directions;

wherein said pinned magnetization of said first pinned magnetic layer and a pinned magnetization of said second pinned magnetic layer in said first dual pinned magnetic layer are facing in opposite directions, wherein said pinned magnetization of said first pinned magnetic layer and a pinned magnetization of said second pinned magnetic layer in said second dual pinned magnetic layer are facing in opposite directions, wherein said pinned magnetization of said second pinned magnetic layers in said first and second dual pinned magnetic layers are facing in opposite directions, and wherein a magnetization of said first and second free magnetic layers are facing in opposite directions.

2. A dual spin-valve magneto resistive thin film element according to claim 1, wherein a synthesized magnetic moment of said first pinned magnetic layer and said second pinned magnetic layer in said first dual pinned magnetic layer and a synthesized magnetic moment of said first pinned magnetic layer and said second pinned magnetic layer in said second dual pinned magnetic layer are facing in the same direction; and wherein said synthesized magnetic moment of said first pinned magnetic layer and second pinned magnetic layer in each of said first and second dual pinned magnetic layers is formed by adding a magnetic moment of said first pinned magnetic layer and a magnetic moment of said second pinned magnetic layer in each of said first and second dual pinned magnetic layers.

3. A dual spin-valve magneto resistive thin film element according to claim 1, wherein at least one of said first and second antiferromagnetic layers comprises a PtMn alloy.

4. A dual spin-valve magnetoresistive thin film element according to claim 1, wherein at least one of said first and second antiferromagnetic layers comprises an X—Mn alloy, wherein X is selected from the group consisting of Pd, Ir, Rh, Ru, Os and combinations thereof.

5. A dual spin-value magnetoresistive thin film element according to claim 1, wherein at least one of said first and second antiferromagnetic layers comprises a Pt—Mn—X' alloy, wherein X' is selected from the group consisting of Pd, Ir, Rh, Ru, Os, Au, Ag and combinations thereof.

6. A dual spin-value magnetoresistive thin film element according to claim 1, wherein said nonmagnetic intermediate layer between said first pinned magnetic layer and said second pinned magnetic layer comprises a material selected from the group consisting of Ru, Rh, Ir, Cr, Re, Cu and an alloy thereof.

7. A dual spin-valve magnetoresistive thin film element according to claim 1, wherein said nonmagnetic intermediate layer between said first free magnetic layer and said second free magnetic layer comprises a material selected from the group consisting of Ru, Rh, Ir, Cr, Re, Cu and an alloy thereof.

8. A dual spin-valve magnetoresistive thin film element, comprising;

a composite free magnetic layer including a first free magnetic layer and a second free magnetic layer with a nonmagnetic intermediate layer therebetween;

first and second nonmagnetic electrically conductive layers, wherein said first nonmagnetic electrically conductive layer resides below said composite free magnetic layer, and wherein said second nonmagnetic electrically conductive layer overlies said free magnetic layer;

first and second dual pinned magnetic layers, wherein each of said first and second dual pinned magnetic layers includes a first pinned magnetic layer and a second pinned magnetic layer separated by a nonmagnetic intermediate layer, wherein said first dual pinned magnetic layer resides below said first nonmagnetic electrically conductive layer, and wherein said second dual pinned magnetic layer overlies said second nonmagnetic electrically conductive layer;

first and second antiferromagnetic layers, wherein said first antiferromagnetic layer resides below said first dual pinned magnetic layer, and wherein said second antiferromagnetic layer overlies said second dual pinned magnetic layer;

wherein said first pinned magnetic layer of said first dual pinned magnetic layer contacts said first antiferromagnetic layer, and wherein said second pinned magnetic layer of said first dual pinned magnetic layer contacts said first nonmagnetic electrically conductive layer;

wherein said first pinned magnetic layer of said second dual pinned magnetic layer contacts said second antiferromagnetic layer, and wherein said second pinned magnetic layer of said second dual pinned magnetic layer contacts said second nonmagnetic electrically conductive layer;

wherein a magnetic moment of said first pinned magnetic layer in said first dual pinned magnetic layer is smaller than a magnetic moment of said second pinned magnetic layer in said first dual pinned magnetic layer;

wherein a magnetic moment of said first pinned magnetic layer in said second dual pinned magnetic layer is greater than a magnetic moment of said second pinned magnetic layer in said second dual pinned magnetic layer;

wherein each of said magnetic moments is a product of a saturation magnetization Ms and a film thickness t of each of said pinned magnetic layers;

and wherein a pinned magnetization of said first pinned magnetic layers in said first and second dual pinned magnetic layers are facing in opposite directions;

wherein said pinned magnetization of said first pinned magnetic layer and a pinned magnetization of said second pinned magnetic layer in said first dual pinned magnetic layer are facing in opposite directions, and wherein said pinned magnetization of said first pinned magnetic layer and a pinned magnetization of said second pinned magnetic layer in said second dual pinned magnetic layer are facing in opposite directions;

wherein said pinned magnetization of said second pinned magnetic layers in said first and second dual pinned magnetic layers are facing in opposite directions; and wherein a magnetization of said first and second free magnetic layers are facing in opposite directions.

9. A dual spin-valve magnetoresistive thin film element according to claim 8, wherein a synthesized magnetic moment of said first pinned magnetic layer and said second pinned magnetic layer in said first dual pinned magnetic layer and a synthesized magnetic moment of said first pinned magnetic layer and said second pinned magnetic layer in said second dual pinned magnetic layer are facing in the same direction, wherein said synthesized magnetic moment of said first pinned magnetic layer and second pinned magnetic layer in each of said first and second dual pinned magnetic layers is formed by adding a magnetic moment of said first pinned magnetic layer and a magnetic moment of said second pinned magnetic layer in each of said first and second dual pinned magnetic layers.

10. A dual spin-valve magnetoresistive thin film element according to claim 8, wherein at least one of said first and second antiferromagnetic layers comprises a PtMn alloy.

11. A dual spin-valve magnetoresistive thin film element according to claim 8, wherein at least one of said first and second antiferromagnetic layers comprises an X—Mn-alloy, wherein X is selected from the group consisting of Pd, Ir, Rh, Ru, Os and combinations thereof.

12. A dual spin-valve magnetoresistive thin film element according to claim 8, wherein at least one of said first and second antiferromagnetic layers comprises an Pt—Mn—X' alloy, wherein X' is selected from the group consisting of Pd, Ir, Rh, Ru, Os, Au, Ag and combinations thereof.

13. A dual spin-valve magnetoresistive thin film element according to claim 8, wherein the nonmagnetic intermediate layer between said first pinned magnetic layer and said second pinned magnetic layer comprises a material selected from the group consisting of Ru, Rh, Ir, Cr, Re, Cu and an alloy of two or more thereof.

14. A dual spin-valve magnetoresistive thin film element according to claim 8, wherein said first and second nonmagnetic intermediate layers comprises a material selected from the group consisting of Ru, Rh, Ir, Cr, Re, Cu and an alloy thereof.

* * * * *

UNITED STATES PATENT AND TRADEMARK OFFICE
CERTIFICATE OF CORRECTION

PATENT NO. : 6,597,542 B2
DATED : July 22, 2003
INVENTOR(S) : Masamichi Saito et al.

It is certified that error appears in the above-identified patent and that said Letters Patent is hereby corrected as shown below:

<u>Column 94,</u>
Line 61, delete "magneto resistive" and substitute -- magnetoresistive -- in its place.

<u>Column 95,</u>
Line 10, delete "magneto resistive" and substitute -- magnetoresistive -- in its place.

Signed and Sealed this

Eleventh Day of November, 2003

JAMES E. ROGAN
*Director of the United States Patent and Trademark Office*